US012568688B2

(12) United States Patent　　(10) Patent No.:　US 12,568,688 B2
Bok et al.　　　　　　　　　　　　(45) Date of Patent:　　　Mar. 3, 2026

(54) DISPLAY DEVICE AND TILED DISPLAY DEVICE

(71) Applicant: Samsung Display Co., LTD., Yongin-si (KR)

(72) Inventors: Seung Lyong Bok, Yongin-si (KR); Hyun Joon Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 806 days.

(21) Appl. No.: 17/901,613

(22) Filed: Sep. 1, 2022

(65) Prior Publication Data

US 2023/0238400 A1　　　Jul. 27, 2023

(30) Foreign Application Priority Data

Jan. 21, 2022　　(KR) ......................... 10-2022-0009327
Mar. 22, 2022　　(KR) ......................... 10-2022-0035071

(51) Int. Cl.
　　H10D 86/60　　　(2025.01)
　　G06F 3/041　　　(2006.01)
　　　　　(Continued)
(52) U.S. Cl.
　　CPC ........... H10D 86/60 (2025.01); G06F 3/0412 (2013.01); G06F 3/04184 (2019.05); G06F 3/0446 (2019.05); H01L 24/05 (2013.01); H01L 25/167 (2013.01); H10D 86/441 (2025.01); H10D 86/451 (2025.01); H01L 24/08 (2013.01);
　　　　　(Continued)
(58) Field of Classification Search
　　CPC .. G06F 3/0412; G06F 3/04184; G06F 3/0446;

H01L 2224/05027; H01L 2224/05073; H01L 2224/05562; H01L 2224/05566; H01L 2224/05567; H01L 2224/05686; H01L 2224/08145; H01L 2224/16145; H01L 24/05; H01L 24/08; H01L 24/16; H01L 25/0753;

(Continued)

(56) References Cited

U.S. PATENT DOCUMENTS

2017/0294451 A1　　10/2017　Kim et al.
2019/0326327 A1　　10/2019　Lin et al.
　　　　　(Continued)

FOREIGN PATENT DOCUMENTS

CN　　　　110379356 A　　10/2019
KR　　10-2008-0067162 A　　7/2008
　　　　　(Continued)

*Primary Examiner* — Robin J Mishler
(74) *Attorney, Agent, or Firm* — Womble Bond Dickinson (US) LLP

(57)　　　　ABSTRACT

Provided are a display device and a tiled display device. The display device according to one or more embodiments includes a substrate, transistors above the substrate, a first organic insulating layer above the transistors, a first connection electrode above the first organic insulating layer, and electrically connected to at least one of the transistors, a second connection electrode above the first organic insulating layer, a first power supply line configured to receive a first power voltage, above the first organic insulating layer, and connected to the second connection electrode, and a second organic insulating layer above the first power supply line, and defining an opening area exposing the first power supply line.

10 Claims, 31 Drawing Sheets

(51) Int. Cl.
| | |
|---|---|
| *G06F 3/044* | (2006.01) |
| *H01L 23/00* | (2006.01) |
| *H01L 25/16* | (2023.01) |
| *H10D 86/40* | (2025.01) |

(52) U.S. Cl.
CPC .... *H01L 24/16* (2013.01); *H01L 2224/05027* (2013.01); *H01L 2224/05073* (2013.01); *H01L 2224/05562* (2013.01); *H01L 2224/05566* (2013.01); *H01L 2224/05567* (2013.01); *H01L 2224/05686* (2013.01); *H01L 2224/08145* (2013.01); *H01L 2224/16145* (2013.01); *H01L 2924/0549* (2013.01)

(58) Field of Classification Search
CPC .......... H01L 25/167; H01L 2924/0549; H10D 86/441; H10D 86/451; H10D 86/60
See application file for complete search history.

(56) References Cited

U.S. PATENT DOCUMENTS

| | | | | |
|---|---|---|---|---|
| 2020/0083311 A1* | 3/2020 | Cha | .................... | H10K 59/126 |
| 2020/0259056 A1 | 8/2020 | Hong et al. | | |
| 2021/0202675 A1 | 7/2021 | Jang et al. | | |
| 2022/0115364 A1* | 4/2022 | Jeon | .................... | H10D 86/60 |
| 2023/0215211 A1* | 7/2023 | Li | .................... | G02F 1/136222 |
| | | | | 382/124 |

FOREIGN PATENT DOCUMENTS

| | | | |
|---|---|---|---|
| KR | 10-2015-0016031 A | 2/2015 |
| KR | 10-1634642 B1 | 6/2016 |
| KR | 10-2017-0081116 A | 7/2017 |
| KR | 10-2020-0143628 A | 12/2020 |
| KR | 10-2021-0103602 A | 8/2021 |
| KR | 10-2021-0124564 A | 10/2021 |

* cited by examiner

VDL1

CT27

B ← → B'

A

A'

CT25

ANDE2

Figure 23:
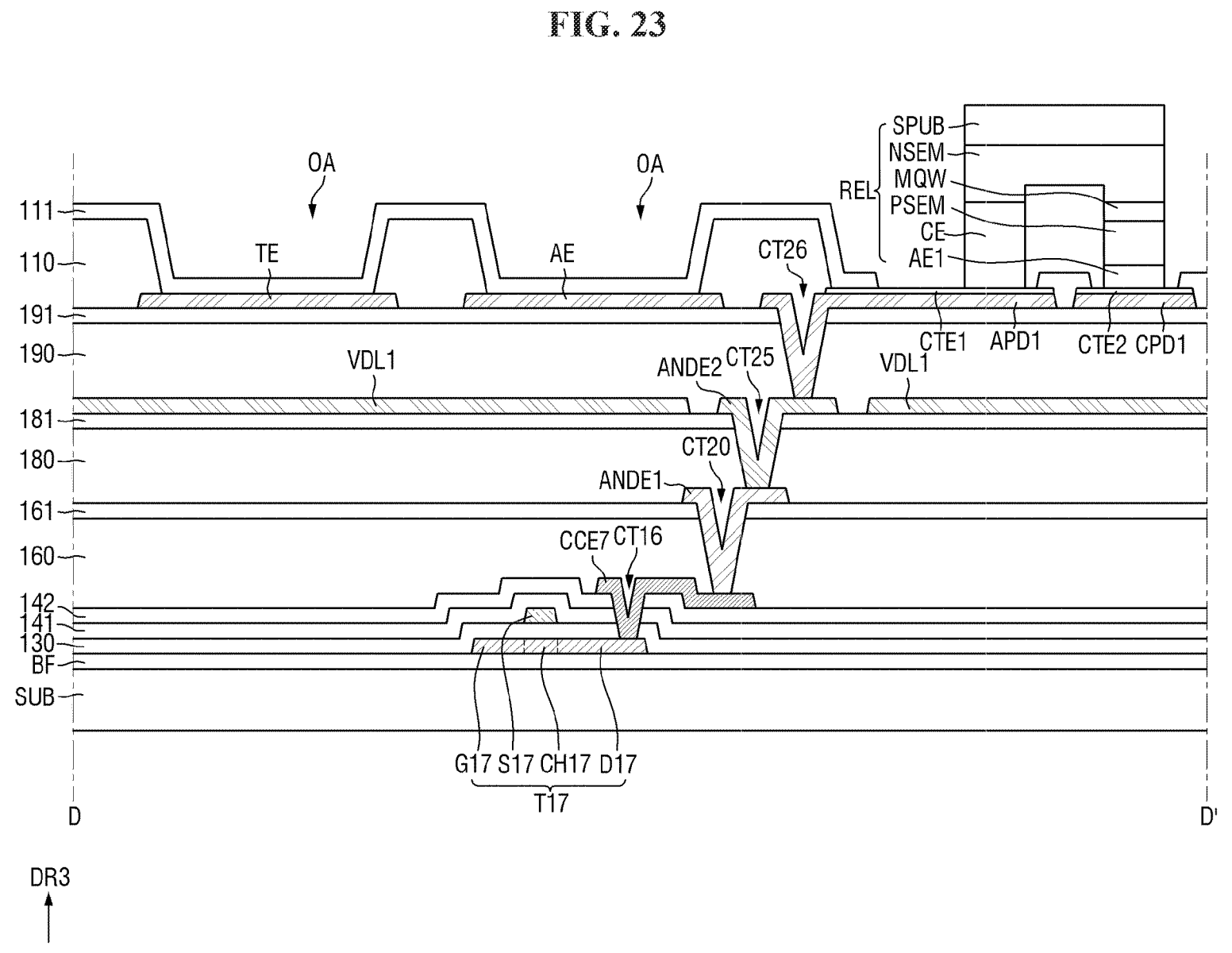

SPUB
NSEM
MQW
PSEM
CE
AE1
REL

CTE2 CPD1
APD1
CTE1
VDL1

CT26
ANDE2 CT25
CT20
ANDE1
CCE7 CT16

OA

AE

OA

TE

VDL1

G17 S17 CH17 D17
T17

111
110
191
190
181
180
161
160
142
141
130
BF
SUB

DISPLAY DEVICE AND TILED DISPLAY DEVICE

CROSS-REFERENCE TO RELATED APPLICATIONS

This application claims priority to, and the benefit of, Korean Patent Application No. 10-2022-0009327 filed on Jan. 21, 2022 in the Korean Intellectual Property Office (KIPO), and claims priority to, and the benefit of, Korean Patent Application No. 10-2022-0035071 filed on Mar. 22, 2022 in the Korean Intellectual Property Office (KIPO), the entire contents of both of which being incorporated by reference herein.

BACKGROUND

1. Field

The present disclosure relates to a display device and a tiled display device.

2. Description of the Related Art

With the advance of information-oriented society, more and more demands are placed on display devices for displaying images in various ways. The display device may be a flat panel display device, such as a liquid crystal display, a field emission display, and a light emitting display.

When the display device is manufactured in a large size, the defect rate of the light emitting element may increase due to an increase in the number of pixels, and productivity or reliability may decrease. To solve this problem, a tiled display device in which a large screen is realized by connecting a plurality of display devices having a relatively small size has been developed.

Also, recently, a reflective display device in which a user reflects an object or a background positioned in front of the display device has been proposed.

SUMMARY

Aspects of embodiments of the present disclosure provide a display device in which a user can see an object or a background reflected from the display device by increasing the reflectivity of reflecting incident light.

Aspects of embodiments of the present disclosure provide a tiled display device in which a user may see an object or background reflected from the display device by increasing the reflectivity of reflecting incident light.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to one or more embodiments of the present disclosure, there is provided a display device including a substrate, transistors above the substrate, a first organic insulating layer above the transistors, a first connection electrode above the first organic insulating layer, and electrically connected to at least one of the transistors, a second connection electrode above the first organic insulating layer, a first power supply line configured to receive a first power voltage, above the first organic insulating layer, and connected to the second connection electrode, and a second organic insulating layer above the first power supply line, and defining an opening area exposing the first power supply line.

The opening area may overlap the transistors.

The first connection electrode and the second connection electrode might not overlap the transistors.

The display device may further include an inorganic insulating layer above the first power supply line in the opening area.

The inorganic insulating layer may be above the second organic insulating layer.

The display device may further include a first pad electrode above the first connection electrode, a second pad electrode above the second connection electrode, and a reflective electrode above the first power supply line, and including a same material as the first pad electrode and the second pad electrode.

The first pad electrode, the second pad electrode, and the reflective electrode may include a first electrode layer, a second electrode layer above the first electrode layer, and a third electrode layer above the second electrode layer.

A thickness of the second electrode layer may be greater than a thickness of the first electrode layer and a thickness of the third electrode layer.

The first electrode layer and the third electrode layer may include a same material.

The display device may further include a light emitting element above the first connection electrode and the second connection electrode, wherein the light emitting element includes a flip chip type micro light emitting diode element.

According to one or more embodiments of the present disclosure, there is provided a display device including a substrate, transistors above the substrate, a first organic insulating layer above the transistors, a first connection electrode above the first organic insulating layer, and electrically connected to at least one of the transistors, a second connection electrode above the first organic insulating layer, a light emitting element electrically connected to a first electrode electrically connected to the first connection electrode, and the second connection electrode, and a touch electrode above the first organic insulating layer, and including a same material as the first connection electrode and the second connection electrode.

The display device may further include a second organic insulating layer above the touch electrode, wherein the first connection electrode and the second connection electrode are not covered by the second organic insulating layer to be exposed by the second organic insulating layer.

The second organic insulating layer may define an opening area exposing the touch electrode.

The display device may further include a first pad electrode above the first connection electrode, a second pad electrode above the second connection electrode, and a reflective electrode above the touch electrode, and including a same material as the first pad electrode and the second pad electrode.

The second connection electrode may be connected to the touch electrode.

The touch electrode may be configured to receive a first power voltage during a display period, and a touch driving signal having pulses during a touch period.

The display device may further include an antenna electrode above the first organic insulating layer, and including a same material as the first connection electrode and the second connection electrode.

An area of the antenna electrode may be different from an area of the touch electrode.

The display device may further include a second organic insulating layer above the touch electrode and the antenna electrode, wherein the first connection electrode and the second connection electrode are not covered by the second organic insulating layer to be exposed by the second organic insulating layer.

The second organic insulating layer may define an open area exposing the antenna electrode.

The display device may further include a first pad electrode above the first connection electrode, a second pad electrode above the second connection electrode, and a reflective electrode above the touch electrode and the antenna electrode, and including a same material as the antenna electrode, the first pad electrode, and the second pad electrode.

The light emitting element may include a flip chip type micro light emitting diode element.

According to one or more embodiments of the present disclosure, there is provided a tiled display device including display devices, and a connection member between the display devices, wherein a display device among the display devices includes a substrate, transistors above the substrate, a first organic insulating layer above the transistors, a first connection electrode above the first organic insulating layer, and electrically connected to at least one of the transistors, a second connection electrode above the first organic insulating layer, a first power supply line configured to receive a first power voltage, located above the first organic insulating layer, and connected to the second connection electrode, and a second organic insulating layer above the first power supply line, and defining an opening area to expose the first power supply line.

The tiled display device may further include a flip chip type micro light emitting diode element above the first connection electrode and the second connection electrode.

The substrate may be made of glass.

The display device may further include, a pad above a first surface of the substrate, and a side line connected to the pad and located on a first surface of the substrate, on a second surface opposite to the first surface, and on one side between the first surface and the second surface.

The display device may further include a connection line above the second surface of the substrate, and connected to the side line, and a flexible film connected to the connection line through a conductive adhesive member.

The display devices may be arranged in a matrix in M (M is a positive integer) rows and N (N is a positive integer) columns According to the aforementioned and other embodiments of the present disclosure, because it is possible to reduce or minimize an amount of decrease in transmittance of light reflected from the power supply line by the organic insulating film by removing the organic insulating film located on the power supply line overlapping most of the area of the sub-pixels, a ratio of the light reflected by the power supply line may be increased.

According to the aforementioned and other embodiments of the present disclosure, the touch electrodes are formed on the same layer as the pad connection electrodes and made of the same material. Therefore, because the touch electrodes may be formed without adding a separate metal layer, manufacturing cost might not be added due to the touch electrodes.

According to the aforementioned and other embodiments of the present disclosure, because a decrease in transmittance of light reflected from the touch electrodes by an organic insulating layer may be reduced or minimized by removing the organic insulating film located on the touch electrodes overlapping most of the area of the sub-pixels, a ratio of light reflected by the touch electrodes may be increased.

BRIEF DESCRIPTION OF THE DRAWINGS

The above and other embodiments of the present disclosure will become more apparent by describing embodiments thereof with reference to the attached drawings, in which:

FIG. 17 is a cross-sectional view illustrating an example of the display panel taken along the line C-C' of FIG. 15.

FIG. 18 is a cross-sectional view illustrating an example of the display panel taken along the line C-C' of FIG. 15.

FIG. 20 is a cross-sectional view illustrating mutual capacitance type touch electrodes according to one or more embodiments.

FIG. 22 is a cross-sectional view illustrating an example of the display panel taken along the line D-D' of FIG. 21.

FIG. 23 is a cross-sectional view illustrating an example of the display panel taken along the line D-D' of FIG. 21.

FIG. 24 is a cross-sectional view illustrating an example of the display panel taken along the line D-D' of FIG. 21.

FIG. 27 is a cross-sectional view illustrating an example of a tiled display device taken along the line E-E' of FIG. 26.

DETAILED DESCRIPTION

Figure 1:
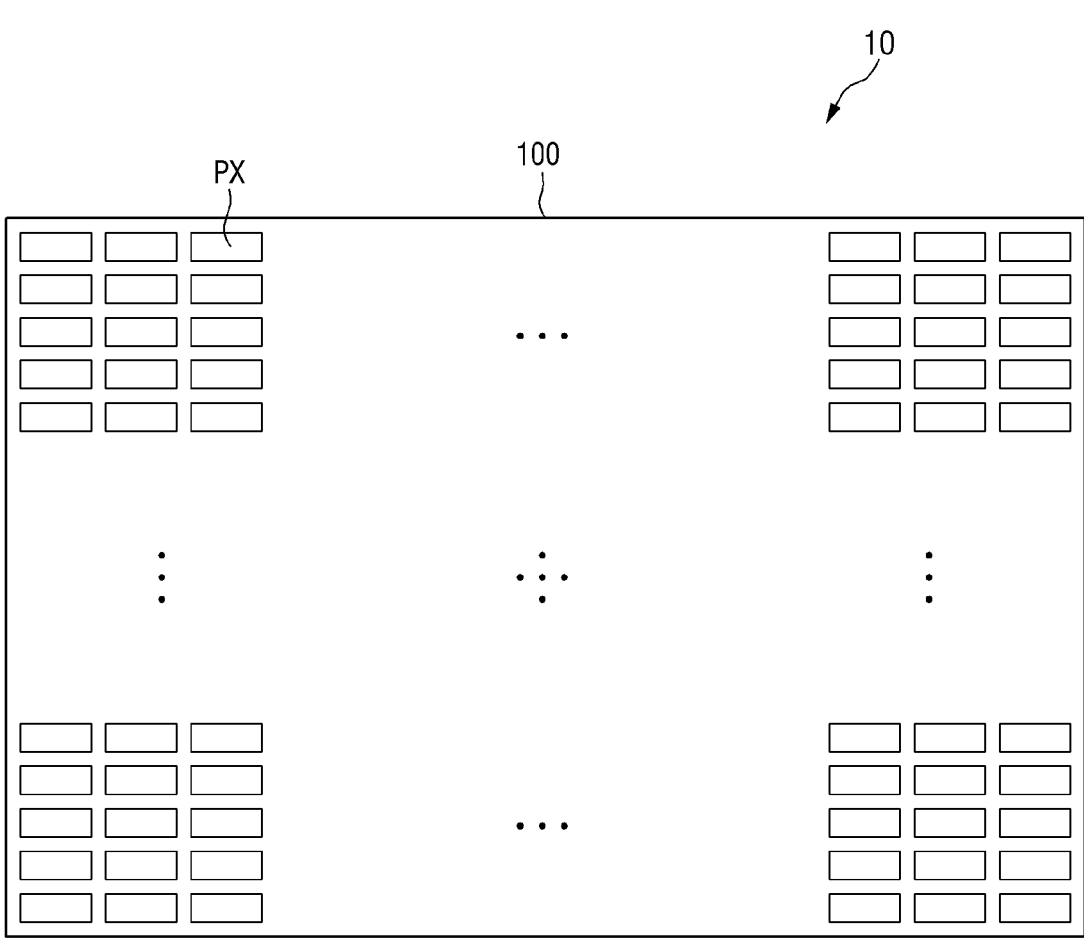
FIG. 1 is a layout diagram illustrating a display device according to one or more embodiments.
Figure 1:
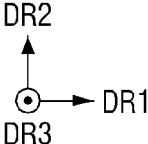

Aspects of embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof will not be repeated. Further, parts not related to the description of one or more embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components, such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions, such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression, such as "at least one of A and B" may include A, B, or A and B. As used herein, the term "and/or" includes any and all combinations of one or more of the associated listed items. For example, the expression, such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media, such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
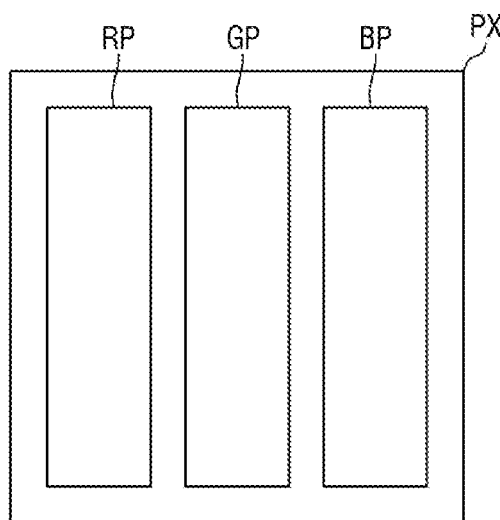
FIG. 2 is a diagram illustrating an example of the pixel of FIG. 1.
Figure 2:
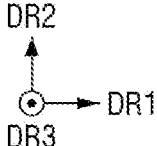
Figure 3:
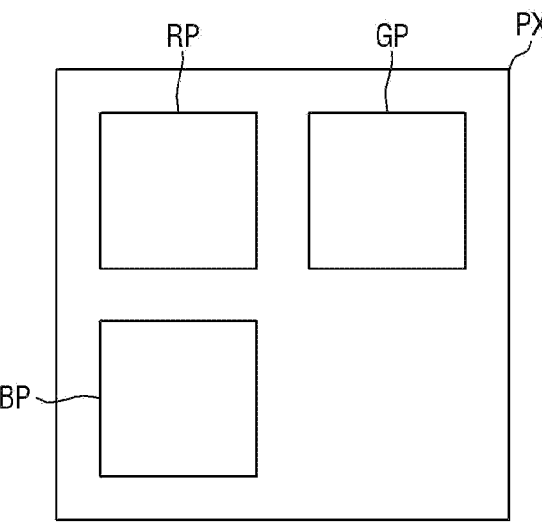
FIG. 3 is a diagram illustrating another example of the pixel of FIG. 1.
Figure 3:
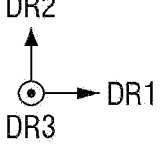

FIG. 1 is a layout diagram illustrating a display device according to one or more embodiments. FIG. 2 is a diagram illustrating an example of the pixel of FIG. 1. FIG. 3 is a diagram illustrating another example of the pixel of FIG. 1.

Referring to FIGS. 1 to 3, a display device 10 is a device for displaying a moving image or a still image. The display device may be used as a display screen of various products, such as televisions, laptop computers, monitors, billboards and the Internet of Things (IOT) as well as portable electronic devices, such as mobile phones, smart phones, tablet personal computer (tablet PC), smart watches, watch phones, mobile communication terminals, electronic notebooks, electronic books, portable multimedia players (PMPs), navigation systems and ultra-mobile PCs (UMPCs).

A display panel 100 may be formed in a rectangular plane having a long side in a first direction DR1, and a short side in a second direction DR2 crossing the first direction DR1. A corner, at which a long side of the first direction DR1 and a short side of the second direction DR2 meet, may be rounded to have a curvature (e.g., predetermined curvature) or may be formed at a right angle. A flat shape of the display panel 100 is not limited to a quadrangle, and may be formed in other polygons, circles, or ovals. The display panel 100 may be formed to be flat but is not limited thereto. For example, the display panel 100 is formed at left and right ends and may include curved portions having a constant curvature or a varying curvature. In addition, the display panel 100 may be flexibly formed to be curved, crooked, bent, folded, or rolled.

The display panel 100 may further include pixels PXs, scan lines extending in the first direction DR1, and data lines extending in the second direction DR2 to display an image. The pixels PX may be arranged in a matrix form in the first direction DR1 and the second direction DR2.

Each of the pixels PX may include a plurality of subpixels RP, GP, and BP as shown in FIGS. 2 and 3. In FIGS. 2 and 3, it was exemplified that each of the pixels PX includes three sub-pixels RP, GP, and BP, that is, a first sub-pixel RP, a second sub-pixel GP, and a third sub-pixel BP, but the present disclosure is not limited thereto.

The first sub-pixel RP, the second sub-pixel GP, and the third sub-pixel BP may be connected to one of the data lines and at least one scan line among the scan lines.

Each of the first sub-pixel RP, the second sub-pixel GP, and the third sub-pixel BP may have a rectangular, square, or rhombus planar shape. For example, each of the first sub-pixel RP, the second sub-pixel GP, and the third subpixel BP may have a planar shape of a rectangle having a short side in the first direction DR1 and a long side in the second direction DR2 as shown in FIG. 2. Alternatively, each of the first sub-pixel RP, the second sub-pixel GP, and the third sub-pixel BP may have a planar shape of a square or rhombus including having the same length in the first direction DR1 and the second direction DR2 as shown in FIG. 3.

As shown in FIG. 2, the first sub-pixel RP, the second sub-pixel GP, and the third sub-pixel BP may be arranged in the first direction DR1. Alternatively, the first sub-pixel RP and any one of the second sub-pixel GP and the third sub-pixel BP may be arranged in the first direction DR1, and the first sub-pixel RP and the other one the second sub-pixel GP and the third sub-pixel BP may be arranged in the second direction DR2. For example, as shown in FIG. 3, the first sub-pixel RP and the second sub-pixel GP may be arranged in the first direction DR1, and the first sub-pixel RP and the third sub-pixel BP may be arranged in the second direction DR2.

Alternatively, any one of the first sub-pixel RP and the third sub-pixel BP and the second sub-pixel GP may be arranged in the first direction DR1, and the other one of the first sub-pixel RP and the third sub-pixel BP and the second sub-pixel GP may be arranged in the second direction DR2. Alternatively, any one of the first sub-pixel RP and the second sub-pixel GP and the third sub-pixel BP may be arranged in the first direction DR1, and the other one of the first sub-pixel RP and the second sub-pixel GP and the third sub-pixel BP may be arranged in the second direction DR2.

The first sub-pixel RP may include a first light-emitting device emitting a first light, the second sub-pixel GP may include a second light-emitting device emitting a second light, and the third sub-pixel BP may include a third light emitting element emitting a third light. Here, the first light may be light of a red wavelength band, the second light may be light of a green wavelength band, and the third light may be light of a blue wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm, but the present disclosure is not limited thereto.

Each of the first sub-pixel RP, the second sub-pixel GP, and the third sub-pixel BP is a light-emitting device that emits light, and may include an inorganic light-emitting device having an inorganic semiconductor. For example, the inorganic light-emitting device may be a flip chip type micro LED (Light Emitting Diode), but the present disclosure is not limited thereto.

As shown in FIGS. 2 and 3, the area of the first sub-pixel RP, the area of the second sub-pixel GP, and the area of the third sub-pixel BP may be substantially the same, but the present disclosure is not limited thereto. At least one of the area of the first sub-pixel RP, the area of the second sub-pixel GP, and the area of the third sub-pixel BP may be different from another one. Alternatively, any two of the area of the first sub-pixel RP, the area of the second sub-pixel GP, and the area of the third sub-pixel BP may be substantially the same while the other one is different from the two. Alternatively, the area of the first sub-pixel RP, the area of the second sub-pixel GP, and the area of the third sub-pixel BP may be different from each other.

Figure 4:
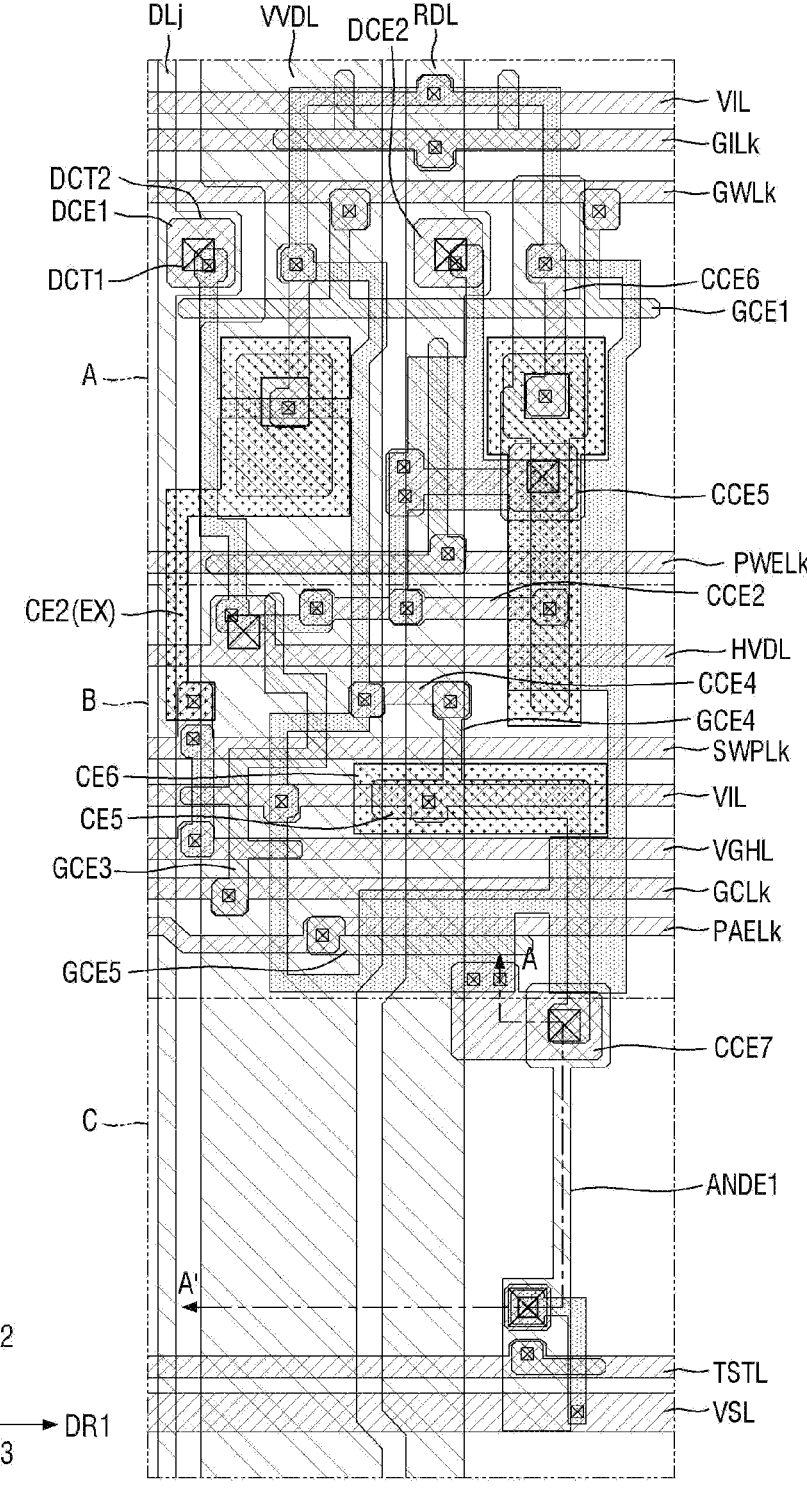
FIG. 4 is a layout diagram illustrating a lower metal layer, an active layer, a first gate metal layer, a second gate metal layer, a first source metal layer, and a second source metal layer of a first sub-pixel according to one or more embodiments.
Figure 5:
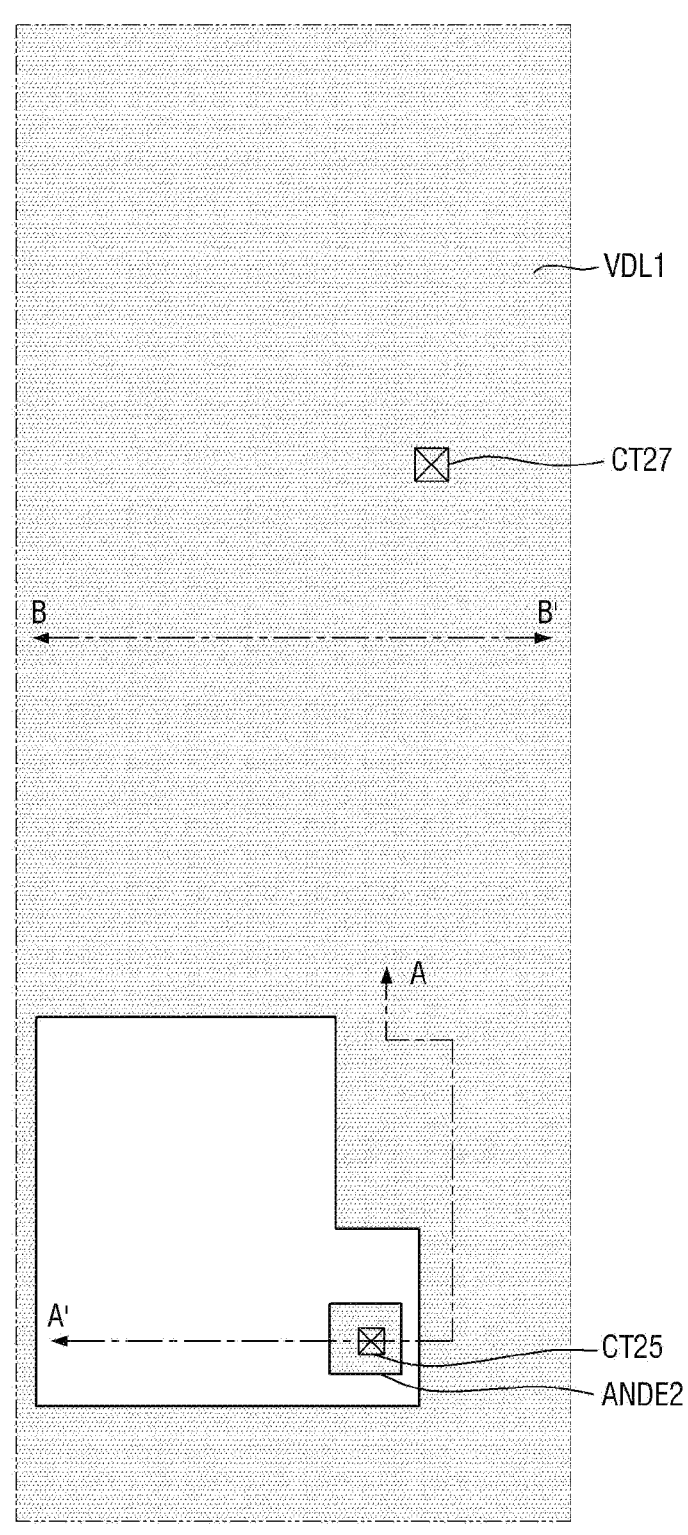
FIG. 5 is a layout diagram illustrating a third source metal layer of the first sub-pixel according to one or more embodiments.
Figure 5:
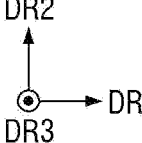
Figure 6:
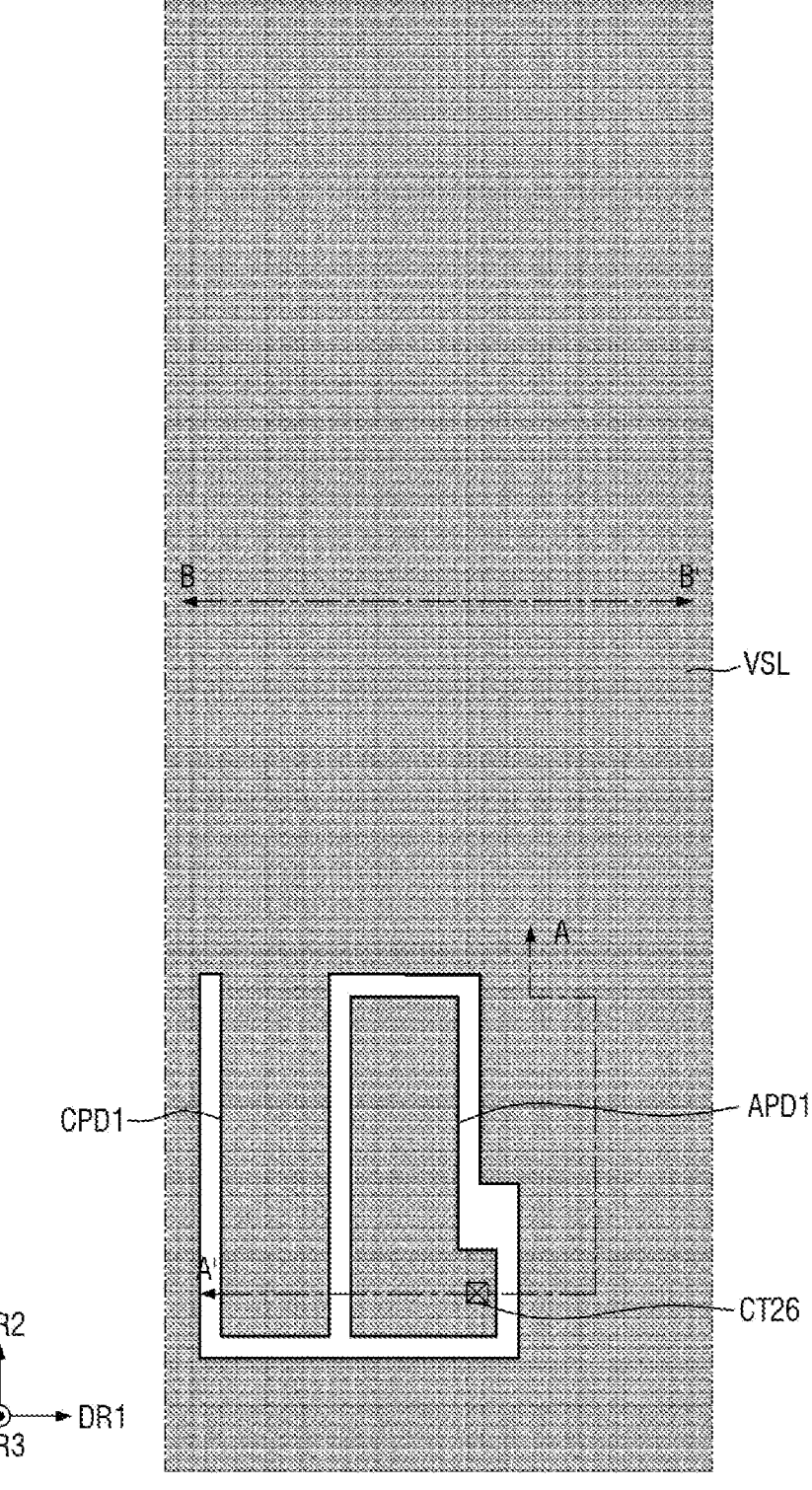
FIG. 6 is a layout diagram illustrating a fourth source metal layer of the first sub-pixel according to one or more embodiments.
Figure 7:
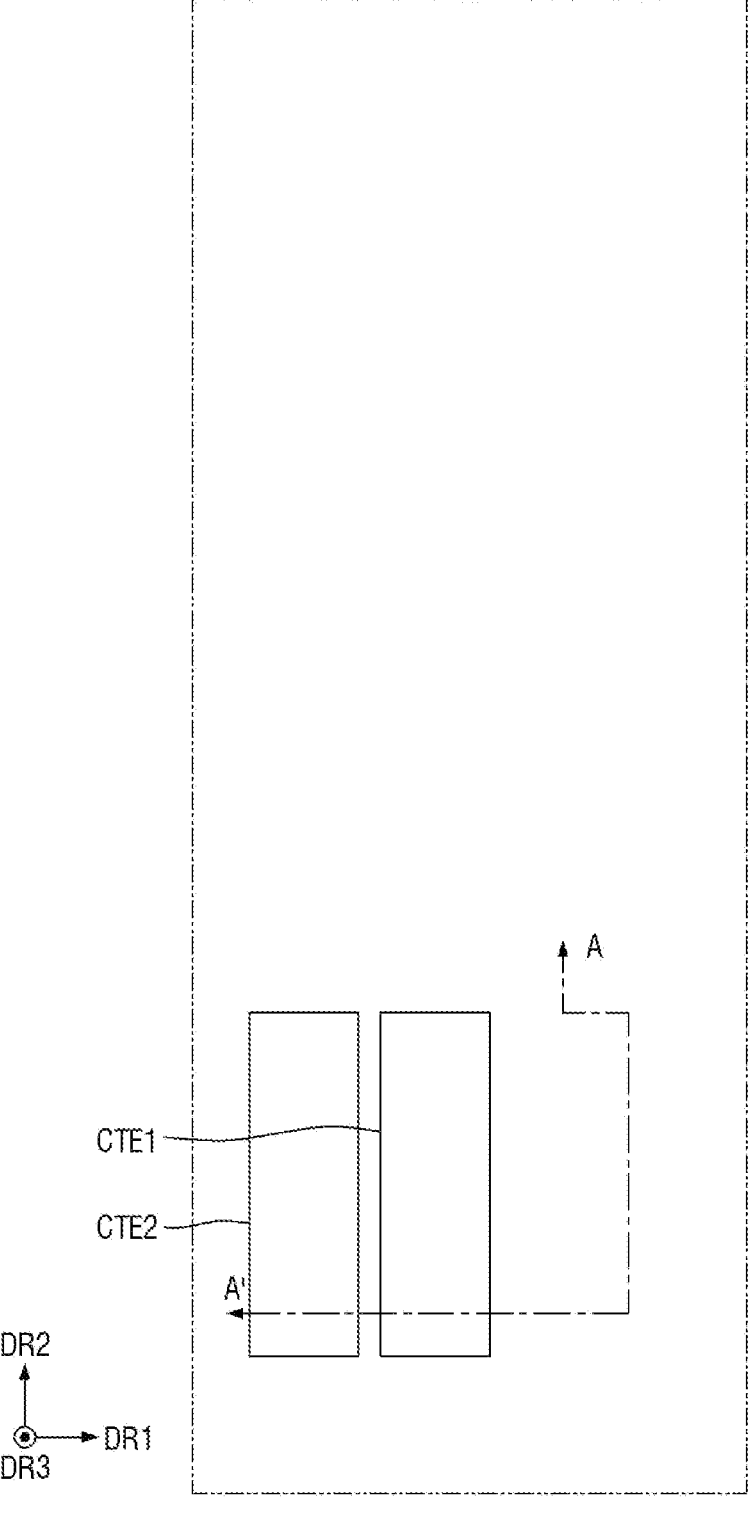
FIG. 7 is a layout diagram illustrating a transparent electrode layer of the first sub-pixel according to one or more embodiments.
Figure 8:
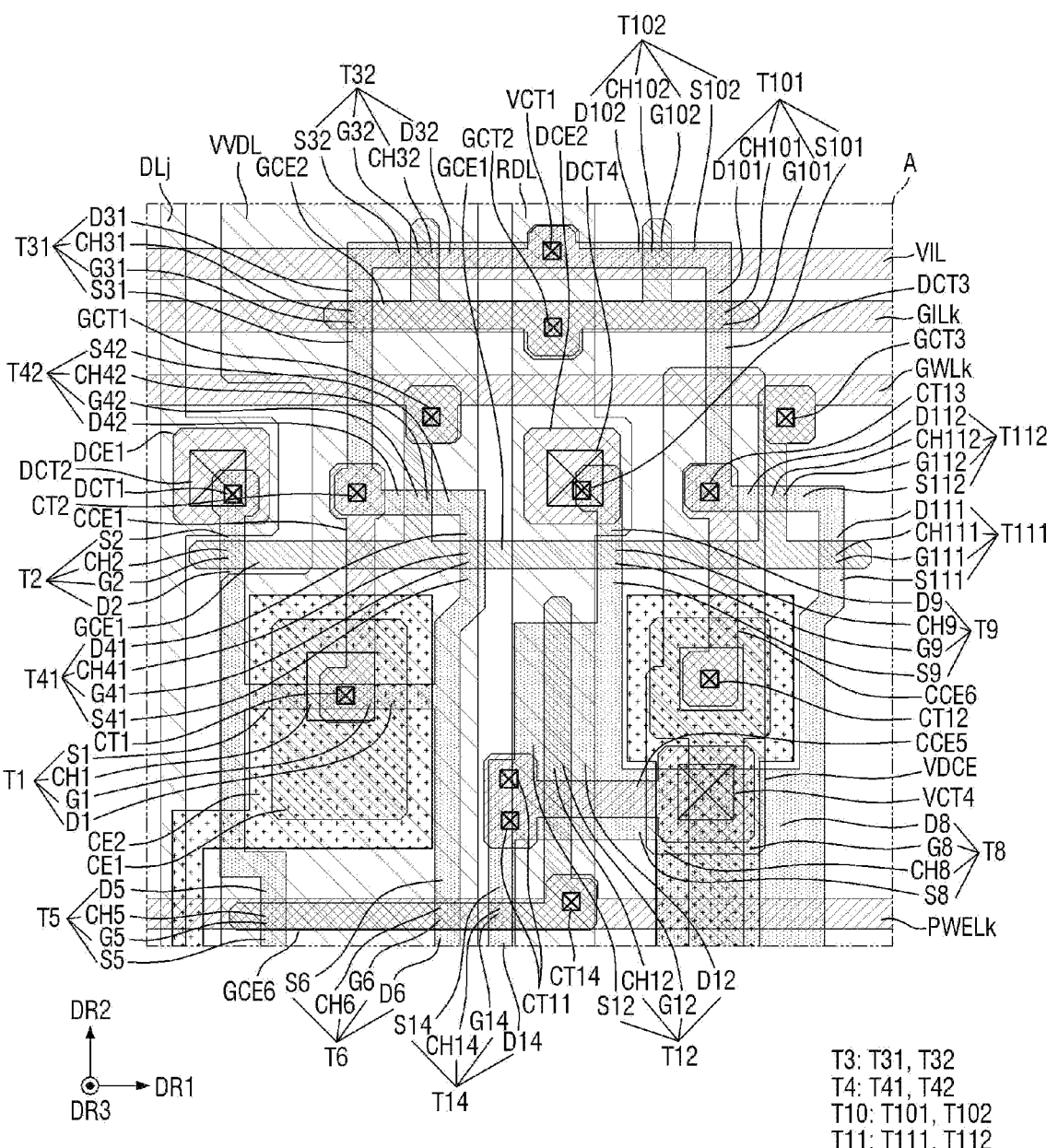
FIG. 8 is an enlarged layout diagram illustrating area A of FIG. 4 in detail.
Figure 9:
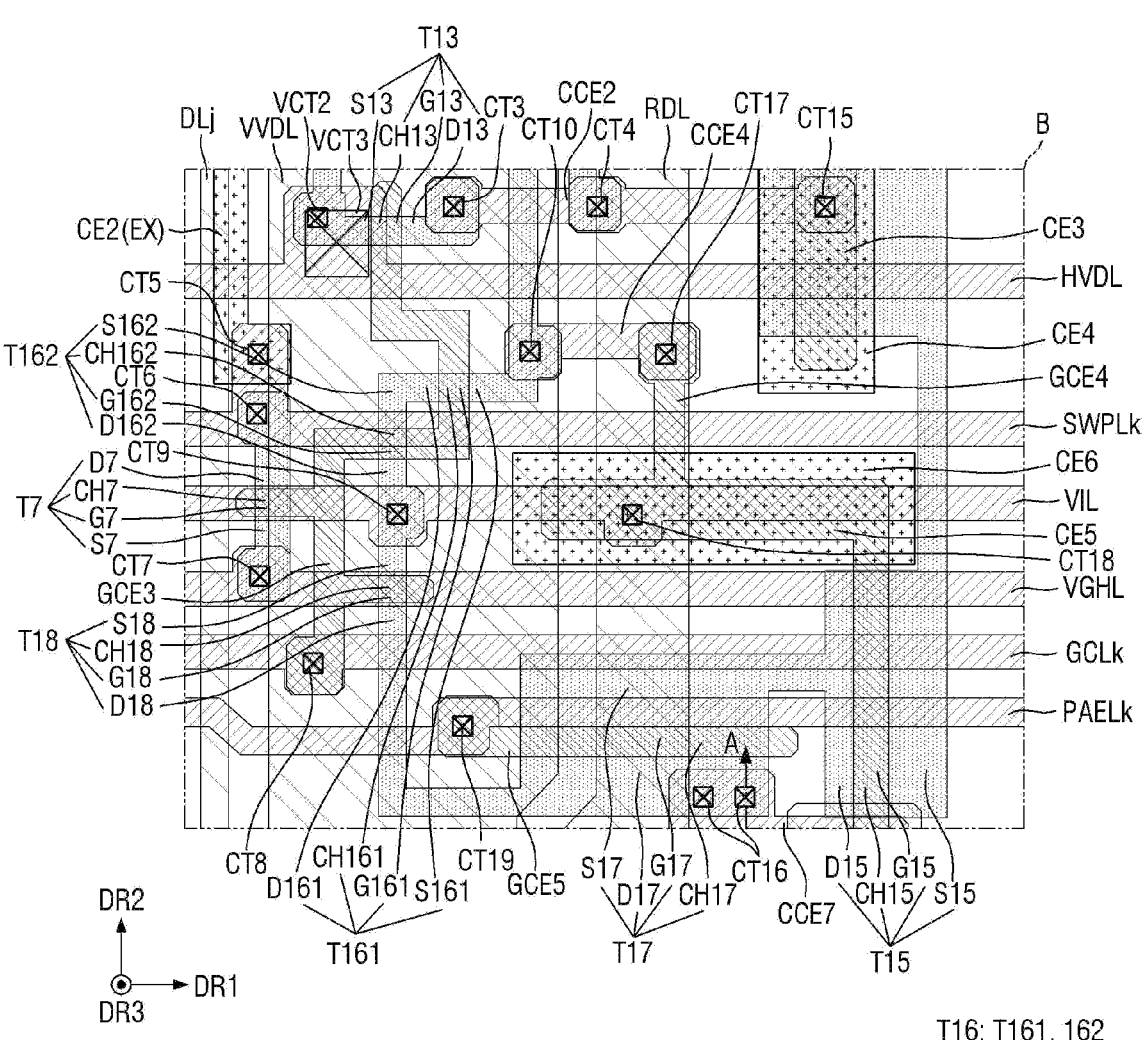
FIG. 9 is an enlarged layout diagram illustrating in detail area B of FIG. 4 in detail.
Figure 10:
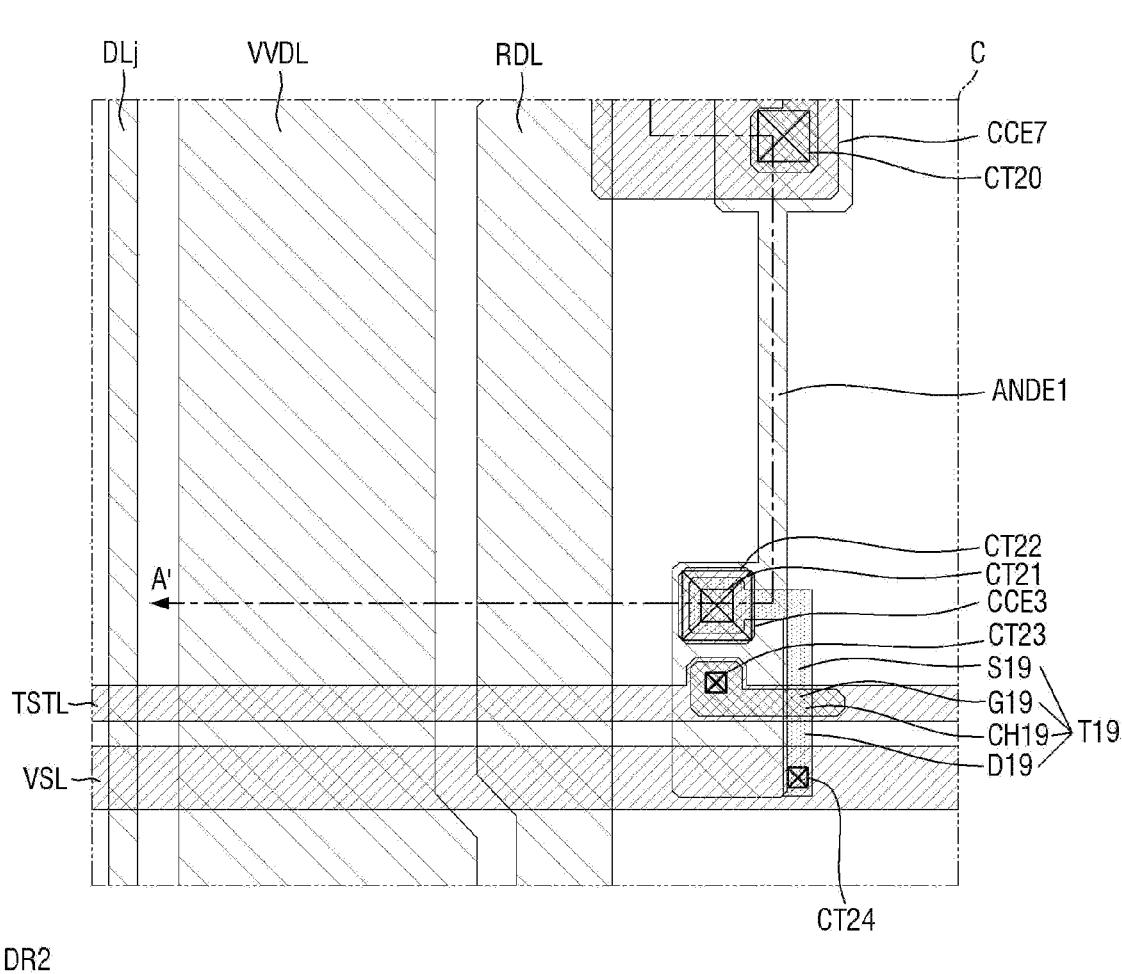
FIG. 10 is an enlarged layout diagram illustrating area C of FIG. 4 in detail.
Figure 10:
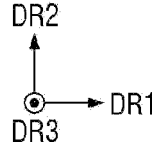

FIG. 4 is a layout diagram illustrating a lower metal layer, an active layer, a first gate metal layer, a second gate metal layer, a first source metal layer, and a second source metal layer of a first sub-pixel according to one or more embodiments. FIG. 5 is a layout diagram illustrating a third source metal layer of the first sub-pixel according to one or more embodiments. FIG. 6 is a layout diagram illustrating a fourth source metal layer of the first sub-pixel according to one or more embodiments. FIG. 7 is a layout diagram illustrating a transparent electrode layer of the first sub-pixel according to one or more embodiments. FIG. 8 is an enlarged layout diagram illustrating in detail area A of FIG. 4. FIG. 9 is an enlarged layout diagram illustrating in detail area B of FIG. 4. FIG. 10 is an enlarged layout diagram illustrating a region C of FIG. 4 in detail.

Referring to FIGS. 4 to 10, an initialization voltage line VIL, a $k^{th}$ initialization scan line GILk, a $k^{th}$ write scan line GWLk, a $k^{th}$ PWM (pulse width modulation) light emitting line PWELk, a first horizontal power supply line HVDL, a gate-off voltage line VGHL, a $k^{th}$ sweep signal line SWPLk, a $k^{th}$ control scan line GCLk, a $k^{th}$ PAM (pulse amplitude modulation) light emitting line PAELk, a test signal line TSTL, and a second power supply line VSL may extend in the first direction DR1. The initialization voltage line VIL, the $k^{th}$ initialization scan line GILk, the $k^{th}$ write scan line GWLk, a $k^{th}$ PWM light emitting line PWELk, the first horizontal power supply line HVDL, the gate-off voltage line VGHL, the $k^{th}$ sweep signal line SWPLk, the $k^{th}$ control scan line GCLk, the $k^{th}$ PAM light emitting line PAELk, the test signal line TSTL, and the second power supply line VSL may be spaced apart from each other in the second direction DR2.

A $j^{th}$ data line DLj, a $j+1^{th}$ data line, a $j+2^{th}$ data line, a first vertical power supply line VVDL, a first PAM data line RDL, a second PAM data line, and a third PAM data line may extend in the second direction DR2. The $j^{th}$ data line DLj, the $j+1^{th}$ data line, the $j+2^{th}$ data line, the first vertical power supply line VVDL, the first PAM data line RDL, the second PAM data line, and the third PAM data line may be located to be spaced apart from each other in the first direction DR1.

The first sub-pixel RP includes the first to nineteenth transistors T1 to T19, the first to sixth capacitor electrodes CE1 to CE6, the first to sixth gate connection electrodes GCE1 to GCE6, the first and second data connection electrodes DCE1 and DCE2, the first to seventh connection electrodes CCE1 to CCE7, a first pad connection electrode ANDE1, a second pad connection electrode ANDE2, a third pad connection electrode ANDE3, a first power supply line VDL1, a second power supply line VSL, a third power supply line VDL2, a first pad electrode APD1, and a second pad electrode APD2.

A first power voltage may be applied to the first power supply line VDL1, a second power voltage may be applied to the second power supply line VSL, and a third power voltage may be applied to the third power supply line VDL2. The third power supply line VDL2 may include a first horizontal power supply line HVDL and the first vertical power supply line VVDL. Therefore, the third power voltage VDD2 may be applied to the first horizontal power supply line HVDL and the first vertical power supply line VVDL.

The first transistor T1 includes a first channel CH1, a first gate electrode G1, a first source electrode S1, and a first drain electrode D1. The first channel CH1 may overlap the first gate electrode G1 in the third direction DR3. The first gate electrode G1 may be connected to a first connection electrode CCE1 through a first contact hole CT1. The first gate electrode G1 may be integrally formed with a first capacitor electrode CE1. The first gate electrode G1 may overlap a second capacitor electrode CE2 in the third direction DR3. The first source electrode S1 may be connected to a second drain electrode D2 and a fifth drain electrode D5. The first drain electrode D1 may be connected to a third sub-source electrode S41 and a sixth source electrode S6. The first source electrode S1 and the first drain electrode D1 may overlap the second capacitor electrode CE2 in the third direction DR3.

The second transistor T2 includes a second channel CH2, a second gate electrode G2, a second source electrode S2, and the second drain electrode D2. The second channel CH2 may overlap the second gate electrode G2 in the third direction DR3. The second gate electrode G2 may be integrally formed with a first gate connection electrode GCE1. The second source electrode S2 may be connected to a first data connection electrode DCE1 through a first data contact hole DCT1. The second drain electrode D2 may be connected to the first source electrode S1. The second drain electrode D2 may be connected to the first source electrode S1.

A first sub-transistor T31 of the third transistor T3 includes a first sub-channel CH31, a first sub-gate electrode G31, a first sub-source electrode S31, and a first sub-drain electrode D31. The first sub-channel CH31 may overlap the first sub-gate electrode G31 in the third direction DR3. The first sub-gate electrode G31 may be integrally formed with a second gate connection electrode GCE2. The first sub-source electrode S31 may be connected to a fourth sub-drain electrode D42, and the first sub-drain electrode D31 may be connected to a second sub-source electrode S32. The first sub-source electrode S31 may overlap the $k^{th}$ write scan line GWLk in the third direction DR3. A first sub-drain electrode S32 may overlap the initialization voltage line VIL in the third direction DR3.

A second sub-transistor T32 of the third transistor T3 includes a second sub-channel CH32, a second sub-gate electrode G32, the second sub-source electrode S32, and a second sub-drain electrode D32. The second sub-channel CH32 may overlap the second sub-gate electrode G32 in the third direction DR3. The second sub-gate electrode G32 may be integrally formed with the second gate connection electrode GCE2. The second sub-source electrode S32 may be connected to the first sub-drain electrode D31, and the second sub-drain electrode D32 may be connected to the initialization voltage line VIL through a first power contact hole VCT1. The second sub-source electrode S32 and the second sub-drain electrode D32 may overlap the initialization voltage line VIL in the third direction DR3.

A third sub-transistor T41 of the fourth transistor T4 includes a third sub-channel CH41, a third sub-gate electrode G41, a third sub-source electrode S41, and a third sub-drain electrode D41. The third sub-channel CH41 may overlap a third sub-gate electrode G41 in the third direction DR3. The third sub-gate electrode G41 may be integrally formed with the first gate connection electrode GCE1. The third sub-source electrode S41 may be connected to the first drain electrode D1, and the third sub-drain electrode D41 may be connected to a fourth sub-source electrode S42.

A fourth sub-transistor T42 of the fourth transistor T4 includes a fourth sub-channel CH42, a fourth sub-gate electrode G42, the fourth sub-source electrode S42, and the fourth sub-drain electrode D42. The fourth sub-channel CH42 may overlap the fourth sub-gate electrode G42 in the third direction DR3. The fourth sub-gate electrode G42 may be integrally formed with the second gate connection electrode GCE2. The fourth sub-source electrode S42 may be connected to a third sub-drain electrode D32, and the fourth sub-drain electrode D42 may be connected to the first sub-source electrode S31.

A fifth transistor T5 includes a fifth channel CH5, a fifth gate electrode G5, a fifth source electrode S5, and a fifth drain electrode D5. The fifth channel CH5 may overlap the fifth gate electrode G5 in the third direction DR3. The fifth gate electrode G5 may be integrally formed with a sixth gate connection electrode GCE6. The fifth source electrode S5 may be connected to the first horizontal power supply line HVDL through a second power contact hole VCT2. The fifth drain electrode D5 may be connected to the first source electrode S1. The fifth drain electrode D5 may overlap an extension portion EX of the second capacitor electrode CE2 in the third direction DR3.

The sixth transistor T6 includes a sixth channel CH6, a sixth gate electrode G6, the sixth source electrode S6, and a sixth drain electrode D6. The sixth channel CH6 may overlap the sixth gate electrode G6 in the third direction DR3. The sixth gate electrode G6 may be integrally formed with the sixth gate connection electrode GCE6. The sixth source electrode S6 may be connected to the first drain electrode D1. The sixth drain electrode D6 may be connected to a fourth connection electrode CCE4 through a tenth contact hole CT10. The sixth drain electrode D6 may overlap a second connection electrode CCE2 and the first horizontal power supply line HVDL in the third direction DR3.

The seventh transistor T7 includes a seventh channel CH7, a seventh gate electrode G7, a seventh source electrode S7, and a seventh drain electrode D7. The seventh channel CH7 may overlap the seventh gate electrode G7 in the third direction DR3. The seventh gate electrode G7 may be integrally formed with a third gate connection electrode GCE3. The seventh gate electrode G7 may overlap the initialization voltage line VIL in the third direction DR3. The seventh source electrode S7 may be connected to the gate-off voltage line VGHL through a seventh contact hole CT7. The seventh drain electrode D7 may be connected to the k$^{th}$ sweep signal line SWPLk through a sixth contact hole CT6.

The eighth transistor T8 includes an eighth channel CH8, an eighth gate electrode G8, an eighth source electrode S8, and an eighth drain electrode D8. The eighth channel CH8 may overlap the eighth gate electrode G8 in the third direction DR3. The eighth gate electrode G8 may extend in the second direction DR2. The eighth gate electrode G8 may be integrally formed with a third capacitor electrode CE3. The eighth source electrode S8 may be connected to a ninth drain electrode D9 and a twelfth drain electrode D12. The eighth drain electrode D8 may be connected to a seventh sub-source electrode S111.

The ninth transistor T9 includes a ninth channel CH9, a ninth gate electrode G9, a ninth source electrode S9, and a ninth drain electrode D9. The ninth channel CH9 may overlap the ninth gate electrode G9 in the third direction DR3. The ninth gate electrode G9 may extend in the second direction DR2. The ninth gate electrode G9 may be integrally formed with the first gate connection electrode GCE1. The ninth source electrode S9 may be connected to a second data connection electrode DCE2 through a third data contact hole DCT3. The ninth drain electrode D9 may be connected to an eighth source electrode D8.

A fifth sub-transistor T101 of the tenth transistor T10 includes a fifth sub-channel CH101, a fifth sub-gate electrode G101, a fifth sub-source electrode S101, and a fifth sub-drain electrode D101. The fifth sub-channel CH101 may overlap the fifth sub-gate electrode G101 in the third direction DR3. The fifth sub-gate electrode G101 may be integrally formed with the second gate connection electrode GCE2. The fifth sub-source electrode S101 may be connected to an eighth sub-drain electrode D112, and the fifth sub-drain electrode D101 may be connected to a sixth sub-source electrode S102. The fifth sub-source electrode S101 may overlap the k$^{th}$ write scan line GWLk in the third direction DR3. The fifth sub-drain electrode S102 may overlap the initialization voltage line VIL in the third direction DR3.

The sixth sub-transistor T102 of the tenth transistor T10 includes a sixth sub-channel CH102, a sixth sub-gate electrode G102, the sixth sub-source electrode S102, and a sixth sub-drain electrode D102. The sixth sub-channel CH102 may overlap the sixth sub-gate electrode G102 in the third direction DR3. The sixth sub-gate electrode G102 may be integrally formed with the second gate connection electrode GCE2. The sixth sub-source electrode S102 may be connected to the fifth sub-drain electrode D101, and the sixth sub-drain electrode D102 may be connected to the initialization voltage line VIL through the first power contact hole VCT1. The sixth sub-source electrode S102 and the sixth sub-drain electrode D102 may overlap the initialization voltage line VIL in the third direction DR3.

A seventh sub-transistor T111 of the eleventh transistor T11 includes a seventh sub-channel CH111, a seventh sub-gate electrode G111, a seventh sub-source electrode S111, and a seventh sub-drain electrode D111. The seventh sub-channel CH111 may overlap the seventh sub-gate electrode G111 in the third direction DR3. The seventh sub-gate electrode G111 may be integrally formed with the first gate connection electrode GCE1. The seventh sub-source electrode S111 may be connected to the eighth drain electrode D8, and the seventh sub-drain electrode D111 may be connected to an eighth sub-source electrode S112.

An eighth sub-transistor T112 of the eleventh transistor T11 includes an eighth sub-channel CH112, an eighth sub-gate electrode G112, the eighth sub-source electrode S112, and the eighth sub-drain electrode D112. The eighth sub-channel CH112 may overlap the eighth sub-gate electrode G112 in the third direction DR3. The eighth sub-gate electrode G112 may be integrally formed with the first gate connection electrode GCE1. The eighth sub-source electrode S112 may be connected to the seventh sub-drain electrode D111, and the eighth sub-drain electrode D112 may be connected to the fifth sub-source electrode S101.

The twelfth transistor T12 includes a twelfth channel CH12, a twelfth gate electrode G12, a twelfth source electrode S12, and the twelfth drain electrode D12. The twelfth channel CH12 may overlap the twelfth gate electrode G12 in the third direction DR3. The twelfth gate electrode G12 may be integrally formed with the sixth gate connection electrode GCE6. The twelfth source electrode S12 may be connected to a fifth connection electrode CCE5 through an eleventh contact holes CT11.

The thirteenth transistor T13 includes a thirteenth channel CH13, a thirteenth gate electrode G13, a thirteenth source electrode S13, and a thirteenth drain electrode D13. The thirteenth channel CH13 may overlap the thirteenth gate electrode G13 in the third direction DR3. The thirteenth gate electrode G13 may be integrally formed with the third gate connection electrode GCE3. The thirteenth source electrode S13 may be connected to the first horizontal power supply line HVDL through the second power contact hole VCT2. The thirteenth drain electrode D13 may be connected to the second connection electrode CCE2 through a third contact hole CT3.

The fourteenth transistor T14 includes a fourteenth channel CH14, a fourteenth gate electrode G14, a fourteenth source electrode S14, and a fourteenth drain electrode D14. The fourteenth channel CH14 may overlap the fourteenth gate electrode G14 in the third direction DR3. The fourteenth gate electrode G14 may be integrally formed with the sixth gate connection electrode GCE6. The fourteenth source electrode S14 may be connected to the fifth connection electrode CCE5 through the eleventh contact holes CT11. The fourteenth drain electrode D14 may be connected to the second connection electrode CCE2 through a fourth contact hole CT4.

The fifteenth transistor T15 includes a fifteenth channel CH15, a fifteenth gate electrode G15, a fifteenth source electrode S15, and a fifteenth drain electrode D15. The fifteenth channel CH15 may overlap the fifteenth gate electrode G15 in the third direction DR3. The fifteenth gate electrode G15 may be integrally formed with a fifth capacitor electrode CE5. The fifteenth source electrode S15 may be connected to a ninth drain electrode D5. The fifteenth drain electrode D15 may be connected to a seventeenth source electrode S17.

A ninth sub-transistor T161 of the sixteenth transistor T16 includes a ninth sub-channel CH161, a ninth sub-gate electrode G161, a ninth sub-source electrode S161, and a ninth sub-drain electrode D161. The ninth sub-channel CH161 may overlap the ninth sub-gate electrode G161 in the third direction DR3. The ninth sub-gate electrode G161 may be integrally formed with the third gate connection electrode GCE3. The ninth sub-source electrode S161 may be connected to the fourth connection electrode CCE4 through the tenth contact hole CT10, and the ninth sub-drain electrode D161 may be connected to a tenth sub-source electrode S162.

A tenth sub-transistor T162 of the sixteenth transistor T16 includes a tenth sub-channel CH162, a tenth sub-gate electrode G162, the tenth sub-source electrode S162, and a tenth sub-drain electrode D162. The tenth sub-channel CH162 may overlap the tenth sub-gate electrode G162 in the third direction DR3. The tenth sub-gate electrode G162 may be integrally formed with the third gate connection electrode GCE3. The tenth sub-source electrode S162 may be connected to the ninth sub-drain electrode D161, and the tenth sub-drain electrode D162 may be connected to the initialization voltage line VIL through a ninth contact hole CT9.

The seventeenth transistor T17 includes a seventeenth channel CH17, a seventeenth gate electrode G17, the seventeenth source electrode S17, and a seventeenth drain electrode D17. The seventeenth channel CH17 may overlap the seventeenth gate electrode G17 in the third direction DR3. The seventeenth gate electrode G17 may be integrally formed with a fifth gate connection electrode GCE5. The seventeenth source electrode S17 may be connected to the fifteenth drain electrode D15. The seventeenth drain electrode D17 may be connected to a seventh connection electrode CCE7 through a sixteenth contact holes CT16.

The eighteenth transistor T18 includes an eighteenth channel CH18, an eighteenth gate electrode G18, an eighteenth source electrode S18, and an eighteenth drain electrode D18. The eighteenth channel CH18 may overlap the eighteenth gate electrode G18 in the third direction DR3. The eighteenth gate electrode G18 may be integrally formed with the third gate connection electrode GCE3. The eighteenth source electrode S18 may be connected to the initialization voltage line VIL through the ninth contact hole CT9. The eighteenth drain electrode D18 may be connected to the seventh connection electrode CCE7 through the sixteenth contact holes CT16.

As shown in FIG. 10, the nineteenth transistor T19 includes a nineteenth channel CH19, a nineteenth gate electrode G19, a nineteenth source electrode S19, and a nineteenth drain electrode D19. The nineteenth channel CH19 may overlap the nineteenth gate electrode G19 in the third direction DR3. The nineteenth gate electrode G19 may be connected to the test signal line TSTL through a twenty-third contact hole CT23. The nineteenth source electrode S19 may be connected to a third connection electrode CCE3 through a twenty-first contact hole CT21. The nineteenth drain electrode D19 may be connected to the second power supply line VSL through a twenty-fourth contact hole CT24.

The first capacitor electrode CE1 may be integrally formed with the first gate electrode G1. The second capacitor electrode CE2 may overlap the first capacitor electrode CE1 in the third direction DR3. The first capacitor electrode CE1 may be one electrode of the first capacitor C1, and the second capacitor electrode CE2 may be the other electrode of the first capacitor C1.

The second capacitor electrode CE2 includes a hole exposing the first gate electrode G1 and the first connection electrode CCE1 may be connected to the first gate electrode G1 through the first contact hole CT1 in the hole.

The second capacitor electrode CE2 may include an extension EX extending in the second direction DR2. The extension EX of the second capacitor electrode CE2 may cross the $k^{th}$ PWM light emitting line PWELk and a first horizontal voltage line HVDL. The extension EX of the second capacitor CE2 may be connected to the $k^{th}$ sweep signal line SWPLk through a fifth contact hole CT5.

The third capacitor electrode CE3 may be formed integrally with the eighth gate electrode G8. A fourth capacitor electrode CE4 may overlap the third capacitor electrode CE3 in the third direction DR3. The third capacitor electrode CE3 may be one electrode of a second capacitor C2, and the fourth capacitor electrode CE4 may be the other electrode of the second capacitor C2.

The fourth capacitor electrode CE4 includes the hole exposing the eighth gate electrode G8 and a sixth connection electrode CCE6 may be connected to the eighth gate electrode G8 through a twelfth contact hole CT12 in the hole.

The fifth capacitor electrode CE5 may be integrally formed with a fourth gate connection electrode GCE4 and the fifteenth gate electrode G15. A sixth capacitor electrode CE6 may overlap the fifth capacitor electrode CE5 in the third direction DR3. The fifth capacitor electrode CE5 may be one electrode of a third capacitor C3 and the sixth capacitor electrode CE6 may be the other electrode of the third capacitor C3. The sixth capacitor electrode CE6 may be connected to the initialization voltage line VIL through an eighteenth contact hole CT18.

The first gate connection electrode GCE1 may be connected to the $k^{th}$ write scan line GWLk through a first gate contact hole GCT1 and a third gate contact hole GCT3. The second gate connection electrode GCE2 may be connected to the $k^{th}$ initialization scan line GILk through a second gate contact hole GCT2. The third gate connection electrode GCE3 may be connected to the $k^{th}$ control scan line GCLk through an eighth contact hole CT8. The fourth gate connection electrode GCE4 may be connected to the fourth connection electrode CCE4 through a seventeenth contact hole CT17. The fifth gate connection electrode GCE5 may be connected to the $k^{th}$ PAM light emitting line PAELk through a nineteenth contact hole CT19. The sixth gate connection electrode GCE6 may be connected to the $k^{th}$ PWM light emitting line PWELk through a fourteenth contact hole CT14.

The first data connection electrode DCE1 may be connected to the second source electrode S2 through the first data contact hole DCT1 and may be connected to the $j^{th}$ data line DLj through a second data contact hole DCT2. The second data connection electrode DCE2 may be connected to the ninth source electrode S9 through the third data contact hole DCT3 and may be connected to the first PAM data line RDL through a fourth data contact hole DCT4.

The first connection electrode CCE1 may extend in the second direction DR2. The first connection electrode CCE1 may be connected to the first gate electrode G1 through the first contact hole CT1 and may be connected to the first sub-source electrode S31 and the fourth sub-drain electrode D42 through a second contact hole CT2.

The second connection electrode CCE2 may extend in the first direction DR1. The second connection electrode CCE2 may be connected to the twelfth drain electrode D12 through the third contact hole CT3, may be connected to the fourteenth drain electrode D14 through a fourteenth contact hole CT4, and may be connected to the fourth capacitor electrode CE4 through a fifteenth contact hole CT15.

The third connection electrode CCE3 may be connected to the nineteenth source electrode S19 through the twenty-first contact hole CT21 and may be connected to the first pad connection electrode ANDE1 through a twenty-second contact hole CT22.

The fourth connection electrode CCE4 may extend in the first direction DR1. The fourth connection electrode CCE4 may be connected to the sixth drain electrode D6 and the ninth sub-source electrode S161 through the tenth contact hole CT10 and may be connected to the fourth gate through the seventeenth contact hole CT17.

The fifth connection electrode CCE5 may extend in the first direction DR1. The fifth connection electrode CCE5 may be connected to the twelfth source electrode S12 and the fourteenth source electrode S14 through the eleventh contact holes CT11 and may be connected the fourth capacitor electrode through a fourth power contact hole VCT4.

The sixth connection electrode CCE6 may extend in the second direction DR2. The sixth connection electrode CCE6 may be connected to the third capacitor electrode CE3 through the twelfth contact hole CT12 and may be connected to the fifth sub-source electrode S101 and the eighth sub-drain electrode through a thirteenth contact hole CT13.

The seventh connection electrode CCE7 may be connected to the seventeenth drain electrode D17 and the eighteenth drain electrode D18 through the sixteenth contact holes CT16. The seventh connection electrode CCE7 may be connected to the first pad connection electrode ANDE1 through a twentieth contact hole CT20, as shown in FIG. 10.

A power connection electrode VDCE may extend in the second direction DR2. The power connection electrode VDCE may be connected to the fifth connection electrode CCE5 through a fourth power contact hole VCT4.

As shown in FIG. 10, the first pad connection electrode ANDE1 may extend in the second direction DR2. The first pad connection electrode ANDE1 may be connected to the seventh connection electrode CCE7 through the twentieth contact hole CT20 and may be connected to the third connection electrode CCE3 through the twenty-second contact hole CT22.

Figure 11:
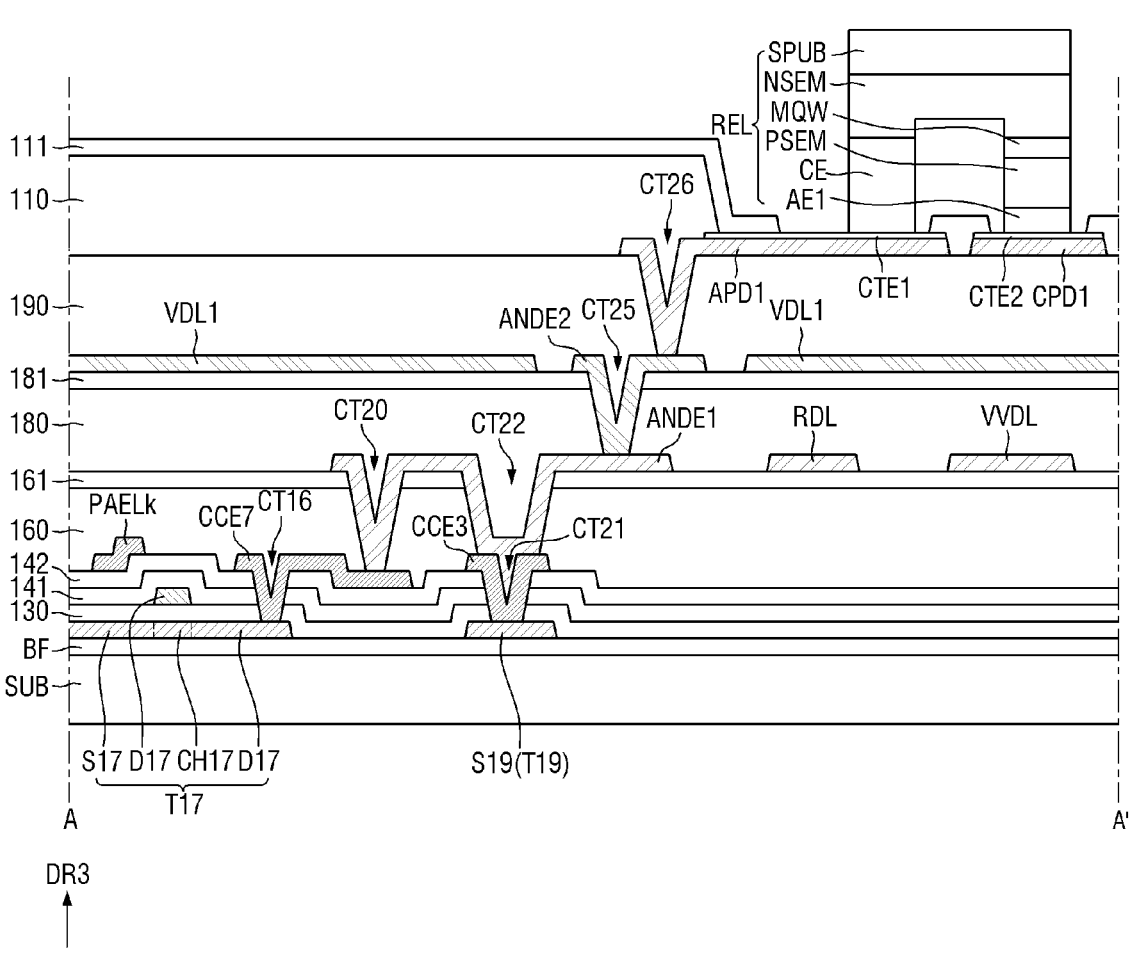
FIG. 11 is a cross-sectional view illustrating an example of the first sub-pixel taken along the line A-A' of FIGS. 4 to 7.

As shown in FIG. 11, the second pad connection electrode ANDE2 may be connected to the first pad connection electrode ANDE1 through a twenty-fifth contact hole CT25.

A first pad connection electrode APD1 may be connected to the second pad connection electrode ANDE2 through a twenty-sixth contact hole CT26.

As shown in FIG. 5, the first power supply line VDL1 may be connected to the power connection electrode VDCE through a twenty-seventh contact hole CT27. The first power supply line VDL1 may overlap the first to nineteenth transistors T1 to T19.

The second power supply line VSL may be connected to the second pad connection electrode APD2. The second power supply line VSL may overlap the first power supply line VDL1. Because the second power supply line VSL is located over a large area to overlap the first to nineteenth transistors T1 to T19, it may serve as a reflective electrode that reflects light incident from the outside. Therefore, the display device according to one or more embodiments may be implemented as a reflective display device in which the user can see the object or background reflected from the display device by reflecting the light incident through the second power supply line VSL.

Meanwhile, according to one or more embodiments, a layout of the second sub-pixel GP and a layout of the third sub-pixel BP may be substantially the same as the first sub-pixel RP described with reference to FIGS. 4 to 10. Therefore, the description of the layout of the second sub-pixel GP and the layout of the third sub-pixel BP according to one or more embodiments will be omitted.

FIG. 11 is a cross-sectional view illustrating an example of the first sub-pixel taken along the line A-A' of FIGS. 4 to 7.

Referring to FIG. 11, the display panel 100 may include a substrate SUB, a thin film transistor layer TFTL (e.g., see FIG. 27), and a light emitting element layer.

A buffer layer BF may be located on the substrate SUB. The substrate SUB may be made of an insulating material, such as glass or polymer resin. For example, when the substrate SUB is made of a polymer resin, it may include polyimide. The substrate SUB may be a flexible substrate capable of bending, folding, rolling, or the like.

The buffer layer BF is a layer for protecting the transistors of the thin film transistor layer TFTL and the light emitting element layer from moisture penetrating through the substrate SUB, which is vulnerable to moisture permeation. The buffer layer BF may be formed of a plurality of inorganic layers alternately stacked. For example, the buffer layer BF may be formed as a multilayer in which one or more inorganic layers of a silicon nitride layer, a silicon oxynitride layer, a silicon oxide layer, a titanium oxide layer, and an aluminum oxide layer are alternately stacked.

The active layer may be located on the buffer layer BF. The active layer includes channels of the first to nineteenth transistors T1 to T19, source electrodes, and drain electrodes. The active layer may include polycrystalline silicon, single crystal silicon, low-temperature polycrystalline silicon, amorphous silicon, or an oxide semiconductor.

The channels of the first to nineteenth transistors T1 to T19 may respectively overlap the gate electrodes in the third direction DR3. The source electrodes and drain electrodes of the first to nineteenth transistors T1 to T19 might not overlap the gate electrodes in the third direction DR3 (e.g., may be separated from the gate electrodes in plan view). The source electrodes and drain electrodes of the first to nineteenth transistors T1 to T19 may be conductive areas obtained by doping a silicon semiconductor or an oxide semiconductor with ions.

A gate insulating layer 130 may be located on the active layer. The gate insulating layer 130 may be formed of an inorganic layer, for example, a silicon nitride layer, a silicon oxynitride layer, a silicon oxide layer, a titanium oxide layer, or an aluminum oxide layer.

The first gate metal layer may be located on the gate insulating layer 130. The first gate metal layer includes the first to nineteenth gate electrodes G1 to G19 of the first to nineteenth transistors T1 to T19, the first capacitor electrode CE1, the third capacitor electrode CE3, the fifth capacitor electrode CE5 and first to sixth gate connection electrodes GCE1 to GCE6. The first to nineteenth gate electrodes G1 to G19, the first capacitor electrode CE1, the third capacitor electrode CE3, the fifth capacitor electrode CE5, and the first to sixth gate connection electrodes GCE1 to GCE6 may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

A first interlayer insulating layer 141 may be located on the first gate metal layer. The first interlayer insulating layer 141 may be formed of the inorganic layer, for example, the silicon nitride layer, the silicon oxynitride layer, the silicon oxide layer, the titanium oxide layer, or the aluminum oxide layer.

The second gate metal layer may be located on the first interlayer insulating layer 141. The second gate metal layer may include the second capacitor electrode CE2, the fourth capacitor electrode CE4, and the sixth capacitor electrode CE6. The second gate metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The second capacitor electrode CE2 may overlap the first capacitor electrode CE1 in the third direction DR3, the fourth capacitor electrode CE4 may overlap the third capacitor electrode CE3 in the third direction DR3, and the sixth capacitor electrode CE6 may overlap the fifth capacitor electrode CE5 in the third direction DR3. Because the first interlayer insulating layer 141 has a dielectric constant (e.g., a predetermined dielectric constant), the first capacitor C1 may be formed by the first capacitor electrode CE1, the second capacitor electrode CE2, and the first interlayer insulating layer 141 located therebetween. Further, the second capacitor C2 may be formed by the third capacitor electrode CE3, the fourth capacitor electrode CE4, and the first interlayer insulating layer 141 located therebetween.

A second interlayer insulating layer 142 may be located on the second gate metal layer. The second interlayer insulating layer 142 may be formed of the inorganic layer, for example, the silicon nitride layer, the silicon oxynitride layer, the silicon oxide layer, the titanium oxide layer, or the aluminum oxide layer.

The first source metal layer may be located on second interlayer insulating layer 142. The first source metal layer may include an initialization voltage lines VIL, a $k^{th}$ scan initialization line GILk, a $k^{th}$ scan write line GWLk, the $k^{th}$ PWM emission line PWELk, the first horizontal power supply line HVDL, the gate-off voltage line VGHL, the $k^{th}$ sweep signal line SWPLk, a $k^{th}$ scan control line GCLk, a $k^{th}$ PAM emission line PAELk, the test signal line TSTL, and a third power supply line VSL. Further, the first source metal layer may include the first and second data connection electrodes DCE1 and DCE2 and the first to seventh connection electrodes CCE1 to CCE7. The first source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The $k^{th}$ scan write line GWLk may be connected to the fourth sub-gate electrode G42 and the eighth sub-gate electrode G112 respectively through the first gate contact hole GCT1 and the third gate contact hole GCT3, which penetrates the first interlayer insulating layer 141 and the second interlayer insulating layer 142. The $k^{th}$ scan initialization line GILk may be connected to the second gate connection electrode GCE2 through the second gate contact hole GCT2 penetrating the first interlayer insulating layer 141 and the second interlayer insulating layer 142. The $k^{th}$ scan control line GCLk may be connected to the third gate connection electrode GCE3 through the eighth contact hole CT8 penetrating the first interlayer insulating layer 141 and the second interlayer insulating layer 142. The $k^{th}$ PAM emission line PAELk may be connected to the fifth gate connection electrode GCE5 through the nineteenth contact hole CT19 penetrating the first interlayer insulating layer 141 and the second interlayer insulating layer 142.

The initialization voltage line VIL may be connected to the second sub-drain electrode D32 and the sixth sub-drain electrode D102 through the first power contact hole VCT1 penetrating the gate insulating layer 130, the first interlayer insulating layer 141, and the second interlayer insulating layer 142. The initialization voltage line VIL may be connected to the tenth sub-drain electrode D162 and the eighteenth drain electrode D18 through the ninth contact hole CT9 penetrating the gate insulating layer 130, the first interlayer insulating layer 141, and the second interlayer insulating layer 142. The initialization voltage line VIL may be connected to the sixth capacitor electrode CE6 through the eighteenth contact hole CT18 penetrating the second interlayer insulating layer 142. The first horizontal power supply line HVDL may be connected to the fifth source electrode S5 and the thirteenth source electrode S13 through the second power contact hole VCT2 penetrating the gate insulating layer 130, the first interlayer insulating layer 141, and the second interlayer insulating layer 142. The gate-off voltage line VGHL may be connected to the eighth source electrode S8 through the seventh contact hole CT7 penetrating the gate insulating layer 130, the first interlayer insulating layer 141, and the second interlayer insulating layer 142. The test signal line TSTL may be connected to the nineteenth gate electrode G19 through the twenty-third contact hole CT23 penetrating the first interlayer insulating layer 141 and the second interlayer insulating layer 142. The third power supply line VSL may be connected to the nineteenth drain electrode D19 through the twenty-fourth contact hole CT24 penetrating the gate insulating layer 130, the first interlayer insulating layer 141, and the second interlayer insulating layer 142.

The first data connection electrode DCE1 may be connected to the second source electrode S2 through the first data contact hole DCT1 penetrating the gate insulating layer 130, the first interlayer insulating layer 141, and the second interlayer insulating layer 142. The second data connection electrode DCE2 may be connected to the ninth source electrode S9 through the third data contact hole DCT3 penetrating the gate insulating layer 130, the first interlayer insulating layer 141, and the second interlayer insulating layer 142.

The first connection electrode CCE1 may be connected to the first gate electrode G1 through the first contact hole CT1 penetrating the first interlayer insulating layer 141 and the second interlayer insulating layer 142, and may be connected to the first sub-source electrode S31 and the fourth sub-drain electrode D42 through the second contact hole CT2 penetrating the gate insulating layer 130, the first interlayer insulating layer 141, and the second interlayer insulating layer 142.

The second connection electrode CCE2 may be connected to the seventeenth drain electrode D17 through the third contact hole CT3 penetrating the gate insulating layer 130, the first interlayer insulating layer 141, and the second interlayer insulating layer 142, may be connected to the fourteenth drain electrode D14 through the fourth contact hole CT4 penetrating the gate insulating layer 130, the first interlayer insulating layer 141, and the second interlayer insulating layer 142, and may be connected to the fourth capacitor electrode CE4 through the fifteenth contact hole CT15 penetrating the second interlayer insulating layer 142.

The third connection electrode CCE3 may be connected to the nineteenth source electrode S19 through the twenty-first contact hole CT21 penetrating the gate insulating layer 130, the first interlayer insulating layer 141, and the second interlayer insulating layer 142.

The fourth connection electrode CCE4 may be connected to the sixth drain electrode D6 through the tenth contact hole CT10 penetrating the gate insulating layer 130, the first interlayer insulating layer 141, and the second interlayer insulating layer 142, and may be connected to the fourth gate connection electrode CCE4 through the seventeenth contact hole CT17 penetrating the first interlayer insulating layer 141 and the second interlayer insulating layer 142.

The fifth connection electrode CCE5 may be connected to the twelfth source electrode S12 and the fourteenth source electrode S14 through the eleventh contact holes CT11 penetrating the gate insulating layer 130, the first interlayer insulating layer 141, and the second interlayer insulating layer 142.

The sixth connection electrode CCE6 may be connected to the eighth gate electrode G8 through the twelfth contact hole CT12 penetrating the first interlayer insulating layer 141 and the second interlayer insulating layer 142, and may be connected to the fifth sub-source electrode S101 and the eighth sub-drain electrode D112 through the thirteenth contact hole CT13 penetrating the gate insulating layer 130, the first interlayer insulating layer 141, and the second interlayer insulating layer 142.

The seventh connection electrode CCE7 may be connected to the seventeenth drain electrode D17 and the eighteenth drain electrode D18 through the sixteenth contact holes CT16 penetrating the gate insulating layer 130, the first interlayer insulating layer 141, and the second interlayer insulating layer 142.

A first planarization layer 160 may be located on the first source metal layer. The first planarization layer 160 may be formed of an organic layer, such as acryl resin, epoxy resin, phenolic resin, polyamide resin, polyimide resin and the like. The first planarization layer 160 may be referred to as a fourth insulating layer.

A first inorganic insulating layer 161 may be located on the first planarization layer 160. The first inorganic insulating layer 161 may be formed of the inorganic layer, for example, the silicon nitride layer, the silicon oxynitride layer, the silicon oxide layer, the titanium oxide layer, or the aluminum oxide layer.

The second source metal layer may be located on the first inorganic insulating layer 161. The second source metal layer may include the $j^{th}$ data line DLj, the first vertical power supply line VVDL, and the first PAM data line RDL. Further, the second source metal layer may include the first pad connection electrode ANDE1 and the power connection electrode VDCE. The second source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The $j^{th}$ data line DLj may be connected to the first data connection electrode DCE1 through the second data contact hole DCT2 penetrating the first planarization layer 160 and the first inorganic insulating layer 161. The first PAM data line RDL may be connected to the second data connection electrode DCE2 through the fourth data contact hole DCT4 penetrating the first planarization layer 160 and the first inorganic insulating layer 161. The first vertical power supply line VVDL may be connected to the first horizontal power supply line HVDL through a third power contact hole VCT3 passing through the first planarization layer 160 and the first inorganic insulating layer 161. The third power contact hole VCT3 may overlap the second power contact hole VCT2 in the third direction DR3. The area of the third power contact hole VCT3 may be larger than the area of the second power contact hole VCT2.

The first pad connection electrode ANDE1 is connected to the seventh connection electrode CCE7 through the twentieth contact hole CT20 penetrating the first planarization layer 160 and the first inorganic insulating layer 161 and may be connected to the third connection electrode CCE3 through the twenty-second contact hole CT22 penetrating the first planarization layer 160 and the first inorganic insulating layer 161. The power connection electrode VDCE may be connected to the fifth connection electrode CCE5 through the fourth power contact hole VCT4 penetrating the first planarization layer 160 and the first inorganic insulating layer 161.

A second planarization layer 180 may be located on the second source metal layer. The second planarization layer 180 may be formed of the organic layer, such as acryl resin, epoxy resin, phenolic resin, polyamide resin, polyimide resin and the like. The second planarization layer 180 may be referred to as a fifth insulating layer.

A second inorganic insulating layer 181 may be located on the second planarization layer 180. The second inorganic insulating layer 181 may be formed of the inorganic layer, for example, the silicon nitride layer, the silicon oxynitride layer, the silicon oxide layer, the titanium oxide layer, or the aluminum oxide layer.

The third source metal layer may be located on the second inorganic insulating layer 181. The third source metal layer may include the first power supply line VDL1 and the second pad connection electrode ANDE2. The first power supply line VDL1 may be located to cover most of the area of the first sub-pixel RP. The first power supply line VDL1 may be connected to the power connection electrode VDCE through a fifth power contact hole VCT5 penetrating the second planarization layer 180 and the second inorganic insulating layer 181. The second pad connection electrode ANDE2 may be connected to the first pad connection electrode ANDE1 through the twenty-fifth contact hole CT25 penetrating the second planarization layer 180 and the second inorganic insulating layer 181. The third source metal layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

A third planarization layer 190 may be located on the third source metal layer. The third planarization layer 190 may be formed of the organic layer, such as acryl resin, epoxy resin, phenolic resin, polyamide resin, polyimide resin and the like. The third planarization layer 190 may be referred to as a sixth insulating layer.

A third inorganic insulating layer 191 may be located on the third planarization layer 190. The third inorganic insulating layer 191 may be formed of the inorganic layer, for example, the silicon nitride layer, the silicon oxynitride layer, the silicon oxide layer, the titanium oxide layer, or the aluminum oxide layer.

The fourth source metal layer may be located on the third inorganic insulating layer 191. The fourth source metal layer may include the second power supply line VSL, the first pad connection electrode APD1, and a fourth pad connection electrode CPD1. The second power supply line VSL may be connected to the fourth pad connection electrode CPD1. That is, the second power supply line VSL and the fourth pad connection electrode CPD1 may be integrally formed. The first pad connection electrode APD1 may be connected to the second pad connection electrode ANDE2 through the twenty-sixth contact hole CT26 penetrating the third planarization layer 190 and the third inorganic insulating layer 191. The fourth source metal layer may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

A transparent metal layer may be located on the fourth source metal layer. The transparent metal layer may include a first pad electrode CTE1 and a second pad electrode CTE2. A thickness of the first pad electrode CTE1 and a thickness of the second pad electrode CTE2 may be less than a thickness of the first pad connection electrode APD1 and a thickness of the fourth pad connection electrode CPD1.

The first pad electrode CTE1 may be located on the first pad connection electrode APD1, and the second pad electrode CTE2 may be located on the fourth pad connection electrode CPD1. The first pad electrode CTE1 may be electrically connected to a first electrode of a first light emitting element REL, and the second pad electrode CTE2 may be electrically connected to a second electrode of the first light emitting element REL. The transparent metal layer may be made of a transparent metal material (e.g., TCO, Transparent Conductive Material), such as ITO and IZO.

A fourth planarization layer 110 may be located on a portion of the first pad connection electrode APD1. The fourth planarization layer 110 might not be located on the first pad electrode CTE1 and the second pad electrode CTE2. That is, the first pad electrode CTE1 and the second pad electrode CTE2 may be exposed without being covered by the fourth planarization layer 110. A fourth planarization layer 110 may be formed of an organic film, such as acrylic resin, epoxy resin, phenolic resin, polyamide resin, polyimide resin, etc. The fourth planarization layer 110 may be referred to as an organic insulating layer.

A fourth inorganic insulating layer 111 may be located on the fourth planarization layer 110. The fourth inorganic insulating layer 111 might not be located on the edge of the first pad electrode CTE1 and the edge of the second pad electrode CTE2. Therefore, at least a portion of the first pad electrode CTE1 and at least a portion of the second pad electrode CTE2 may be exposed without being covered by the fourth inorganic insulating layer 111. The fourth inorganic insulating layer 111 may be formed of the inorganic layer, for example, the silicon nitride layer, the silicon oxynitride layer, the silicon oxide layer, the titanium oxide layer, or the aluminum oxide layer.

Figure 28:
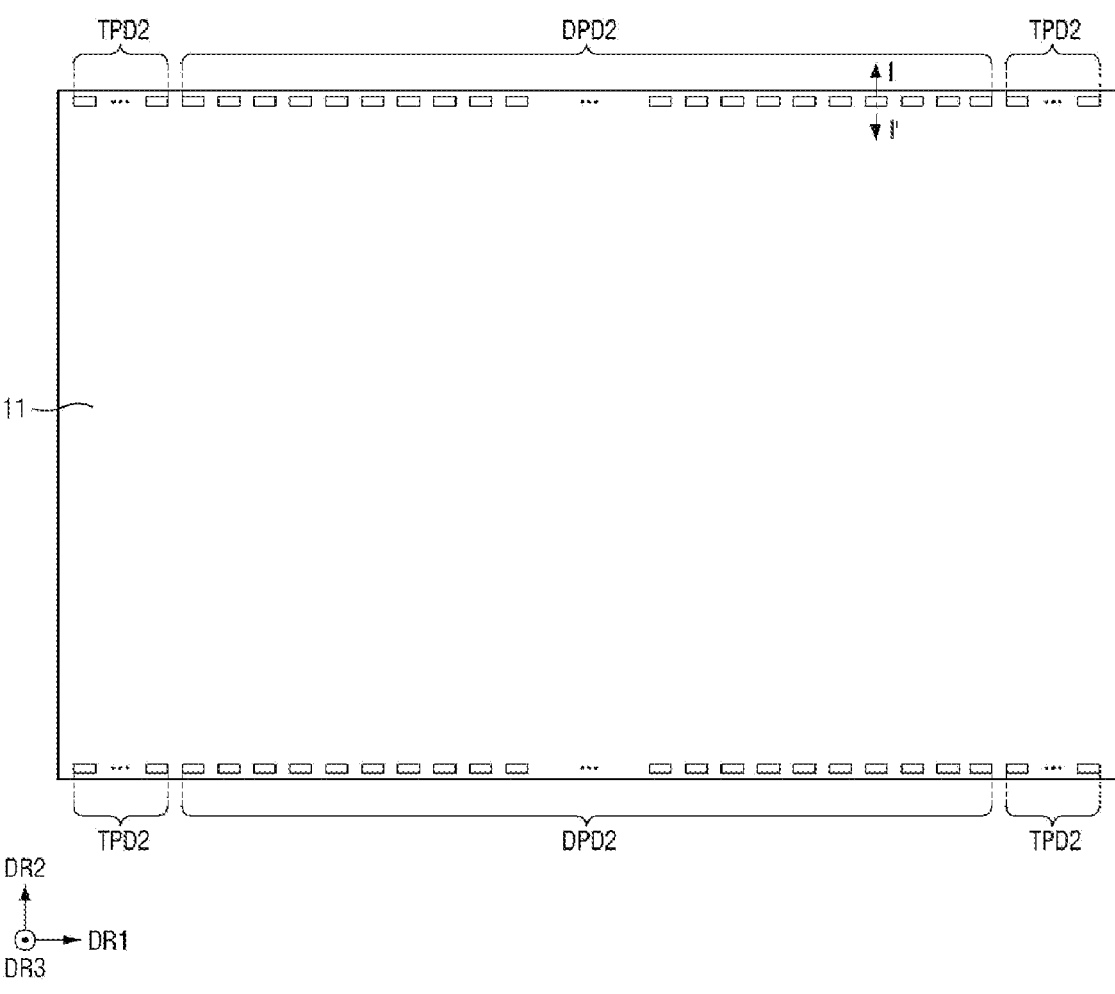
FIG. 28 is a view illustrating a bottom surface of a first display device according to one or more embodiments.

In FIG. 28, in one or more embodiments, a flip-chip type micro LED includes a first electrode AE1 of the first light emitting element REL facing a first contact electrode CTE1, and a second electrode CE of the first light emitting element REL facing a second contact electrode CTE2. The first light emitting element REL may be formed of an inorganic material, such as GaN. The length of the first light emitting element REL in the first direction DR1, the second direction DR2, and the third direction DR3 may be each about several to several hundred μm. For example, the length of the first light emitting element REL in the first direction DR1, the second direction DR2, and the third direction DR3 may each have a length of about 100 μm or less.

The first light emitting elements REL as well as the second light emitting elements and the third light emitting elements may be grown and formed on a semiconductor substrate, such as a silicon wafer. The light emitting elements may be directly transferred from the silicon wafer onto the anode pad electrodes APD1 and the cathode pad electrodes CPD1 of the substrate SUB. Alternatively, the light emitting elements may be transferred onto the anode pad electrodes APD1 and the cathode pad electrodes CPD1 of the substrate SUB through an electrostatic method using an electrostatic head or a stamp method using an elastic polymer material, such as PDMS or silicon as a transfer substrate.

The first light emitting element REL may be a light emitting structure including a base substrate SPUB, an n-type semiconductor NSEM, an active layer MQW, a p-type semiconductor PSEM, the first electrode AE1, and the second electrode CE.

The base substrate SPUB may be a sapphire substrate, but the present disclosure is not limited thereto.

The n-type semiconductor NSEM may be located on one surface of the base substrate SPUB. For example, the n-type semiconductor NSEM may be located on the lower surface of the base substrate SPUB. The n-type semiconductor NSEM may be made of GaN doped with an n-type conductivity-type dopant, such as Si, Ge, or Sn.

The active layer MQW may be located on a portion of one surface of the n-type semiconductor NSEM. The active layer may include a material having a single or multiple quantum well structure. When the active layer contains a material having a multiple quantum well structure, the active layer may have the structure in which a plurality of well layers and barrier layers are alternately laminated. In this case, the well layer may be formed of InGaN, and the barrier layer may be formed of GaN or AlGaN, but is not limited thereto. Alternatively, the active layer may have a structure in which semiconductor materials having large band gap energy and semiconductor materials having small band gap energy are alternately stacked, and may include other Group III to Group V semiconductor materials according to a wavelength band of the emitted light.

The p-type semiconductor PSEM may be located on one surface of the active layer MQW. The p-type semiconductor PSEM may be made of GaN doped with a p-type conductivity-type dopant, such as Mg, Zn, Ca, Se, or Ba.

The first electrode AE1 may be located on the p-type semiconductor PSEM, and the second electrode CE may be located on another portion of one surface of the n-type semiconductor NSEM. Another portion of one surface of the n-type semiconductor NSEM on which the second electrode CE is located may be located apart from a portion of one surface of the n-type semiconductor NSEM on which the active layer MQW is located.

The first electrode AE1 may be adhered to the second pad electrode CTE2 through a conductive adhesive member, such as an anisotropic conductive film ACF or an anisotropic conductive paste ACP. Alternatively, the first electrode AE1 may be adhered to the first pad electrode CTE1 through a soldering process.

The second electrode CE may be adhered to the first pad electrode CTE1 through the conductive adhesive member, such as the anisotropic conductive film ACF or the anisotropic conductive paste ACP. Alternatively, the second electrode CE may be adhered to the second pad electrode CTE2 through the soldering process.

Figure 12:
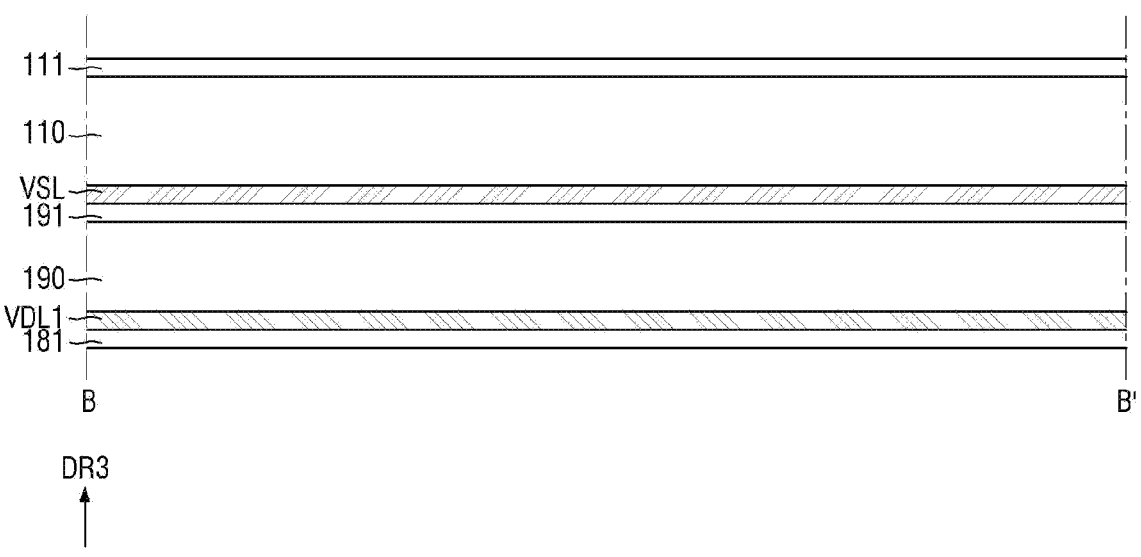
FIG. 12 is a cross-sectional view illustrating an example of the first sub-pixel taken along the line B-B' of FIGS. 5 and 6.

FIG. 12 is a cross-sectional view illustrating an example of the first sub-pixel taken along the line B-B' of FIGS. 5 and 6.

In FIG. 12, components located under the second inorganic insulating layer 181 are omitted for convenience of description.

Referring to FIG. 12, the second power supply line VSL is located on a large area to overlap the first to nineteenth transistors T1 to T19, and thus may serve as the reflective electrode that reflects light incident from the outside. Therefore, the display device according to one or more embodiments may be implemented as the reflective display device in which the user can see the object or background reflected from the display device by reflecting the light incident through the second power supply line VSL.

The fourth planarization layer 110 may be located on the second power supply line VSL. Even when the fourth planarization layer 110 may be made of the organic insulating layer that transmits light, the light transmittance of the fourth planarization layer 110 may be about ninety percent or less. Therefore, a ratio of light reflected by the second power supply line VSL may be reduced.

Figure 13:
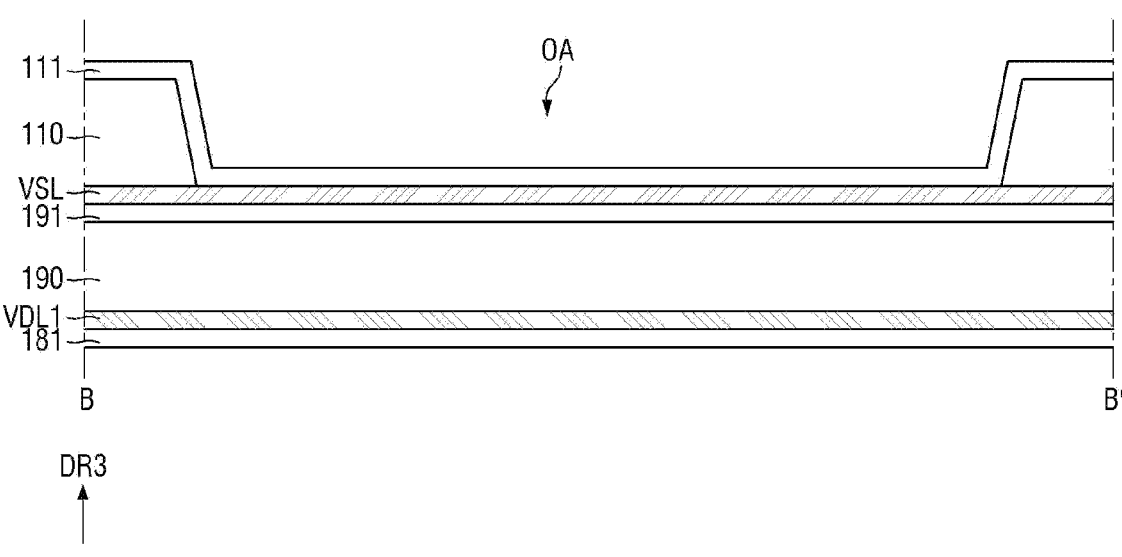
FIG. 13 is a cross-sectional view illustrating an example of the first sub-pixel taken along the line B-B' of FIGS. 5 and 6.

FIG. 13 is a cross-sectional view illustrating an example of the first sub-pixel taken along the line B-B' of FIGS. 5 and 6.

In FIG. 13, components located under the second inorganic insulating layer 181 are omitted for convenience of description.

Referring to FIGS. 6 and 13, an opening area OA passing through the fourth planarization layer 110 may be formed in most of the second power supply line VSL. That is, most of the second power supply line VSL may be exposed without being covered by the fourth planarization layer 110. In summary, because the fourth planarization layer 110 is not located in the opening area OA, a ratio of light reflected by the second power supply line VSL may be increased.

Also, the fourth inorganic insulating layer 111 may be located on the second power supply line VSL in the opening area OA. Accordingly, insulation between the second power supply line VSL and a structure located on the second power supply line VSL may be maintained. The opening area OA may overlap the first to nineteenth transistors T1 to T19 of the first sub-pixel RP.

In summary, by removing the fourth planarization layer 110 from the opening area OA, the ratio of light reflected by the second power supply line VSL may be increased.

Figure 14:
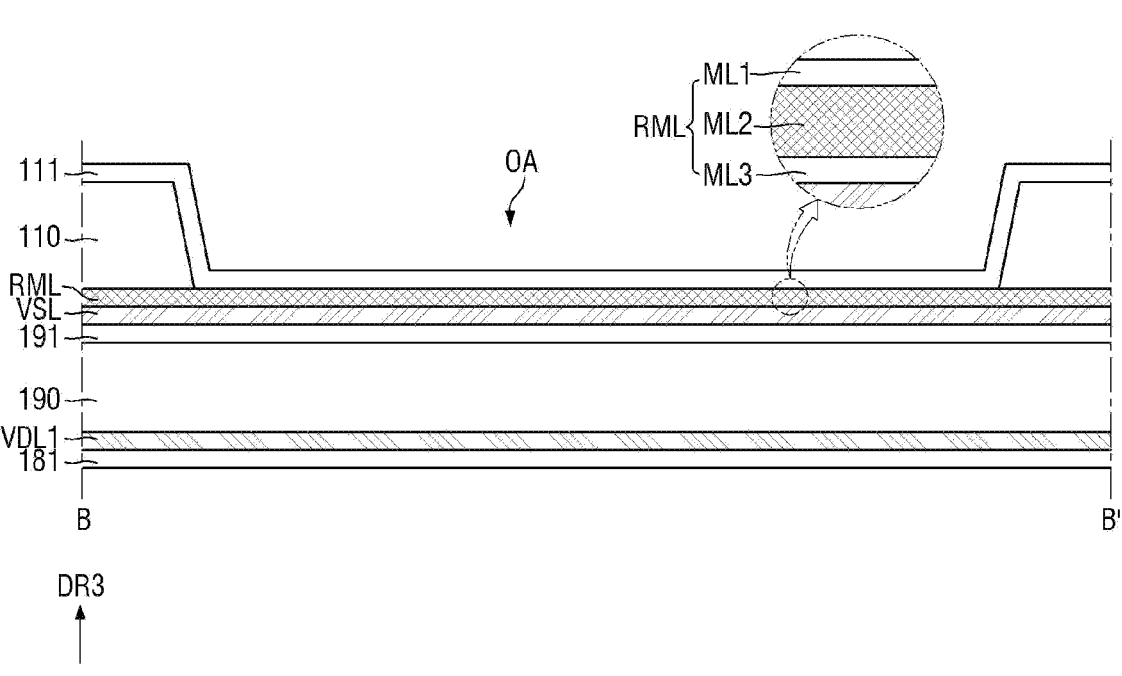
FIG. 14 is a cross-sectional view illustrating an example of the first sub-pixel taken along the line B-B' of FIGS. 5 and 6.

FIG. 14 is a cross-sectional view illustrating an example of the first sub-pixel taken along the line B-B' of FIGS. 5 and 6.

In FIG. 14, components located under the second inorganic insulating layer 181 are omitted for convenience of description.

The one or more embodiments corresponding to FIG. 14 is different from the one or more embodiments corresponding to FIG. 13 in that a reflective electrode RML for increasing reflectivity is added on the second power supply line VSL located in the opening area OA. In FIG. 14, a repeated description overlapping with the one or more embodiments corresponding to FIG. 13 will be omitted.

Referring to FIG. 14, the reflective electrode RML may include first to third electrode layers ML1 to ML3. A first electrode layer ML1 may be located on the second power supply line VSL, a second electrode layer ML2 may be located on the first electrode layer ML1, and a third electrode layer ML3 may be located on the second electrode layer ML2.

The first electrode layer ML1 and the third electrode layer ML3 may be made of the transparent metal material, such as ITO or IZO. The second electrode layer ML2 may be made of a metal material having high reflectance, such as silver (Ag). The thickness of the second electrode layer ML2 may be greater than the thickness of the first electrode layer ML1 and the thickness of the third electrode layer ML3. For example, the reflective electrode RML may be formed of ITO/Ag/ITO, IZO/Ag/IZO, ITO/Ag/IZO, IZO/Ag/ITO, or the like.

In summary, because the fourth planarization layer 110 is not located in the opening area OA and a reflective electrode having high reflectivity is located in the opening area OA, a ratio of light reflected by the second power supply line VSL may be increased.

Figure 15:
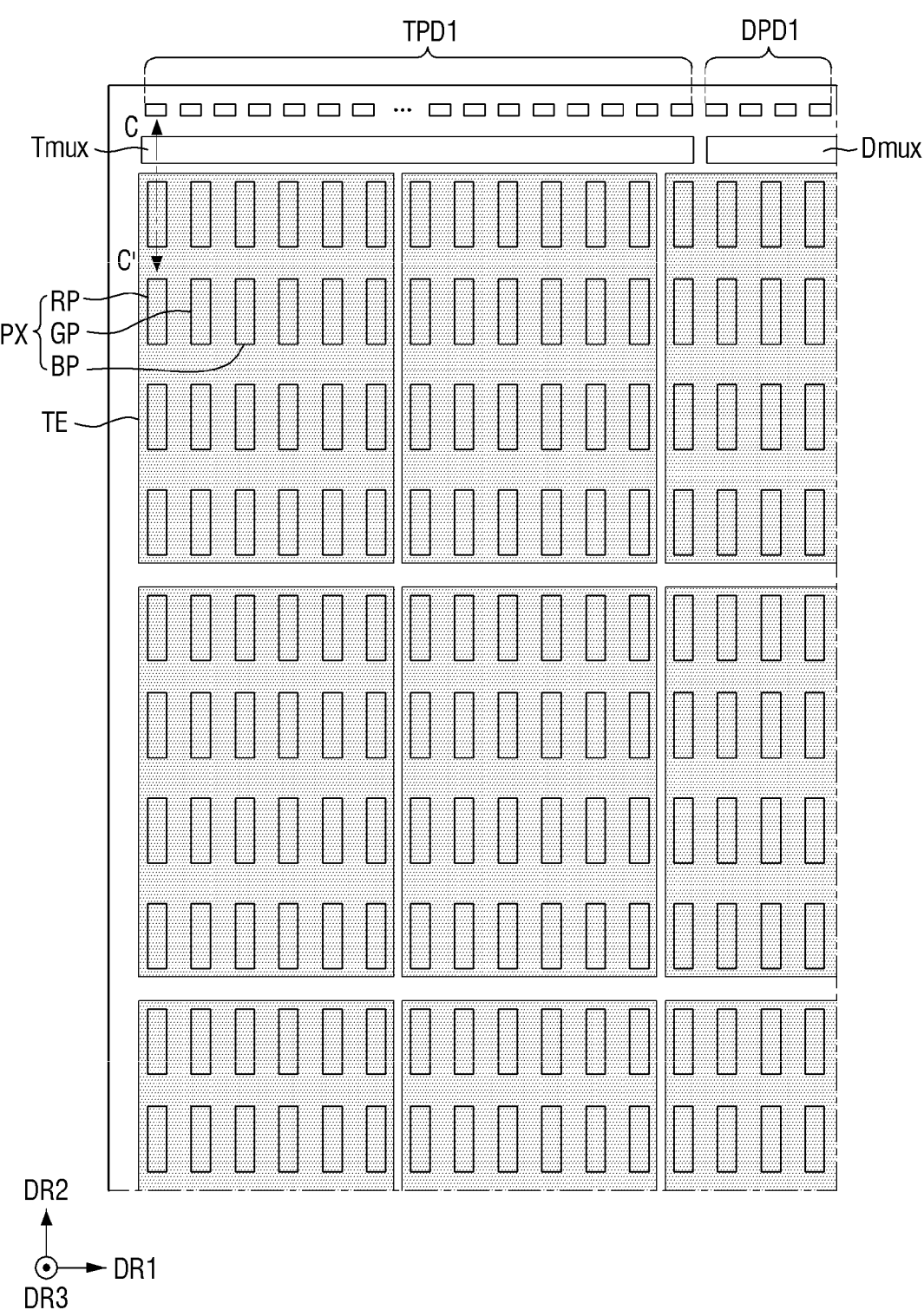
FIG. 15 is a layout diagram illustrating pixels and touch electrodes of a display panel according to one or more embodiments.

FIG. 15 is a layout diagram illustrating pixels and touch electrodes of a display panel according to one or more embodiments.

Referring to FIG. 15, the display panel 100 includes not only pixels PX, but also first touch pads TPD1, first display pads DPD1, touch electrodes TE, and a touch multiplexer Tmux, and a display multiplexer Dmux.

The first touch pads TPD1 and the first display pads DPD1 may be located on one edge of the display panel 100. The first touch pads TPD1 may be located closer to the edge of the display panel 100 than the first display pads DPD1. When the first touch pads TPD1 and the first display pads DPD1 are located on the upper edge of the display panel 100, the first touch pads TPD1 and the first display pads DPD1 may be arranged in the first direction DR1.

Each of the touch electrodes TE may be located on S (S is a positive integer) number of pixels PX. Each of the touch electrodes TE may be located to overlap the S pixels PX. The touch electrodes TE may have the same area as each other.

The touch electrodes TE may be located apart from each other and may be electrically separated from each other. Although the touch electrodes TE have been exemplified to have a rectangular planar shape, the present disclosure is not limited thereto.

Meanwhile, in FIG. 15, it was exemplified that the touch electrodes TE sense a touch in a self-capacitance method. In the self-capacitance method, a user's touch may be sensed by applying a touch driving signal having a plurality of pulses to the touch electrodes TE and then sensing a change in self-capacitance of the touch electrodes TE.

Alternatively, the touch electrodes TE may sense a touch using a mutual capacitance method. In this case, the driving electrodes that are the touch electrodes TE arranged in the first direction DR1 are connected to each other, and the sensing electrodes that are the touch electrodes TE arranged in the second direction DR2 are connected to each other. Furthermore, the driving electrodes and the sensing electrodes are located apart from each other and electrically isolated from each other, so that mutual capacitance may be formed at the intersection of the driving electrode and the sensing electrode.

The touch multiplexer Tmux may be located between the first touch pads TPD1 and the touch electrodes TE. The touch multiplexer Tmux may be connected the first touch pads TPD1 and the touch electrodes TE by 1:P (P is an integer greater than or equal to 2). Due to the touch multiplexer Tmux, the number of the first touch pads TPD1 may be reduced.

The display multiplexer Dmux may be located between the first display pads DPD1 and the pixels PX. The display multiplexer Dmux may be connected the first display pads DPD1 and the pixels PX by 1:Q (Q is an integer greater than or equal to 2). Due to the display multiplexer Dmux, the number of the first display pads DPD1 may be reduced.

In summary, because the display panel 100 includes the touch electrodes TE, a user's touch may be sensed using a self-capacitance method or the mutual capacitance method.

Figure 16:
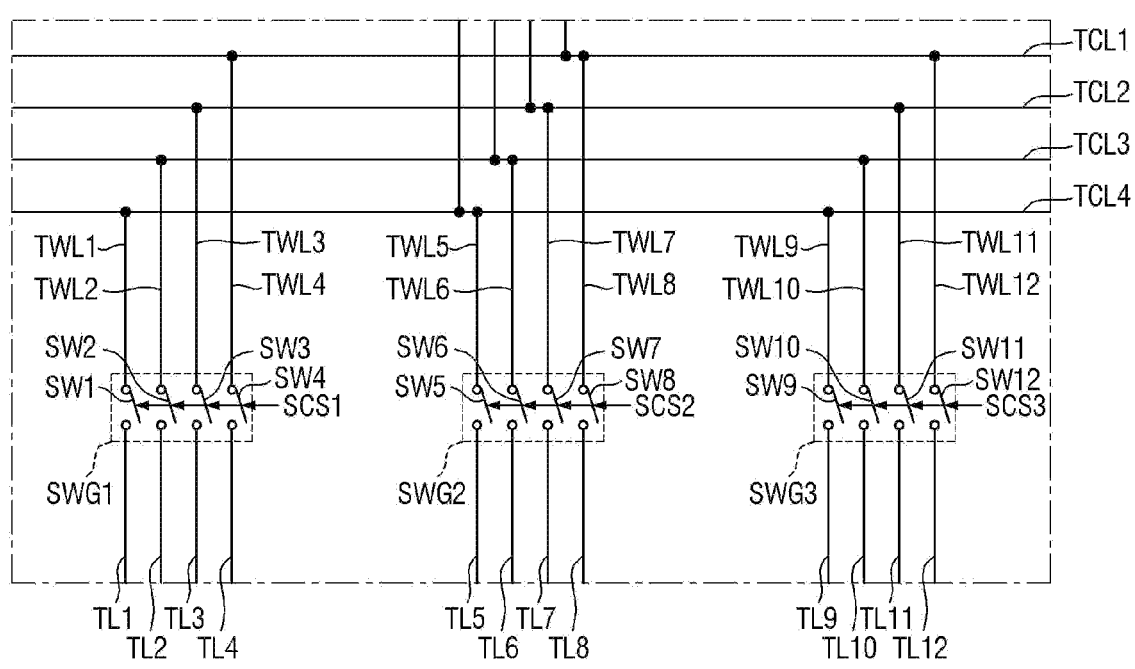
FIG. 16 is a diagram illustrating an example of the touch multiplexer of FIG. 15.

FIG. 16 is a diagram illustrating an example of the touch multiplexer of FIG. 15.

Referring to FIG. 16, the touch multiplexer Tmux includes touch pad lines, touch connection lines TCL1, TCL2, TCL3, and TCL4, touch switch lines TWL1 to TWL12, and touch lines TL1 to TL12. Also, the touch multiplexer Tmux includes a first switch group SWG1, a second switch group SWG2, and a third switch group SWG3. In FIG. 16, it was illustrated that the touch multiplexer Tmux connects the touch pads TPD1 and the touch lines TL1 to TL12 (or the touch electrodes TE) in a 1:3 ratio, but the present disclosure is not limited thereto.

The touch pad lines may extend in the second direction DR2. The touch pad lines may be one-to-one connected to the first touch pads TPD1 and the touch connection lines TCL1, TCL2, TCL3, and TCL4. That is, the touch pad lines may be respectively connected to the first touch pads TPD1 and the touch connection lines TCL1, TCL2, TCL3 and TCL4.

The touch connection lines TCL1, TCL2, TCL3, and TCL4 may extend in the first direction DR1. The touch connection lines TCL1, TCL2, TCL3, and TCL4 may be connected to the touch switch lines TWL1 to TWL12. A first touch connection line TCL1 may be connected to a $4k{-}3^{th}$ (k is a positive integer) touch switch line (e.g., to a first touch switch line TWL1, a fifth touch switch line TWL5, and a ninth touch switch line TWL9). A third touch connection line TCL2 may be connected to a $4k{-}2^{th}$ touch switch line (e.g., to a second touch switch line TWL2, a sixth touch switch line TWL6, and a tenth touch switch line TWL10). A second touch connection line TCL2 may be connected to a $4k{-}1^{th}$ touch switch line (e.g., to a third touch switch line TWL3, a seventh touch switch line TWL7, and an eleventh touch switch line TWL11). A first touch connection line TCL1 may be connected to the $4k$ touch switch line (e.g., to a fourth touch switch line TWL4, an eighth touch switch line TWL8, and a twelfth touch switch line TWL12).

A first switch group SWG1 may be connected the first to fourth touch lines TL1 to TL4 to the first to fourth touch pad lines through a first switch control signal SCS1. Accordingly, the touch electrodes TE connected to the first to fourth touch lines TL1 to TL4 may be connected to the first to fourth touch pad lines through the first switch group SWG1.

The first switch group SWG1 may include first to fourth switches SW1 to SW4. A first switch SW1 may be located between a first touch line TL1 and the first touch switch line TWL1. A second switch SW2 may be located between a second touch line TL2 and the second touch switch line TWL2. A third switch SW3 may be located between a third touch line TL3 and a third touch switch line TWL3. A fourth switch SW4 may be located between aa fourth touch line TL4 and a fourth touch switch line TWL4.

The second switch group SWG2 may connect the fifth to eighth touch lines TL5 to TL8 to the fifth to eighth touch pad lines through a second switch control signal SCS2. Accordingly, the touch electrodes TE connected to the fifth to eighth touch lines TL5 to TL8 may be connected to the fifth to eighth touch pad lines through the second switch group SWG2.

The second switch group SWG2 may include fifth to eighth switches SW5 to SW8. A fifth switch SW5 may be located between a fifth touch line TL5 and the fifth touch switch line TWL5. A sixth switch SW6 may be located between a sixth touch line TL6 and the sixth touch switch line TWL6. A seventh switch SW7 may be located between a seventh touch line TL7 and the seventh touch switch line TWL7. An eighth switch SW8 may be located between an eighth touch line TL8 and the eighth touch switch line TWL8.

The third switch group SWG3 may be connected the ninth to twelfth touch lines TL9 to TL12 to the ninth to twelfth touch pad lines through a third switch control signal SCS3. Accordingly, the touch electrodes TE connected to the ninth to twelfth touch lines TL9 to TL12 may be connected to the ninth to twelfth touch pad lines through the third switch group SWG3.

The third switch group SWG3 may include ninth to twelfth switches SW9 to SW12. A ninth switch SW9 may be located between a ninth touch line TL9 and the ninth touch switch line TWL9. A tenth switch SW10 may be located between a tenth touch line TL10 and the tenth touch switch line TWL10. An eleventh switch SW11 may be located between an eleventh touch line TL11 and the eleventh touch switch line TWL11. A twelfth switch SW12 may be located between a twelfth touch line TL12 and the twelfth touch switch line TWL12.

A period in which the first to fourth switches SW1 to SW4 of the first switch group SWG1 are turned-on through the first switch control signal SCS1, the fifth to eighth switches SW5 to SW8 of the second switch group SWG2 are turned-on through the second switch control signal SCS2, and the ninth to twelfth switches SW9 to SW12 of the third switch group SWG3 are turned-on through the third switch control signal SCS3 may be different from each other. For this reason, the touch pad lines may be connected to the first to fourth touch lines TL1 to TL4 through the first switch group SWG1, may be connected to the fifth to eighth touch lines TL5 to TL8 through the second switch group SWG2, and may be connected to the ninth to twelfth touch lines TL9 to TL12 through the third switch group SWG3. Therefore, the touch pad lines may be sequentially connected to the first to fourth touch lines TL1 to TL4, the fifth to eighth touch lines TL5 to TL8, and the ninth to twelfth touch lines TL9 to TL12 through the first to third switch groups SWG1, SWG2, and SWG3. That is, the touch multiplexer Tmux may connect the touch pads TPD1 and the touch lines TL1 to TL12 in a 1:3 ratio.

Meanwhile, because the display multiplexer Dmux may be implemented similarly to the touch multiplexer Tmux described with reference to FIG. 16, a detailed description of the display multiplexer Dmux will be omitted.

Figure 17:
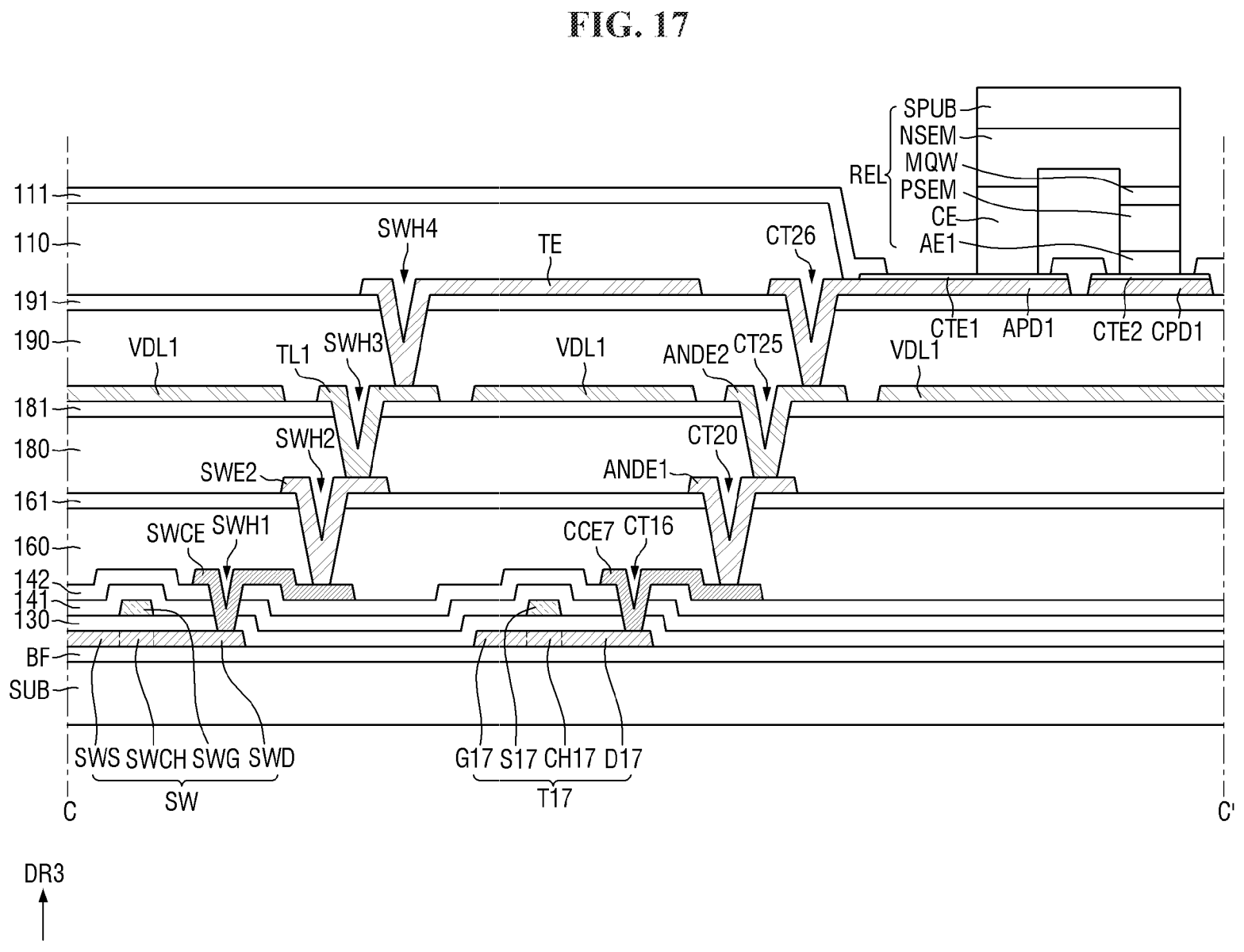

FIG. 17 is a cross-sectional view illustrating an example of the display panel taken along the line C-C' of FIG. 15.

In FIG. 17, the seventeenth transistor T17 of a first sub-pixel RP1 and a first switch transistor SW1 of the touch multiplexer Tmux are illustrated for convenience of description.

Referring to FIG. 17, the first switch SW1 may be formed of a thin film transistor including a switch gate electrode SWG, a switch channel SWCH, a switch source electrode SWS, and a switch drain electrode SWD.

The active layer may further include the switch channel SWCH, the switch source electrode SWS, and the switch drain electrode SWD of the first switch SW1. Because the second to twelfth switches SW2 to SW12 are substantially the same as the first switch SW1 illustrated in FIG. 17, a description of the second to twelfth switches SW2 to SW12 will be omitted.

The switch channel SWCH of the first switch SW1 may overlap the switch gate electrode SWG. The switch source electrode SWS and the switch drain electrode SWD of the first switch SW1 might not overlap the switch gate electrode SWG (e.g., may be separated from the switch gate electrode SWG in plan view). The switch source electrode SWS and the switch drain electrode SWD of the first switch SW1 may be an area having conductivity by doping ions in a silicon semiconductor or an oxide semiconductor. The switch source electrode SWS may be electrically connected to a first touch switch line TWL1, and a switch drain electrode SWD may be electrically connected to the first touch line TL1.

The first gate metal layer may further include the switch gate electrode SWG of the first switch SW1. The switch gate electrode SWG of the first switch SW1 may be electrically connected to a first switch control line to which the first switch control signal SCS1 is applied.

The first source metal layer may further include a first switch connection electrode SWCE1. The first switch connection electrode SWCE1 may be connected to the switch drain electrode SWD through a first switch connection contact hole SWH1 penetrating the gate insulating layer 130, the first interlayer insulating layer 141, and the second interlayer insulating layer 142.

The second source metal layer may further include a second switch connection electrode SWE2. The second switch connection electrode SWE2 may be connected to the first switch connection electrode SWCE1 through a second switch connection contact hole SWH2 penetrating the first planarization layer 160 and the first inorganic insulating layer 161.

The third source metal layer may further include the first touch line TL1. The first touch line TL1 may be connected to the second switch connection electrode SWE2 through a third switch connection contact hole SWH3 penetrating the second planarization layer 180 and the second inorganic insulating layer 181. The first touch line TL1 may be located apart from the first power supply line VDL1 and may be electrically separated from each other.

The fourth source metal layer may further include a touch electrode TE. The touch electrode TE may be connected to the first touch line TL1 through a fourth switch connection contact hole SWH4 penetrating the third planarization layer 190 and the third inorganic insulating layer 191. The touch electrode TE may be located apart from the first pad connection electrode APD1 and may be electrically separated from each other. The touch electrode TE may be connected to the fourth pad connection electrode CPD1 overlapping the touch electrode TE. That is, the touch electrode TE and the fourth pad connection electrode CPD1 overlapping the touch electrode TE may be integrally formed.

In summary, because the touch electrode TE is included in the fourth source metal layer, the touch electrode TE may be formed without adding a separate metal layer. Therefore, manufacturing cost might not be added due to the touch electrode TE.

Furthermore, because the touch electrode TE and the fourth pad connection electrode CPD1 overlapping the touch electrode TE are connected to each other the second power voltage is applied to the touch electrode TE and the fourth pad connection electrode CPD1 overlapping the touch electrode TE during the display period in which the first light emitting element REL emits light. Also, the touch driving signal having a plurality of touch pulses may be applied to the touch electrode TE and the fourth pad connection electrode CPD1 overlapping therewith during a touch period for sensing a user's touch. In this case, an initialization voltage (e.g., predetermined initialization voltage) that is lower than the minimum level voltage of the touch driving signal may be applied to the first pad connection electrode APD1 to reduce or prevent the likelihood of the first light emitting element REL erroneously emitting light during the touch period.

Figure 18:
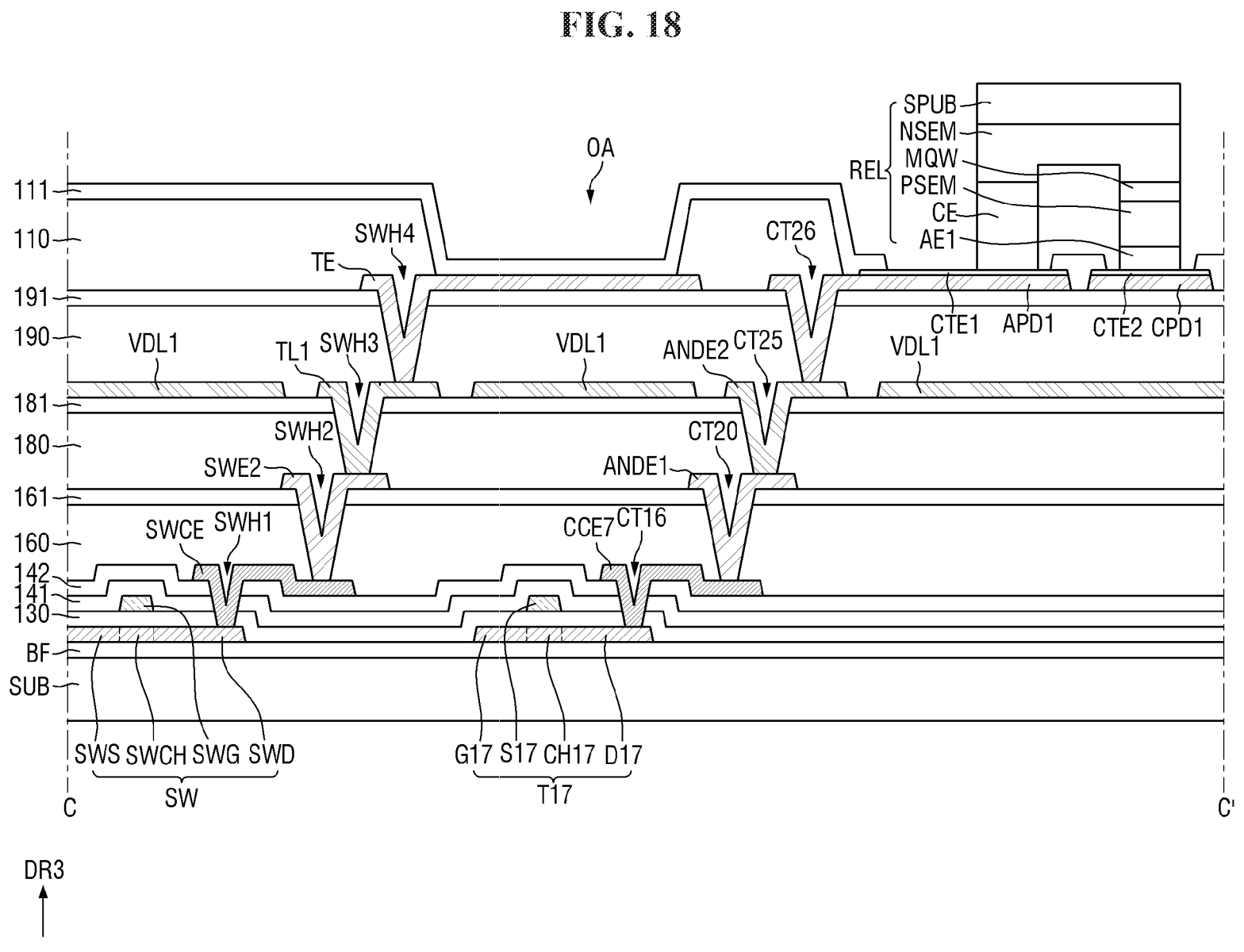

FIG. 18 is a cross-sectional view illustrating an example of the display panel taken along the line C-C' of FIG. 15.

The one or more embodiments corresponding to FIG. 18 is different from the one or more embodiments corresponding to FIG. 17 in that the opening area OA passing through the fourth planarization layer 110 is formed. In FIG. 18, a repeated description overlapping with the one or more embodiments corresponding to FIG. 17 will be omitted.

Referring to FIG. 18, the opening area OA passing through the fourth planarization layer 110 may be formed in most of the touch electrode TE. That is, most of the touch electrode TE may be exposed without being covered by the fourth planarization layer 110. In summary, because the fourth planarization layer 110 is not located in the opening area OA, a ratio of light reflected by the touch electrode TE may increase.

The fourth inorganic insulating layer 111 may be located on the touch electrode TE in the opening area OA. Accordingly, insulation between the touch electrode TE and a structure located on the touch electrode TE may be maintained. The opening area OA may overlap the first to nineteenth transistors T1 to T19 of the first sub-pixel RP.

In summary, by removing the fourth planarization layer 110 from the opening area OA, the ratio of light reflected by the touch electrode TE may be increased. Therefore, the display device according to one or more embodiments may be implemented as a reflective display device in which the user can see the object or background reflected from the display device by reflecting the light incident by the touch electrode TE.

Figure 19:
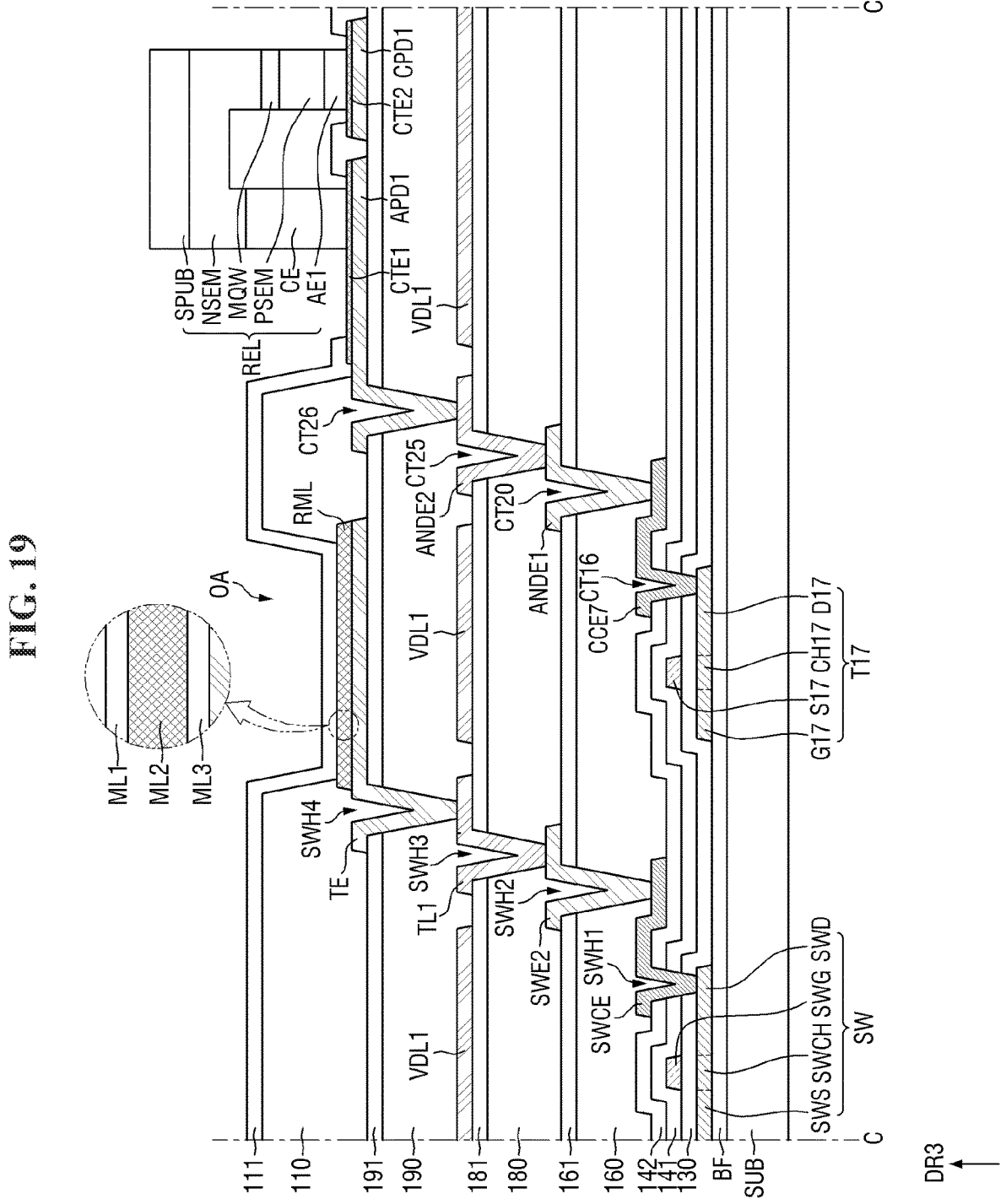
FIG. 19 is a cross-sectional view illustrating an example of the display panel taken along the line C-C' of FIG. 15.

FIG. 19 is a cross-sectional view illustrating an example of the display panel taken along the line C-C' of FIG. 15.

The one or more embodiments corresponding to FIG. 19 is different from the one or more embodiments corresponding to FIG. 17 in that the reflective electrode RML for increasing reflectivity is added on the touch electrode TE located in the opening area OA. In FIG. 19, a repeated description overlapping with the one or more embodiments corresponding to FIG. 17 will be omitted.

Referring to FIG. 19, the reflective electrode RML may include first to third electrode layers ML1 to ML3. The first electrode layer ML1 may be located on the second power supply line VSL, the second electrode layer ML2 is located on the first electrode layer ML1, and the third electrode layer ML3 is located on the second electrode layer ML2.

The first electrode layer ML1 and the third electrode layer ML3 may be made of the transparent metal material, such as ITO or IZO. The second electrode layer ML2 may be made of a metal material having high reflectance, such as silver (Ag). The thickness of the second electrode layer ML2 may be greater than the thickness of the first electrode layer ML1 and the thickness of the third electrode layer ML3. For example, the reflective electrode RML may be formed of ITO/Ag/ITO, IZO/Ag/IZO, ITO/Ag/IZO, IZO/Ag/ITO, or the like.

In summary, because the fourth planarization layer 110 is not located in the opening area OA and a reflective electrode having high reflectivity is located, a ratio of light reflected by the touch electrode TE may be increased.

Figure 20:
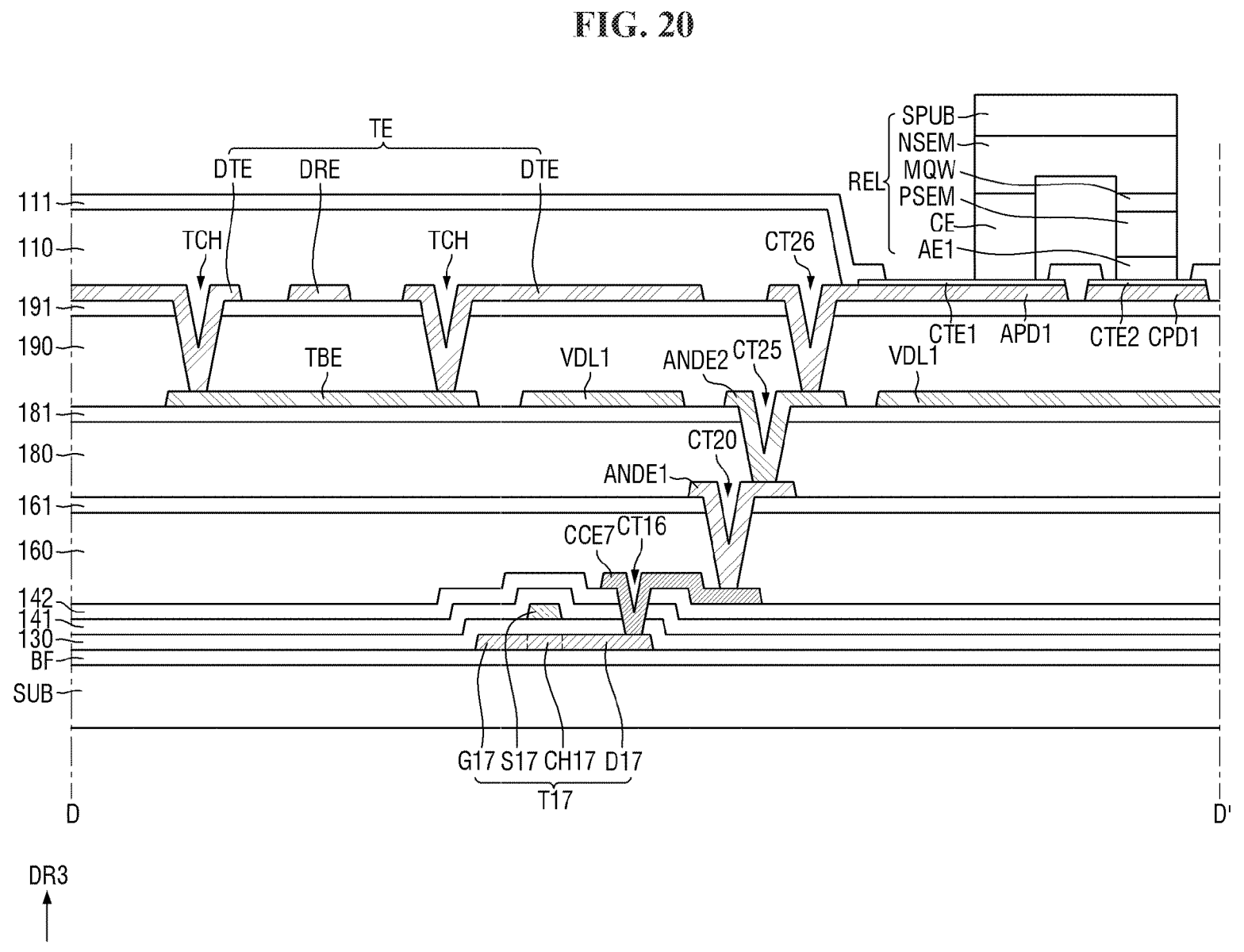

FIG. 20 is a cross-sectional view illustrating mutual capacitance type touch electrodes according to one or more embodiments.

Referring to FIG. 20, in the case of the mutual capacitance method, the touch electrode TE includes two types of touch electrodes, for example, driving electrodes DTE and sensing electrodes DTE.

The third source metal layer further includes a touch bridge electrode TBE, and the fourth source metal layer further includes driving electrodes DTE and sensing electrodes DTE. The driving electrodes DTE and the sensing electrodes DTE may be located apart from each other and may be electrically separated from each other. Each of the driving electrodes DTE may be connected to the touch bridge electrode TBE through a touch contact hole TCH passing through a third planarization layer 190 and a third inorganic insulating layer 191. The touch bridge electrode TBE may overlap a sensing electrode TRE in the third direction DR3.

As shown in FIG. 20, the driving electrodes DTE and a sensing electrodes DRE are located apart from each other and electrically separated from each other, so that a user's touch may be sensed by sensing a change in mutual capacitance formed at intersections of the driving electrodes DTE and the sensing electrodes DRE.

Figure 21:
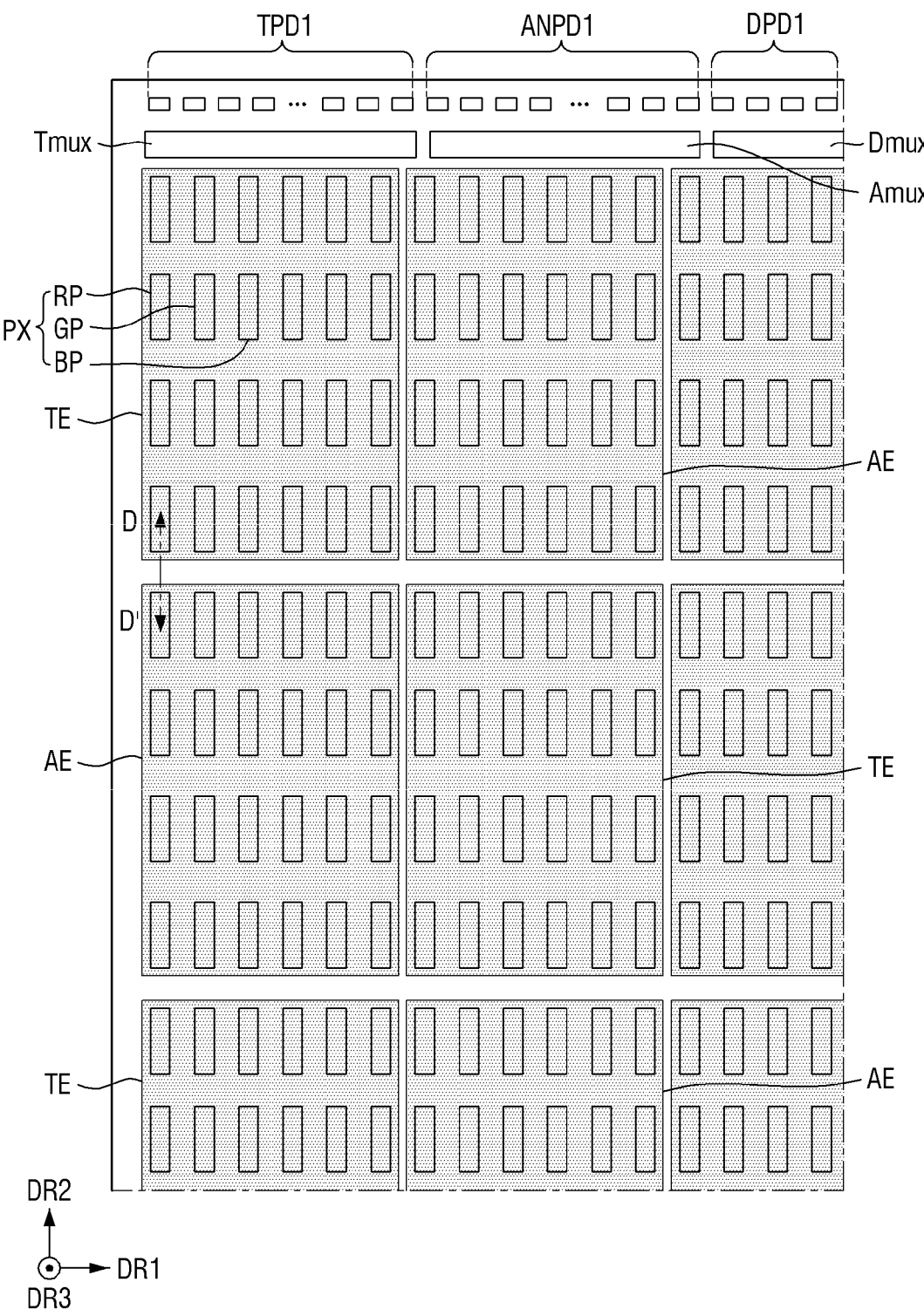
FIG. 21 is a layout diagram illustrating pixels of a display panel and a second power supply line according to one or more embodiments.

FIG. 21 is a layout diagram illustrating pixels of a display panel and a second power supply line according to one or more embodiments.

The one or more embodiments corresponding to FIG. 21 is different from the one or more embodiments corresponding to FIG. 15 in that the display panel 100 further includes antenna electrodes AE, first antenna pads ANPD1, and an antenna multiplexer Amux. In FIG. 21, a repeated description overlapping with the one or more embodiments corresponding to FIG. 15 will be omitted.

Referring to FIG. 21, the first antenna pads ANPD1 may be located on one edge of the display panel 100. The first antenna pads ANPD1 may be located between the first touch pads TPD1 and the first display pads DPD1 in the first direction DR1. The first antenna pads ANPD1 may be located closer to the edge of the display panel 100 than the first display pads DPD1, and the first touch pads TPD1 are closer to the display panel 100 than the first antenna pads ANPD1. When the first touch pads TPD1, the first antenna pads ANPD1, and the first display pads DPD1 are located on the upper edge of the display panel 100, the first touch pads TPD1, the first antenna pads ANPD1 and the first display pads DPD1 may be arranged in the first direction DR1.

Each of the antenna electrodes AE may be located on T (T is a positive integer) pixels PX. Each of the antenna electrodes AE may be located to overlap the T pixels PX. The antenna electrodes AE may have the same area as each other.

The antenna electrodes AE and the touch electrodes TE may be located apart from each other and may be electrically separated from each other. Although it has been exemplified that the antenna electrodes AE and the touch electrodes TE have a rectangular planar shape, the present disclosure is not limited thereto.

The antenna electrodes AE may transmit and receive electromagnetic waves having a frequency of about several to several hundred GHz corresponding to 5G communication. To this end, a length in the first direction DR1 and a length in the second direction DR2 of each of the antenna electrodes AE may be about 1 mm to about 5 mm, respectively. The length of each of the antenna electrodes AE in the first direction DR1 and the length of the second direction DR2 may vary depending on a frequency band for transmission and reception and the type of antenna. For example, When each of the antenna electrodes AE is designed as a dipole antenna that transmits and receives electromagnetic waves having a frequency of about 30 GHz, a length of each of the antenna electrodes AE in the first direction DR1 or in the second direction DR2 may be about 5 mm, which corresponds to a half wavelength of an electromagnetic wave. Because the wavelength of electromagnetic waves is about 10 mm. In contrast, when each of the antenna electrodes AE transmits and receives an electromagnetic wave having a frequency of about 30 GHz and is designed as a patch antenna, the length of each of the sensor electrodes SE in the first direction DR1 or the second direction DR2 may have a length of about 2.5 mm, which corresponds to a quarter wavelength of electromagnetic waves. Each of the antenna electrodes AE may have a rectangular, square, or circular planar shape.

That is, an area of each of the antenna electrodes AE is determined to transmit and receive electromagnetic waves of a specific frequency band, whereas an area of each of the touch electrodes TE is determined in consideration of a user's touch area and the like. Accordingly, the area of each of the antenna electrodes AE may be different from the area of each of the touch electrodes TE.

The antenna multiplexer Amux may be located between the first antenna pads ANPD1 and the antenna electrodes AE. The antenna multiplexer Amux may be connected to the first antenna pads ANPD1 and the antenna electrodes AE by 1:R (R is an integer greater than or equal to 2). Due to the antenna multiplexer Amux, the number of the first antenna pads ANPD1 may be reduced. Because the antenna multiplexer Amux may be implemented similarly to the touch multiplexer Tmux described with reference to FIG. 16, a detailed description of the antenna multiplexer Amux will be omitted.

Meanwhile, in FIG. 21, the touch electrodes TE, the first touch pads TPD1, and the touch multiplexer Tmux may be omitted. In this case, the antenna electrodes AE may be located in the area where the touch electrodes TE may be omitted.

Figure 22:
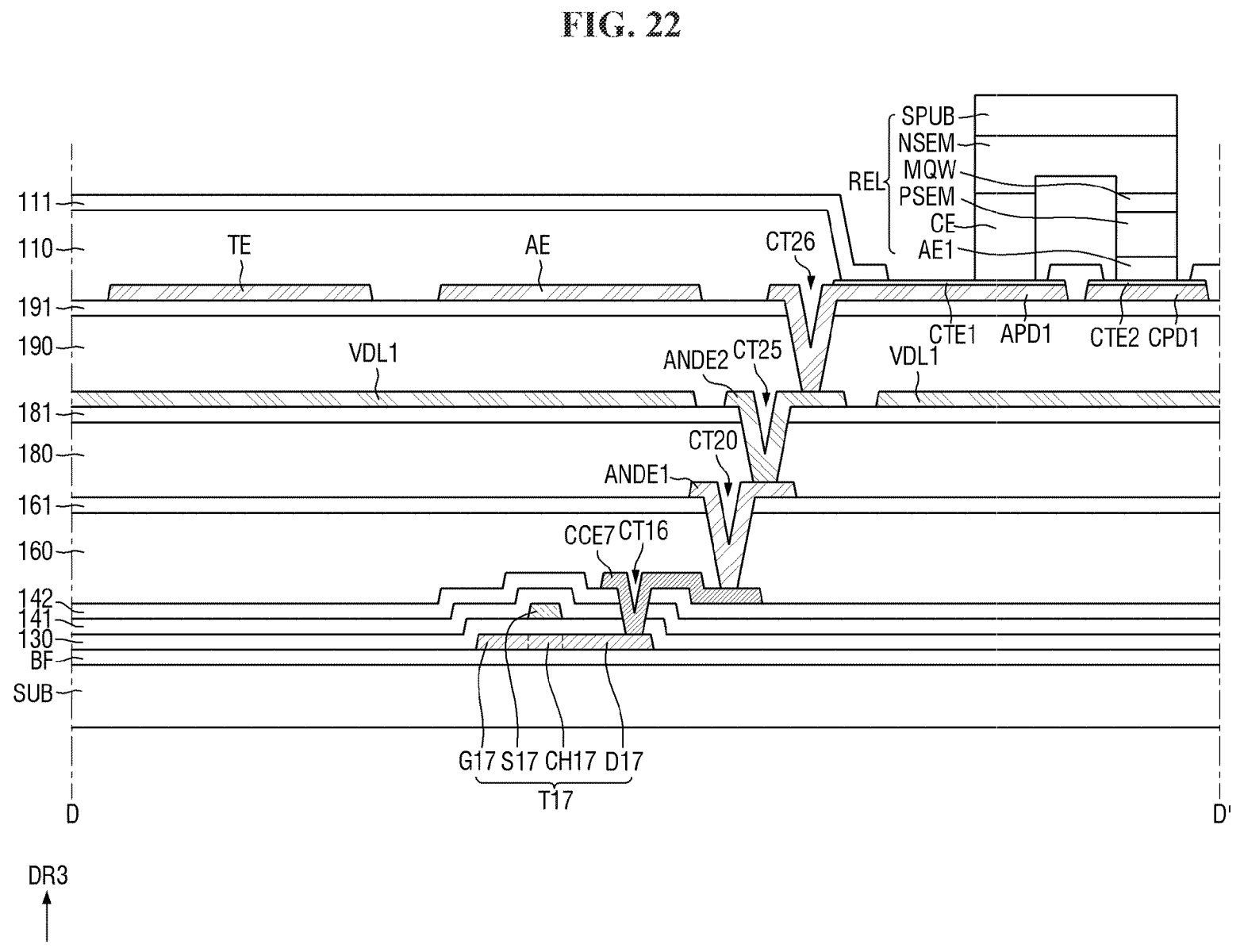

FIG. 22 is a cross-sectional view illustrating an example of the display panel taken along the line D-D' of FIG. 21.

In FIG. 22, the seventeenth transistor T17 of the first sub-pixel RP1 is illustrated for convenience of description.

Referring to FIG. 22, the fourth source metal layer may further include an antenna electrode AE. The antenna electrode AE may be located apart from the first pad connection electrode APD1 and may be electrically separated from each other. The antenna electrode AE may be connected to the fourth pad connection electrode CPD1. That is, the antenna electrode AE and the fourth pad connection electrode CPD1 may be integrally formed.

In summary, because the antenna electrode AE is included in the fourth source metal layer, the antenna electrode AE may be formed without adding a separate metal layer. Therefore, manufacturing cost might not be added due to the antenna electrode AE.

Furthermore, because the antenna electrode AE and the fourth pad connection electrode CPD1 overlapping therewith are connected to each other, the second power voltage may be applied to the antenna electrode AE and the fourth pad connection electrode CPD1 overlapping therewith during the display period when the light emitting element REL emits light. In addition, wireless transmission and reception signals may be applied to the antenna electrode AE and the fourth pad connection electrode CPD1 overlapping therewith during the antenna driving period for transmitting and receiving electromagnetic waves. To reduce or prevent the likelihood of the first light emitting element REL erroneously emitting light during the antenna driving period, an initialization voltage (e.g., predetermined initialization voltage) that is lower than the minimum level voltage of wireless transmission and reception signals may be applied to the first pad connection electrode APD1.

FIG. 23 is a cross-sectional view illustrating an example of the display panel taken along the line D-D' of FIG. 21.

The one or more embodiments corresponding to FIG. 23 is different from the one or more embodiments corresponding to FIG. 22 in that the opening area OA passing through the fourth planarization layer 110 is formed. In FIG. 23, a repeated description overlapping with the one or more embodiments corresponding to FIG. 22 will be omitted.

Referring to FIG. 23, the opening area OA passing through the fourth planarization layer 110 may be formed in respective areas corresponding to most of the antenna electrode AE and most of the touch electrode TE. That is, most of the antenna electrode AE and most of the touch electrode TE may be exposed without being covered by the fourth planarization layer 110. In summary, because the fourth planarization layer 110 is not located in the opening area OA, a ratio of light reflected by most of the antenna electrode AE to most of the touch electrode TE may be increased.

The fourth inorganic insulating layer 111 may be located on the antenna electrode AE and the touch electrode TE in the opening area OA. Accordingly, insulation between the antenna electrode AE and the structure located on the touch electrode TE may be maintained. The opening area OA may overlap the first to nineteenth transistors T1 to T19 of the first sub-pixel RP.

In summary, by removing the fourth planarization layer 110 from the opening area OA, the ratio of light reflected by the antenna electrode AE and the touch electrode TE may be increased. Therefore, the display device according to one or more embodiments reflects light incident by the antenna electrode AE and the touch electrode TE, so that the user can see the object or background reflected from the display device as a reflective display device.

Figure 24:
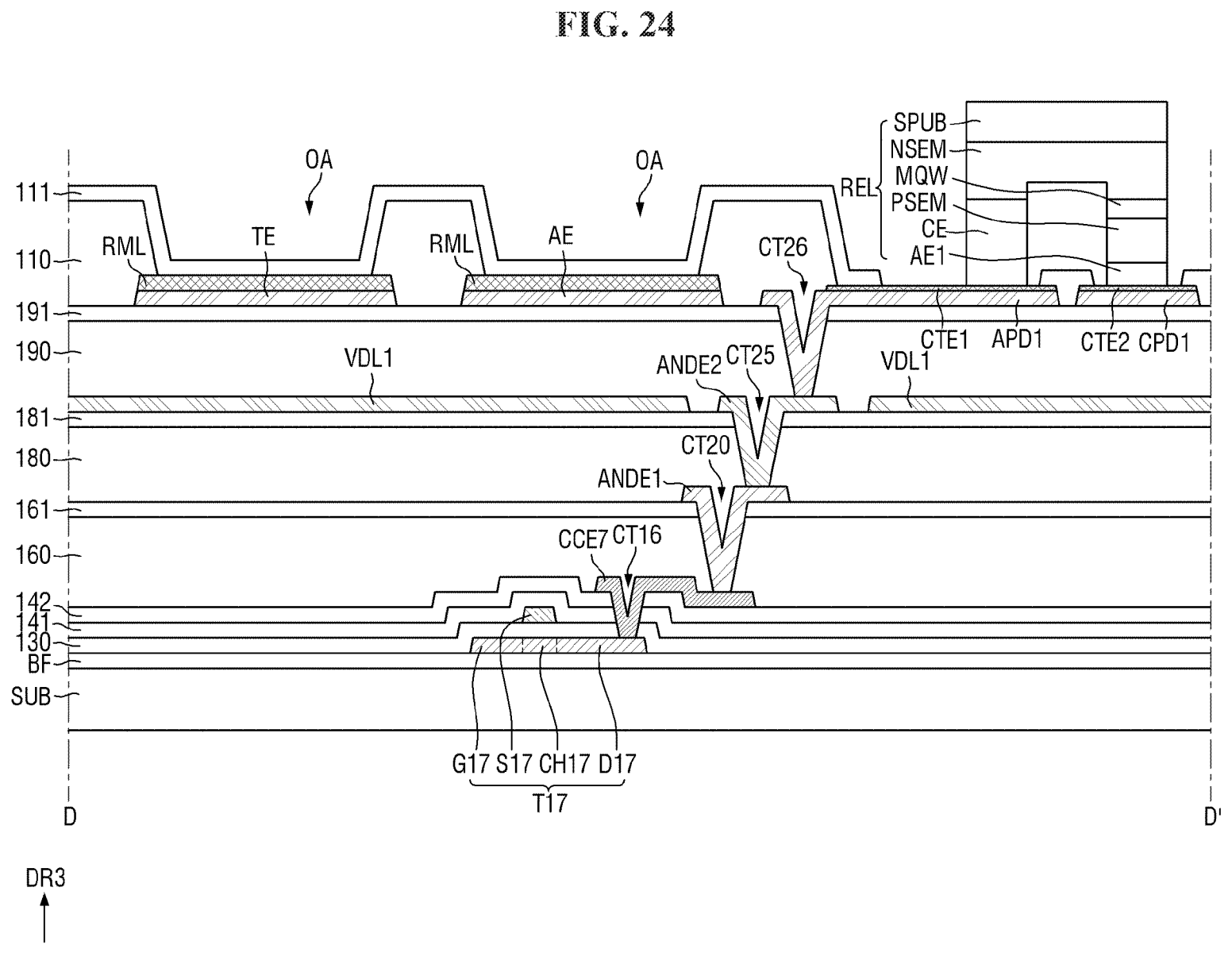

FIG. 24 is a cross-sectional view illustrating an example of the display panel taken along the line D-D' of FIG. 21.

The one or more embodiments corresponding to FIG. 24 is different from the one or more embodiments corresponding to FIG. 23 in that the reflective electrode RML for increasing reflectivity is added on the antenna electrode AE and the touch electrode TE located in the opening area OA. In FIG. 24, a repeated description overlapping with the one or more embodiments corresponding to FIG. 23 will be omitted.

Referring to FIG. 24, the reflective electrode RML may include first to third electrode layers ML1 to ML3. The first electrode layer ML1 may be located on the second power supply line VSL, the second electrode layer ML2 may be located on the first electrode layer ML1, and the third electrode layer ML3 may be located on the second electrode layer ML2.

The first electrode layer ML1 and the third electrode layer ML3 may be formed of the transparent metal material, such as ITO or IZO. The second electrode layer ML2 may be made of a metal material having high reflectance, such as silver (Ag). The thickness of the second electrode layer ML2 may be greater than the thickness of the first electrode layer ML1 and greater than the thickness of the third electrode layer ML3. For example, the reflective electrode RML may be formed of ITO/Ag/ITO, IZO/Ag/IZO, ITO/Ag/IZO, IZO/Ag/ITO, or the like.

In summary, because the fourth planarization layer 110 is not located in the opening area OA and a reflective electrode having high reflectivity is located, the ratio of light reflected by the antenna electrode AE and the touch electrode TE may be increased.

Figure 25:
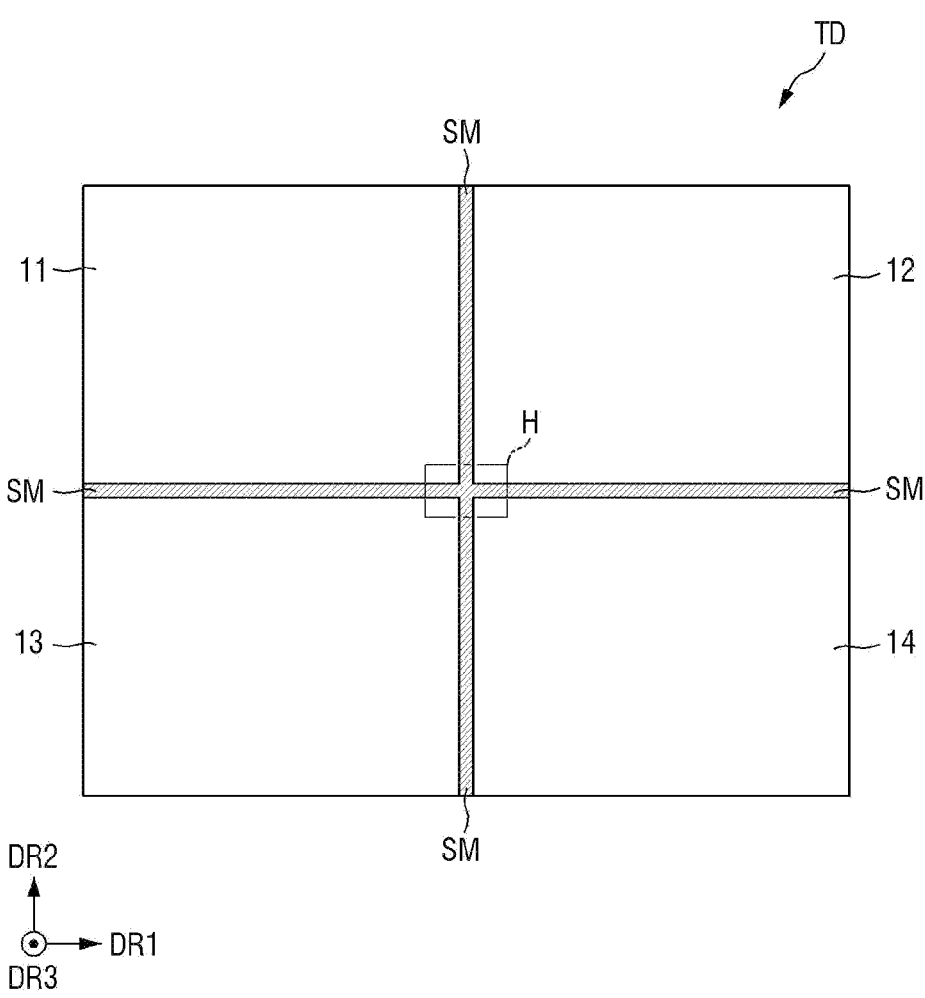
FIG. 25 is a view illustrating a front surface of a tiled display device including a plurality of display devices according to one or more embodiments.

FIG. 25 is a view illustrating a front surface of a tiled display device including a plurality of display devices according to one or more embodiments.

Referring to FIG. 25, a tiled display device TD may include a plurality of display devices 11, 12, 13, and 14, and a connection member SM. For example, the tiled display device TD may include a first display device 11, a second display device 12, a third display device 13, and a fourth display device 14.

The plurality of display devices 11, 12, 13, and 14 may be arranged in a matrix form in M (M is a positive integer) rows and N (N is a positive integer) columns. For example, the first display device 11 and the second display device 12 may be adjacent to each other in the first direction DR1. The first display device 11 and the third display device 13 may be adjacent to each other in the second direction DR2. The third display device 13 and the fourth display device 14 may be adjacent to each other in the first direction DR1. The second display device 12 and the fourth display device 14 may be adjacent to each other in the second direction DR2.

However, the number and arrangement of the plurality of display devices 11, 12, 13, and 14 in the tiled display device TD are not limited to those illustrated in FIG. 25. The number and arrangement of the display devices 11, 12, 13, and 14 in the tiled display device TD may be determined in response to the size of the display device 10 and the tiled display device TD, and the shape of the tiled display device TD.

The plurality of display devices 11, 12, 13, and 14 may have the same size as each other, but embodiments of the present disclosure are not limited thereto. For example, the plurality of display devices 11, 12, 13, and 14 may have different sizes.

Each of the plurality of display devices 11, 12, 13, and 14 may have a rectangular shape including long sides and short sides. The plurality of display devices 11, 12, 13, and 14 may be located such that the long sides or the short sides thereof are connected to each other. Some or all of the plurality of display devices 11, 12, 13, and 14 may be located at the edge of the tiled display device TD, and may be located one side of the tiled display device TD. At least one of the plurality of display devices 11, 12, 13, and 14 may be located at least one corner of the tiled display device TD, and may be formed two adjacent sides of the tiled display device TD. At least one of the plurality of display devices 11, 12, 13, and 14 may be surrounded by other display devices.

Each of the plurality of display devices 11, 12, 13, and 14 may be substantially the same as the display panel 100 described with reference to FIG. 1. Therefore, a description of each of the plurality of display devices 11, 12, 13, and 14 will be omitted.

The connection member SM may include a coupling member or an adhesive member. In this case, the plurality of display devices 11, 12, 13, and 14 may be connected to each other by the coupling member or the adhesive member of the connection member SM. The connection member SM may be located between the first display device 11 and the second display device 12, between the first display device 11 and the third display device 13, between the second display device 12 and the fourth display device 14, and between the third display device 13 and the fourth display device 14.

Figure 26:
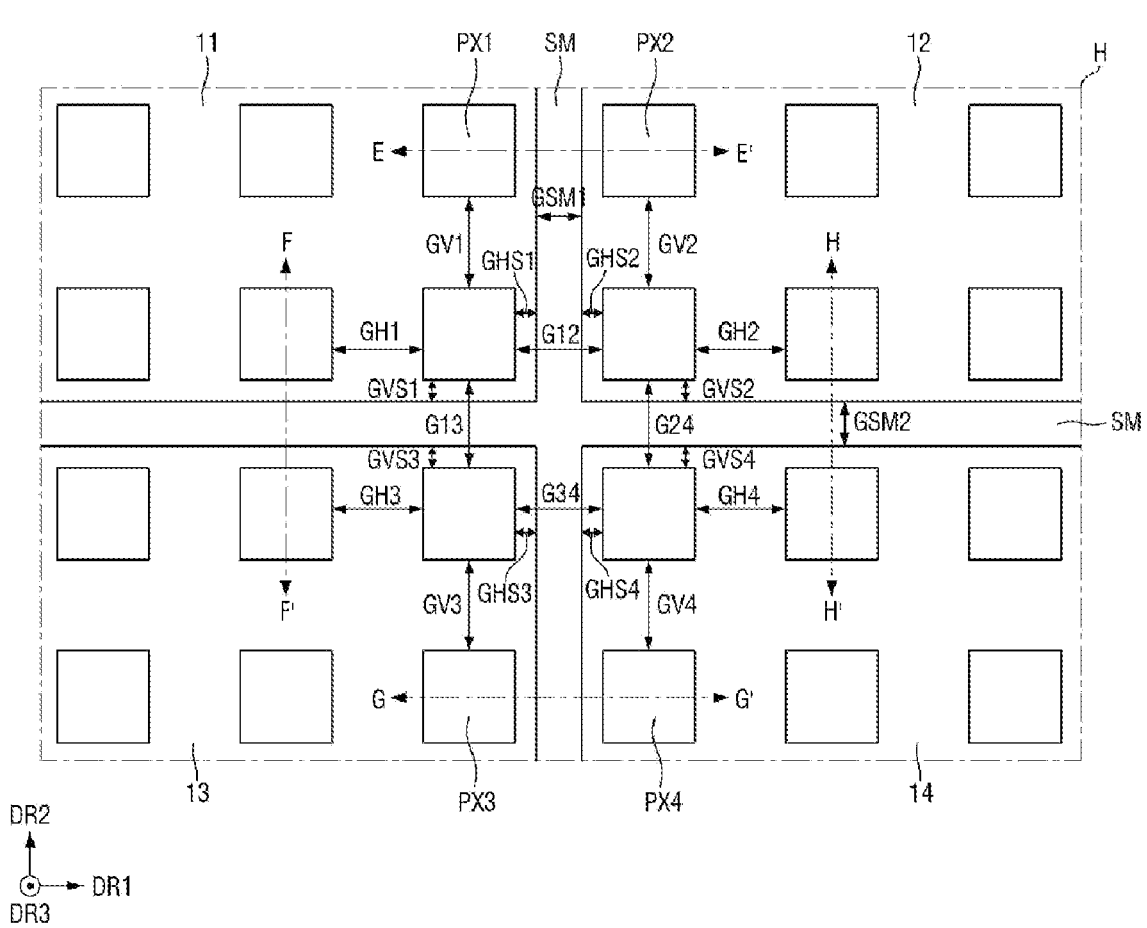
FIG. 26 is an enlarged layout diagram illustrating area H of FIG. 25 in detail.

FIG. 26 is an enlarged layout diagram illustrating area H of FIG. 25 in detail.

Referring to FIG. 26, the connection member SM may have a planar shape of a cross, or a plus sign in a central area of the device TD in which the first display device 11, the second display device 12, the third display device 13, and the fourth display device 14 are adjacent to each other. The connection member SM may be located between the first display device 11 and the second display device 12, between the first display device 11 and the third display device 13, between the second display device 12 and the fourth display device 14, and between the third display device 13 and the fourth display device 14.

The first display device 11 may include first pixels PX1 arranged in a matrix form in the first direction DR1 and the second direction DR2 to display an image. The second display device 12 may include second pixels PX2 arranged in a matrix in the first direction DR1 and the second direction DR2 to display an image. The third display device 13 may include third pixels PX3 arranged in a matrix in the first direction DR1 and the second direction DR2 to display an image. The fourth display device 14 may include fourth pixels PX4 arranged in a matrix in the first direction DR1 and the second direction DR2 to display an image.

A minimum distance between the first pixels PX1 adjacent in the first direction DR1 may be defined as a first horizontal separation distance GH1, and a minimum distance between the second pixels PX2 adjacent in the first direction DR1 may be defined as a second horizontal separation distance GH2. The first horizontal separation distance GH1 and the second horizontal separation distance GH2 may be substantially the same.

The connection member SM may be located between the first pixel PX1 and the second pixel PX2 adjacent in the first direction DR1. A minimum distance G12 between respective ones of the first pixels PX1 and the second pixels PX2 adjacent in the first direction DR1 may be the sum of the minimum distance GHS1 between the first pixel PX1 and the connection member SM in the first direction DR1, the minimum distance GHS2 between the second pixel PX2 and the connection member SM in the first direction DR1, and a width GSM1 of the connection member SM in the first direction DR1.

The minimum distance G12 between the first pixel PX1 and the second pixel PX2 adjacent in the first direction DR1, the first horizontal separation distance GH1, and the second horizontal separation distance GH2 may be substantially the same. To this end, the minimum distance GHS1 between the first pixel PX1 and the connection member SM in the first direction DR1 may be less than the first horizontal separation distance GH1, and the minimum distance GHS2 between the second pixel PX2 and the connection member SM in the first direction DR1 may be less than the second horizontal separation distance GH2. Further, the width GSM1 of the connection member SM in the first direction DR1 may be less than the first horizontal separation distance GH1 or the second horizontal separation distance GH2.

A minimum distance between the third pixels PX3 adjacent in the first direction DR1 may be defined as a third horizontal separation distance GH3, and a minimum distance between the fourth pixels PX4 adjacent in the first direction DR1 may be defined as a fourth horizontal separation distance GH4. The third horizontal separation distance GH3 and the fourth horizontal separation distance GH4 may be substantially the same.

The connection member SM may be located between the third pixel PX3 and the fourth pixel PX4 adjacent in the first direction DR1. A minimum distance G34 between the third pixel PX3 and the fourth pixel PX4 adjacent in the first direction DR1 may be the sum of a minimum distance GHS3 between the third pixel PX3 and the connection member SM in the first direction DR1, a minimum distance GHS4 between the fourth pixel PX4 and the connection member SM in the second direction DR1, and the width GSM1 of the connection member SM in the second direction DR1.

The minimum distance G34 between the third pixel PX3 and the fourth pixel PX4 adjacent in the first direction DR1, the third horizontal separation distance GH3, and the fourth horizontal separation distance GH4 may be substantially the same. To this end, the minimum distance GHS3 between the third pixel PX3 and the connection member SM in the first direction DR1 may be less than the third horizontal separation distance GH3, and the minimum distance GHS4 between the fourth pixel PX4 and the connection member SM in the first direction DR1 may be less than the fourth horizontal separation distance GH4. Further, in the first direction DR1, the width GSM1 of the connection member SM may be less than the third horizontal separation distance GH3 or the fourth horizontal separation distance GH4.

The minimum distance between the first pixels PX1 adjacent in the second direction DR2 may be defined as a first vertical separation distance GV1, and the minimum distance between the third pixels PX3 adjacent in the first direction DR2 may be defined as a third vertical separation distance GV3. The first vertical separation distance GV1 and the third vertical separation distance GV3 may be substantially the same.

The connection member SM may be located between the first pixel PX1 and the third pixel PX3 adjacent in the first direction DR2. A minimum distance G13 between the first pixel PX1 and the third pixel PX3 adjacent in the first direction DR2 may be the sum of a minimum distance GVS1 between the first pixel PX1 and the connection member SM in the second direction DR2, a minimum distance GVS3 between the third pixel PX3 and the connection member SM in the second direction DR2, and a width GSM2 of the connection member SM in the second direction DR2.

The minimum distance G13 between the first pixel PX1 and the third pixel PX3 adjacent in the second direction DR2, the first vertical separation distance GV1, and the third vertical separation distance GV3 may be substantially the same. To this end, the minimum distance GVS1 between the first pixel PX1 and the connection member SM in the second direction DR2 may be less than the first vertical separation distance GV1, and the minimum distance GVS3 between the third pixel PX3 and the connection member SM in the second direction DR2 may be less than the third vertical separation distance GV3. Further, in the second direction DR2, the width GSM2 of the connection member SM may be less than the first vertical separation distance GV1 or the third vertical separation distance GV3.

The minimum distance between the adjacent second pixels PX2 in the second direction DR2 may be defined as a second vertical separation distance GV2, and the minimum distance between the fourth pixels PX4 adjacent in the second direction DR2 may be defined as a fourth vertical separation distance GV4. The second vertical separation distance GV2 and the fourth vertical separation distance GV4 may be substantially the same.

The connection member SM may be located between the second pixel PX2 and the fourth pixel PX4 adjacent in the second direction DR2. The minimum distance G24 between the second pixel PX2 and the fourth pixel PX4 adjacent in the second direction DR2 may be the sum of the minimum distance GVS2 between the second pixel PX2 and the connection member SM in the second direction DR2, the minimum distance GVS4 between the fourth pixel PX4 and the joint SM in the second direction DR2, and the width GSM2 of the connection member SM in the second direction DR2.

A minimum distance G24 between the second pixel PX2 and the fourth pixel PX4 adjacent in the second direction DR2, a second vertical separation distance GV2, and a fourth vertical separation distance GV4 may be substantially the same. To this end, a minimum distance GVS2 between the second pixel PX2 and the connection member SM in the second direction DR2 may be less than the second vertical separation distance GV2, and a minimum distance GVS4 between the fourth pixel PX4 and the connection member SM in the second direction DR2 may be less than the fourth vertical separation distance GV4. Further, in the first direction DR2, the width GSM2 of the connection member SM may be less than the second vertical separation distance GV2 or the fourth vertical separation distance GV4.

As shown FIGS. 26, to reduce or prevent the likelihood of the connection member SM being recognized between images displayed by the plurality of display devices 11, 12, 13, and 14, the minimum distance between respective pixels of adjacent display devices may be substantially equal to the minimum distance between each of the pixels.

Figure 27:
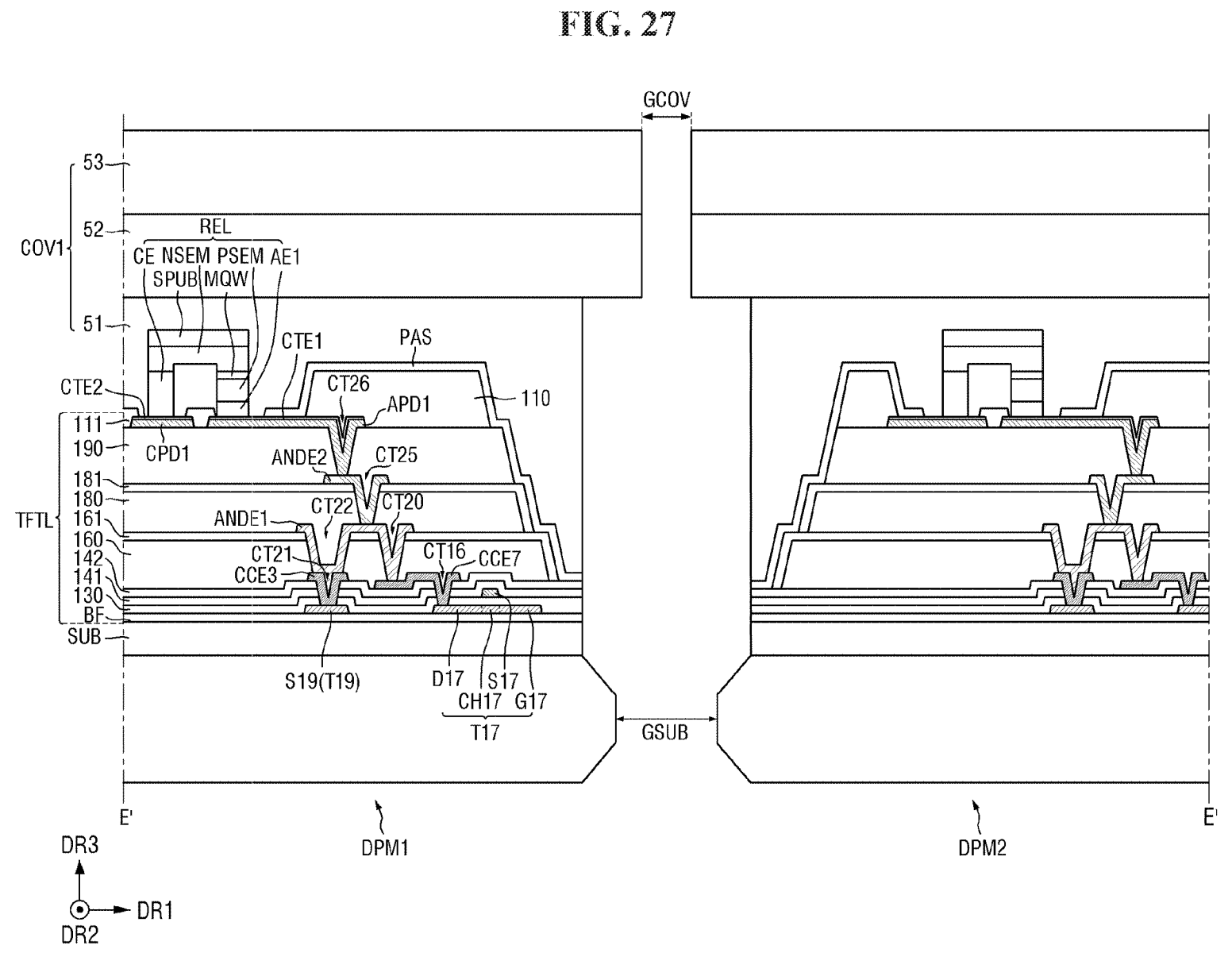

FIG. 27 is a cross-sectional view illustrating an example of a tiled display device taken along the line E-E' of FIG. 26.

Referring to FIG. 27, the first display device 11 includes a first display module DPM1 and a first front cover COV1. The second display device 12 includes a second display module DPM2 and a second front cover.

Each of the first display module DPM1 and the second display module DPM2 includes the substrate SUB, the thin film transistor layer TFTL, and the light emitting element layer. The thin film transistor layer TFTL and the light emitting element layer have already been described in detail with reference to FIGS. 17 to 19. In FIG. 27, a repeated description overlapping with the one or more embodiments corresponding to FIGS. 17 to 19 will be omitted.

The substrate SUB may include a first surface on which the thin film transistor layer TFTL is located, a second surface facing the first surface, and a first side surface located between the first surface and the second surface. The first surface may be a front surface or an upper surface of the substrate SUB, and the second surface may be a bottom surface or a lower surface of the substrate SUB.

In addition, the substrate SUB may further include a chamfer surface located between the first surface and the first side surface and between the second surface and the first side surface. The thin film transistor layer TFTL and the light emitting element layer might not be located on the chamfer surface. Due to the chamfer surface, it is possible to reduce or prevent damage from the collision of the substrate SUB of the first display device 10 and the substrate of the second display device 10.

The chamfer surface may be located between each of the other side surfaces except the first surface and the first side surface and each of the other side surfaces except the second surface and the first side surface. For example, when the first display device 11 and the second display device 12 have a rectangular planar shape as shown in FIG. 25, the substrate SUB may be located between the first surface and each of the second side, the third side, and the fourth side, and between the second surface and each of the second side, the third side, and the fourth side.

The first front cover COV1 may be located on the chamfer surface of the substrate SUB. That is, the first front cover COV1 may protrude more than the substrate SUB in the first direction DR1 and the second direction DR2. Therefore, a distance GSUB between the substrate SUB of the first display device 11 and the substrate SUB of the second display device 12 may be greater than a distance GCOV between the first front cover COV1 and the second front cover.

Each of the first front cover COV1 and the second front cover may include an adhesive member 51, a light transmittance control layer 52 located on the adhesive member 51, and an anti-glare layer 53 located on the light transmittance control layer 52.

The adhesive member 51 of the first front cover COV1 serves to attach the light emitting element layer of the first display module DPM1 to the first front cover COV1. The adhesive member 51 of the second front cover serves to attach a light emitting element layer of the second display module DPM2 to the second front cover. The adhesive member 51 may be a transparent adhesive member capable of transmitting light. For example, the adhesive member 51 may be an optically clear adhesive film or an optically clear resin.

The anti-glare layer 53 may be designed to diffusely reflect external light to reduce or prevent deterioration of image visibility by reflecting external light as it is. Accordingly, the contrast ratio of images displayed by the first display device 10 and the second display device 20 may be increased due to the anti-glare layer 53.

The light transmittance control layer 52 may be designed to reduce transmittance of external light or light reflected from the first display module DPM1 and the second display module DPM2. Accordingly, visual recognition (e.g., from the outside) of a gap GSUB between the substrate SUB of the first display module DPM1 and the substrate SUB of the second display module DPM2 may be reduced or prevented.

The anti-glare layer 53 may be implemented as a polarizing plate, and a light transmittance control layer 52 may be implemented as a phase delay layer, but the present disclosure is not limited thereto.

Meanwhile, because an example of a tiled display device cut along F-F', G-G', and H-H' of FIG. 26 is substantially the same as an example of a tiled display device cut along E-E' described in connection with FIG. 27, a repeated description thereof will be omitted.

Figure 29:
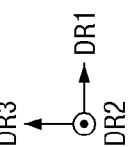
FIG. 29 is a cross-sectional view illustrating an example of a tiled display device taken along the line I-I' of FIG. 28.

FIG. 28 is a view illustrating a bottom surface of a first display device according to one or more embodiments. FIG. 29 is a cross-sectional view illustrating an example of a tiled display device taken along the line I-I' of FIG. 28.

In FIG. 28, second display pads DPD2 and second touch pads TPD2 located on the bottom surface of the first display device for convenience of description.

Referring to FIGS. 28 and 29, the first display pads DPD1 and the first touch pads TPD1 may be front pads located on the first surface corresponding to the front surface of the substrate SUB. The first display pads DPD1 and the first touch pads TPD1 may be located on edges of the first surface of the substrate SUB.

The second display pads DPD2 and the second touch pads TPD2 may be bottom pads located on the second surface corresponding to the bottom surface of the substrate SUB. The second display pads DPD2 and the second touch pads TPD2 may be located at an edge of the second surface of the substrate SUB. The second touch pads TPD2 may be located closer to the edge of the substrate SUB than the second display pads DPD2. The second display pads DPD2 may correspond to the first display pads DPD1 one-to-one, and the second touch pads TPD2 may correspond to the first touch pads TPD1 one-to-one.

Each of the first display pads DPD1 and the first touch pads TPD1 may include first to fifth sub pads SPD1, SPD2, SPD3, SPD4, and SPD5. The first source metal layer may further include a first sub pad SPD1, the second source metal layer may further include a second sub pad SPD2, and the third source metal layer may further include a third sub pad SPD3, the fourth source metal layer may further include a fourth sub pad SPD4, and the transparent metal layer may further include a fifth sub pad SPD5.

The second sub pad SPD2 may be located on the first sub pad SPD1, and the third sub pad SPD3 may be located on the second sub pad SPD2. The fourth sub pad SPD4 may be located on the third sub pad SPD3, and the fifth sub pad SPD5 may be located on the fourth sub pad SPD4. An upper surface of the first sub pad SPD1 may contact a lower surface of the second sub pad SPD2, and an upper surface of the second sub pad SPD2 may contact a lower surface of the third sub pad SPD3. An upper surface of the third sub pad SPD3 may contact a lower surface of the fourth sub pad SPD4, and an upper surface of the fourth sub pad SPD4 may contact a lower surface of the fifth sub pad SPD5.

The bottom connection line BCL may be located on the bottom surface of the substrate SUB. The bottom connection line BCL may be formed as a single layer or multiple layers made of any one of molybdenum (Mo), aluminum (Al), chromium (Cr), gold (Au), titanium (Ti), nickel (Ni), neodymium (Nd), and copper (Cu) or an alloy thereof.

Each of the second display pads DPD2 and the second touch pads TPD2 may be located at one end of a bottom connection line BCL, and a third pad PD3 may be located at the other end of the bottom connection line BCL. The second display pads DPD2, the second touch pad TPD2, and the third pad PD3 may be formed of a transparent conductive oxide, such as indium tin oxide (ITO) and indium zinc oxide (IZO).

A fifth planarization layer 170 may be located on the bottom surface of the bottom connection line BCL and the substrate SUB. The fifth planarization layer 170 may be formed of the organic film, such as acrylic resin, epoxy resin, phenolic resin, polyamide resin, polyimide resin, etc. The fifth planarization layer 170 may be referred to as the organic insulating layer.

A fifth inorganic insulating layer 171 may be located on the fifth planarization layer 170. The fifth inorganic insulating layer 171 may be formed of the inorganic layer, for example, the silicon nitride layer, the silicon oxynitride layer, the silicon oxide layer, the titanium oxide layer, or the aluminum oxide layer.

A side line SIL may be located on the first surface, a first chamfered surface CS1, the first side SS1, a fifth chamfered surface CS5, and the second surface of the substrate SUB. The side line SIL may be connected to the first pad PD1 located on the first pad PD1 located on the edge of the first surface of the substrate SUB. The side line SIL may be connected to the second pad PD2 located on the second pad PD2 located on the edge of the second surface of the substrate SUB. The side line SIL may contact the first chamfered surface CS1, the first side SS1, and the fifth chamfered surface CS5 of the substrate SUB.

The overcoat layer OC may be located on the first surface, the first chamfered surface CS1, the first side surface SS1, the fifth chamfered surface CS5, and the second surface of the substrate SUB. The overcoat layer OC may be formed to cover the side line SIL. The overcoat layer (OC) may be formed of an organic film, such as acryl resin, epoxy resin, phenolic resin, polyamide resin, polyimide resin, etc.

The circuit board 200 may be located on the bottom surface of the substrate SUB. The circuit board 200 may be connected to the exposed bottom connection line BCL not covered by the fifth planarization layer 170 and the fifth inorganic insulating layer 171 using a conductive adhesive member CAM. The circuit board 200 may be connected to the third pad PD3 through the conductive adhesive member CAM. The conductive adhesive member CAM may be an anisotropic conductive film or an anisotropic conductive paste.

Figure 30:
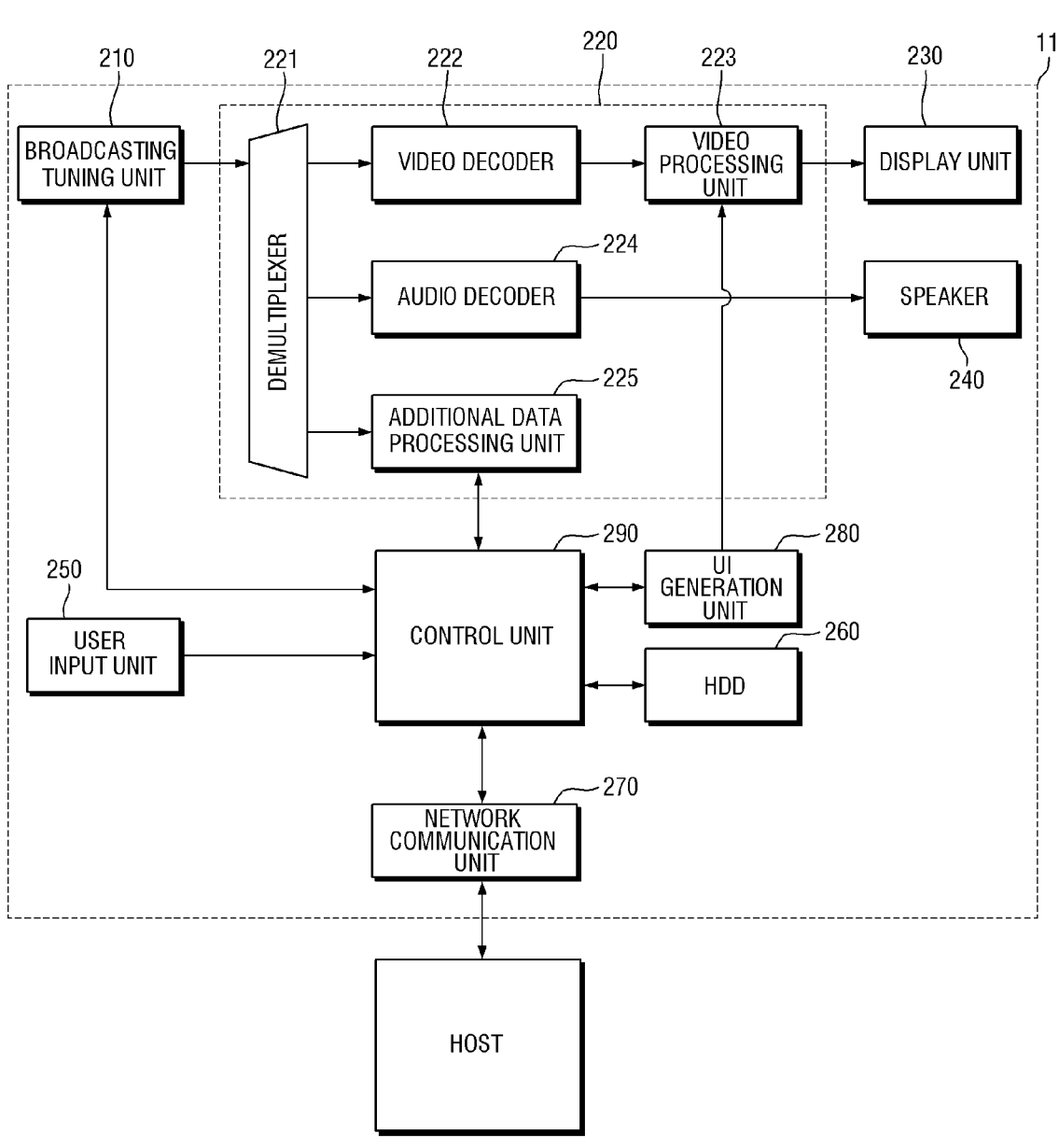
FIG. 30 is a block diagram illustrating a tiled display device according to one or more embodiments.
Figure 31:
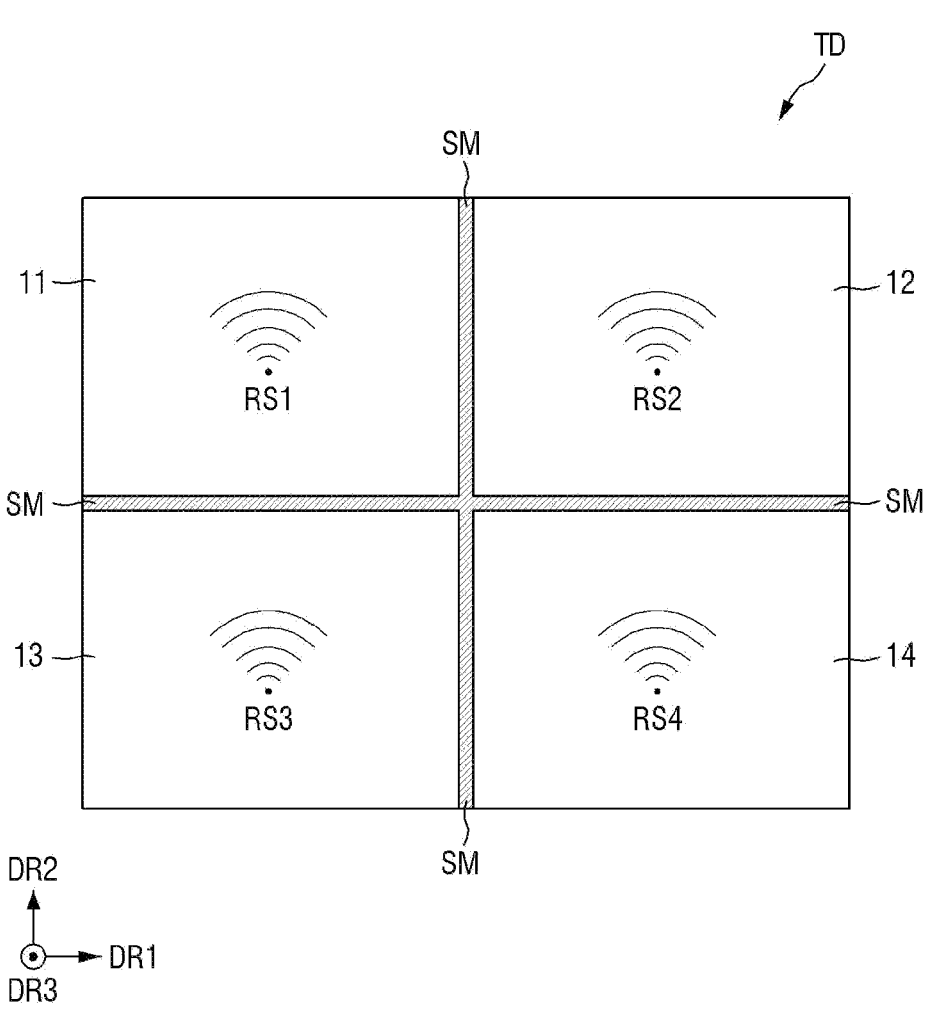
FIG. 31 is a diagram illustrating wireless communication between a plurality of display devices of a tiled display device according to one or more embodiments.

FIG. 30 is a block diagram illustrating a tiled display device according to one or more embodiments. FIG. 31 is a diagram illustrating wireless communication between a plurality of display devices of a tiled display device according to one or more embodiments.

In FIG. 30, the first display device 11 and a host system HOST are illustrated for convenience of description.

Referring to FIGS. 30 and 31, the tiled display device TD according to one or more embodiments may include the host system HOST, a broadcast tuner 210, a signal processor 220, a display 230, a speaker 240, and a user interface (e.g., user input unit) 250, a storage/hard disk drive (HDD) 260, a network communicator 270, a UI generator 280, and a controller 290.

The host system HOST may be implemented as any one of a television system, a home theater system, a set-top box, a navigation system, a DVD player, a Blu-ray™ player, a personal computer PC, a mobile phone system, and a tablet.

A user's command may be input to the host system HOST in various formats. For example, the host system HOST may receive a command by a user's touch input. Alternatively, the user's command may be input to the host system HOST by a keyboard input or a button input of a remote controller.

The host system HOST may receive original video data corresponding to the original image from the outside. The host system HOST may divide the original video data by the number of display devices. For example, the host system HOST corresponds to the first display device 11, the second display device 12, the third display device 13, and the fourth display device 14, so that the original video data may be divided into first video data corresponding to a first image, the second video data corresponding to a second image, the third video data corresponding to a third image, and the fourth video data corresponding to a fourth image. The host system HOST may transmit the first video data to the first display device 11, the second video data to the second display device 12, the third video data to the third display device 13, and the fourth video data to the fourth display device 14.

The first display device 11 may display the first image according to the first video data, and the second display device 12 may display the second image according to the second video data. Also, the third display device 13 may display the third image according to the third video data, and the fourth display device 14 may display the fourth image according to the fourth video data. Accordingly, a user may view the original image in which the first to the fourth images displayed on the first to fourth display devices 11, 12, 13 and 14 are combined.

The broadcast tuner 210 may receive a broadcast signal of the corresponding channel through an antenna by tuning a channel frequency (e.g., predetermined channel frequency) under the control of the controller 290. The broadcast tuner 210 may include a channel detection module and an RF demodulation module.

The broadcast signal demodulated by the broadcast tuner 210 is processed by the signal processor 220 and output to the display 230 and to the speaker 240. Here, the signal processor 220 may include a demultiplexer 221, a video decoder 222, a video processor 223, an audio decoder 224, and an additional data processor 225.

The demultiplexer 221 separates the demodulated broadcast signal into a video signal, an audio signal, and additional data. The separated video signal, audio signal, and additional data are restored by the video decoder 222, the audio decoder 224, and the additional data processor 225, respectively. In this case, the video decoder 222, the audio decoder 224, and the additional data processor 225 restore a decoding format corresponding to the encoding format when the broadcast signal is transmitted.

On the other hand, the decoded video signal is converted by the video processor 223 into vertical frequency, resolution, aspect ratio, etc. that meet the output standard of the display 230, and the decoded audio signal is output to the speaker 240.

The display 230 includes a display panel 100 on which an image is displayed and a panel driver controlling driving of the display panel 100.

The user interface 250 may receive a signal transmitted by the host system HOST. The user interface 250 allows the user to select not only data related to channel selection and User Interface (UI) menu selection and manipulation of a channel transmitted by the host system HOST, but also commands related to communication with other display devices. Also, the user interface 250 allows data for input to be entered.

The HDD 260 stores various software programs including OS programs, recorded broadcast programs, moving pictures, photos, and other data. The HDD 260 may be made of a storage medium, such as a hard disk or non-volatile memory.

The network communicator 270 is for short-distance communication with the host system HOST and other display devices. The network communicator 270 may be implemented a communication module including an antenna pattern that may implement mobile communication, data communication, Bluetooth™, RF, Ethernet, etc.

The network communicator 270 may transmit and receive wireless signals to and from at least one of a base station, an external terminal, and a server on a mobile communication network constructed according to technical standards or communication methods for mobile communication (e.g., Global System for Mobile communication (GSM), Code Division Multi Access (CDMA), Code Division Multi Access 2000 (CDMA2000™), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), 5G, etc.) through the antenna electrodes AE as shown in FIGS. 21 to 24.

The network communicator 270 may transmit and receive wireless signals in a communication network according to wireless Internet technologies through the antenna electrodes AE as shown in FIGS. 21 to 24. The wireless Internet technologies include, for example, WLAN (Wireless LAN), Wi-Fi (Wireless-Fidelity), Wi-Fi (Wireless Fidelity) Direct, DLNA (Digital Living Network Alliance), WiBro (Wireless Broadband), WiMAX (World Interoperability for Microwave Access), High Speed Downlink Packet Access (HSDPA), High Speed Uplink Packet Access (HSUPA), Long Term Evolution (LTE), Long Term Evolution-Advanced (LTE-A), etc. The antenna electrodes AE transmit and receive data according to at least one wireless Internet technology within a range including even Internet technologies not listed above.

Further, each of the first to fourth display devices 11, 12, 13, and 14 may include antenna electrodes AE as shown in FIG. 31, thereby transmitting and receiving wireless signals to and from each other. The first display device 11 may transmit a first wireless signal RS1, and the second to fourth display devices 12, 13, and 14 may receive the first wireless signal RS1. Also, the second display device 12 may transmit a second wireless signal RS2, and the first, third, and fourth display devices 11, 13, and 14 may receive the second wireless signal RS2. In addition, the third display device 13 may transmit a third wireless signal RS3, and the first, second, and fourth display devices 11, 12, and 14 may receive the third wireless signal RS3. Also, the fourth display device 14 may transmit a fourth wireless signal RS4, and the first to third display devices 11, 12, and 13 may receive the fourth wireless signal RS4.

The UI generator 280 that generates a UI menu for wireless communication with the host system HOST and the second to fourth display devices 12, 13, and 14 may be implemented by an algorithm code and an optoelectronic, sensor/actuator, and discrete (OSD) IC. The UI menu for communication with the host system HOST and the second to fourth display devices 12, 13, and 14 may be a menu for designating a counterpart digital TV for communication and selecting a desired function.

The controller 290 is responsible for overall control of the first display device 11 and responsible for communication control of the host system HOST and the second through fourth display devices 12 through 14. In the controller 290, a corresponding algorithm code stores for control and the corresponding algorithm code may be implemented by an Micro Controller Unit (MCU).

According to the input and selection of the user interface 250, the controller 290 controls to transmit the corresponding control command and data to the host system HOST and the second to fourth display devices 12, 13, and 14 through the network communicator 270. When a control command (e.g., predetermined control command) and data are received from the host system HOST and the second to fourth display devices 12, 13, and 14, the controller 290 performs an operation according to the control command.

However, the aspects of embodiments of the present disclosure are not restricted to the one set forth herein. The above and other aspects of the present disclosure will become more apparent to one of daily skill in the art to which the present disclosure pertains by referencing the claims, with functional equivalents thereof to be included therein.

What is claimed is:

1. A display device comprising:
   a substrate;
   transistors above the substrate;
   a first organic insulating layer above the transistors;
   a first connection electrode above the first organic insulating layer, and electrically connected to at least one of the transistors;
   a second connection electrode above the first organic insulating layer;
   a first power supply line configured to receive a first power voltage, above the first organic insulating layer, and connected to the second connection electrode; and
   a second organic insulating layer above the first power supply line, and defining an opening area exposing the first power supply line.

2. The display device of claim 1, wherein the opening area overlaps the transistors.

3. The display device of claim 1, wherein the first connection electrode and the second connection electrode do not overlap the transistors.

4. The display device of claim 1, further comprising an inorganic insulating layer above the first power supply line in the opening area.

5. The display device of claim 4, wherein the inorganic insulating layer is above the second organic insulating layer.

6. The display device of claim 1, further comprising:

a first pad electrode above the first connection electrode;

a second pad electrode above the second connection electrode; and a reflective electrode above the first power supply line, and comprising a same material as the first pad electrode and the second pad electrode.

7. The display device of claim 6, wherein the first pad electrode, the second pad electrode, and the reflective electrode comprise a first electrode layer, a second electrode layer above the first electrode layer, and a third electrode layer above the second electrode layer.

8. The display device of claim 7, wherein a thickness of the second electrode layer is greater than a thickness of the first electrode layer and a thickness of the third electrode layer.

9. The display device of claim 7, wherein the first electrode layer and the third electrode layer comprise a same material.

10. The display device of claim 1, further comprising a light emitting element above the first connection electrode and the second connection electrode, wherein the light emitting element comprises a flip chip type micro light emitting diode element.

\* \* \* \* \*